(12) United States Patent
Tanaka

(10) Patent No.: US 11,062,992 B2
(45) Date of Patent: Jul. 13, 2021

(54) ELECTRONIC COMPONENT

(71) Applicant: ROHM CO., LTD., Kyoto (JP)

(72) Inventor: Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/556,656

(22) Filed: Aug. 30, 2019

(65) Prior Publication Data

US 2020/0075486 A1    Mar. 5, 2020

(30) Foreign Application Priority Data

Sep. 5, 2018 (JP) .............................. JP2018-166368
Apr. 8, 2019 (JP) .............................. JP2019-073660

(51) Int. Cl.
*H01L 23/522* (2006.01)
*H01L 23/525* (2006.01)

(52) U.S. Cl.
CPC ................................ *H01L 23/5256* (2013.01)

(58) Field of Classification Search
CPC .......................... H01L 23/525; H01L 23/5256
See application file for complete search history.

(56) References Cited

U.S. PATENT DOCUMENTS

| 6,759,729 B1* | 7/2004 | Racanelli ............ H01L 27/0802 257/536 |
| 7,217,981 B2* | 5/2007 | Coolbaugh ............. H01L 28/20 257/380 |
| 2005/0202219 A1* | 9/2005 | Yamashita .......... H01L 23/5226 428/195.1 |

FOREIGN PATENT DOCUMENTS

| JP | 2009038099 A | 2/2009 |
| JP | 2013172000 A | 9/2013 |
| JP | 2015012259 A | 1/2015 |

\* cited by examiner

*Primary Examiner* — Dale E Page
*Assistant Examiner* — Wilner Jean Baptiste
(74) *Attorney, Agent, or Firm* — Gregory M. Howison

(57) ABSTRACT

An electronic component includes a lower insulating layer, an upper insulating layer formed on the lower insulating layer, a first via electrode embedded in the lower insulating layer, a second via electrode embedded in the lower insulating layer at an interval from the first via electrode, and a resistance layer that is made of a metal thin film, is interposed in a region between the lower insulating layer and the upper insulating layer, and is electrically connected to the first via electrode and the second via electrode.

21 Claims, 35 Drawing Sheets

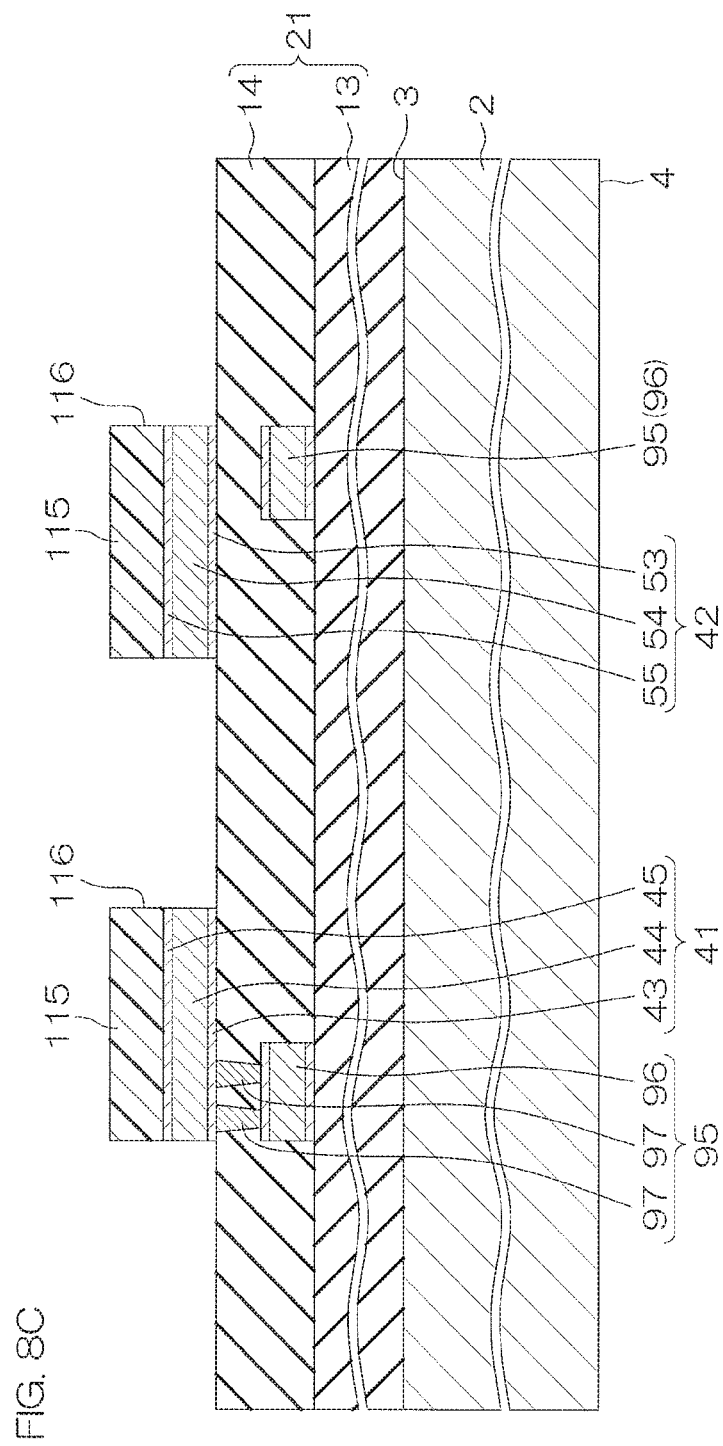

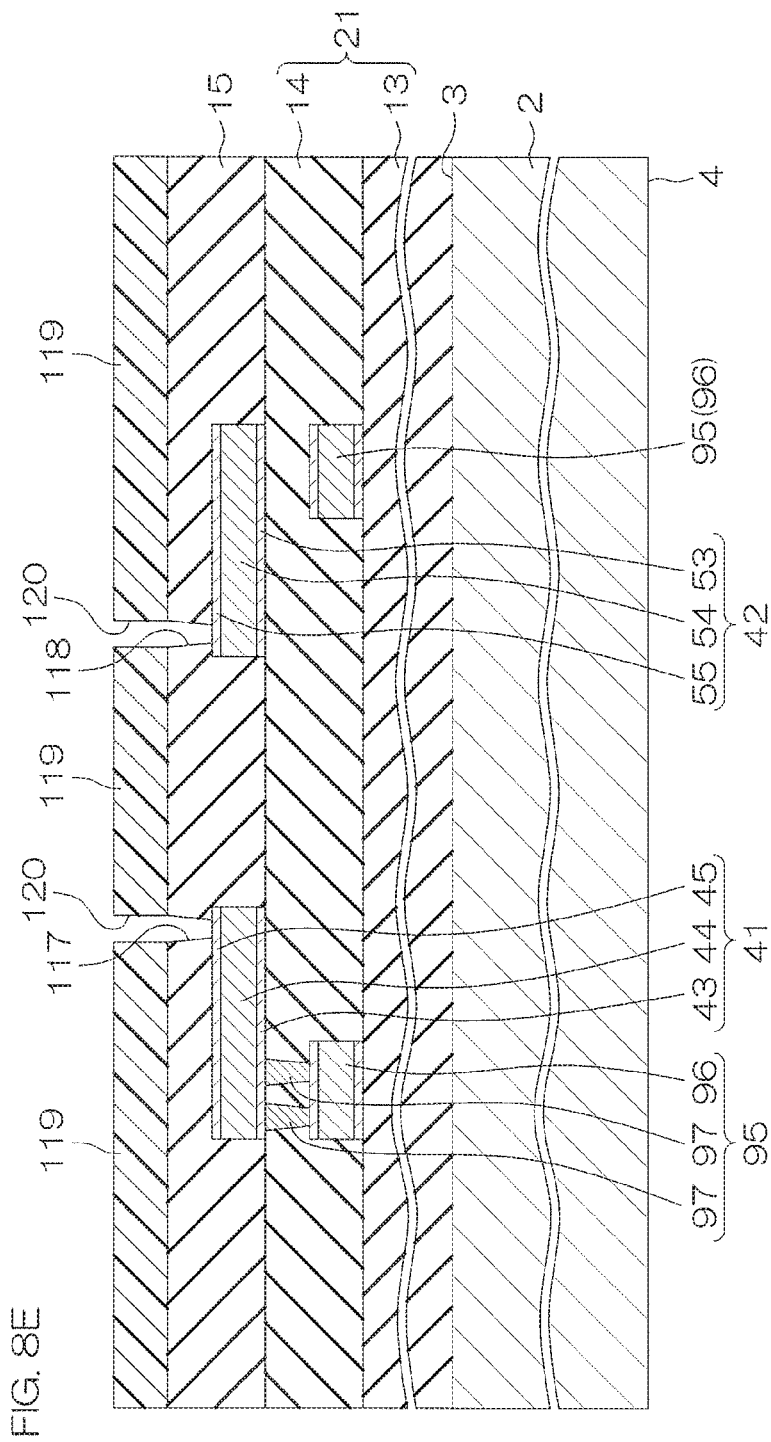

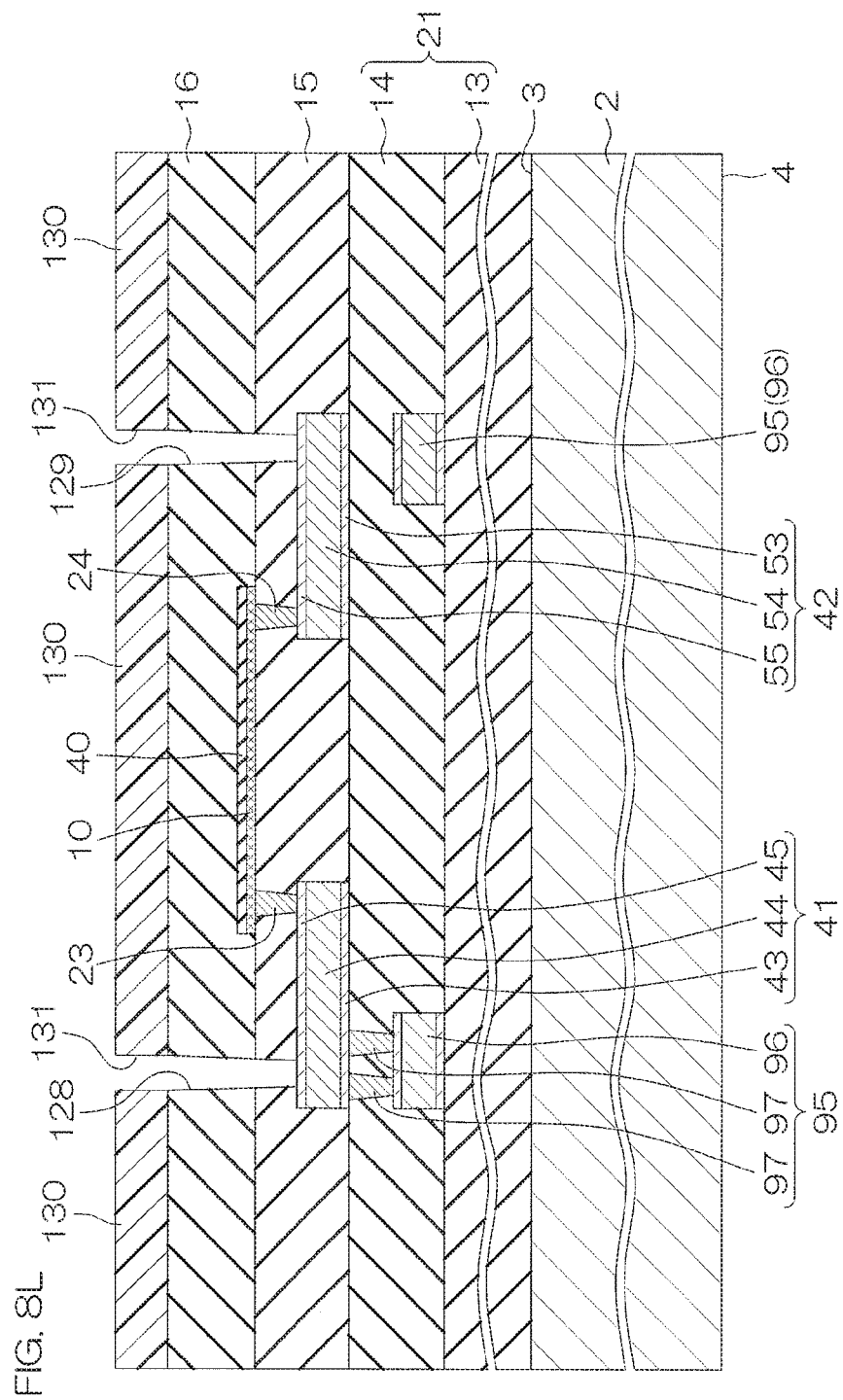

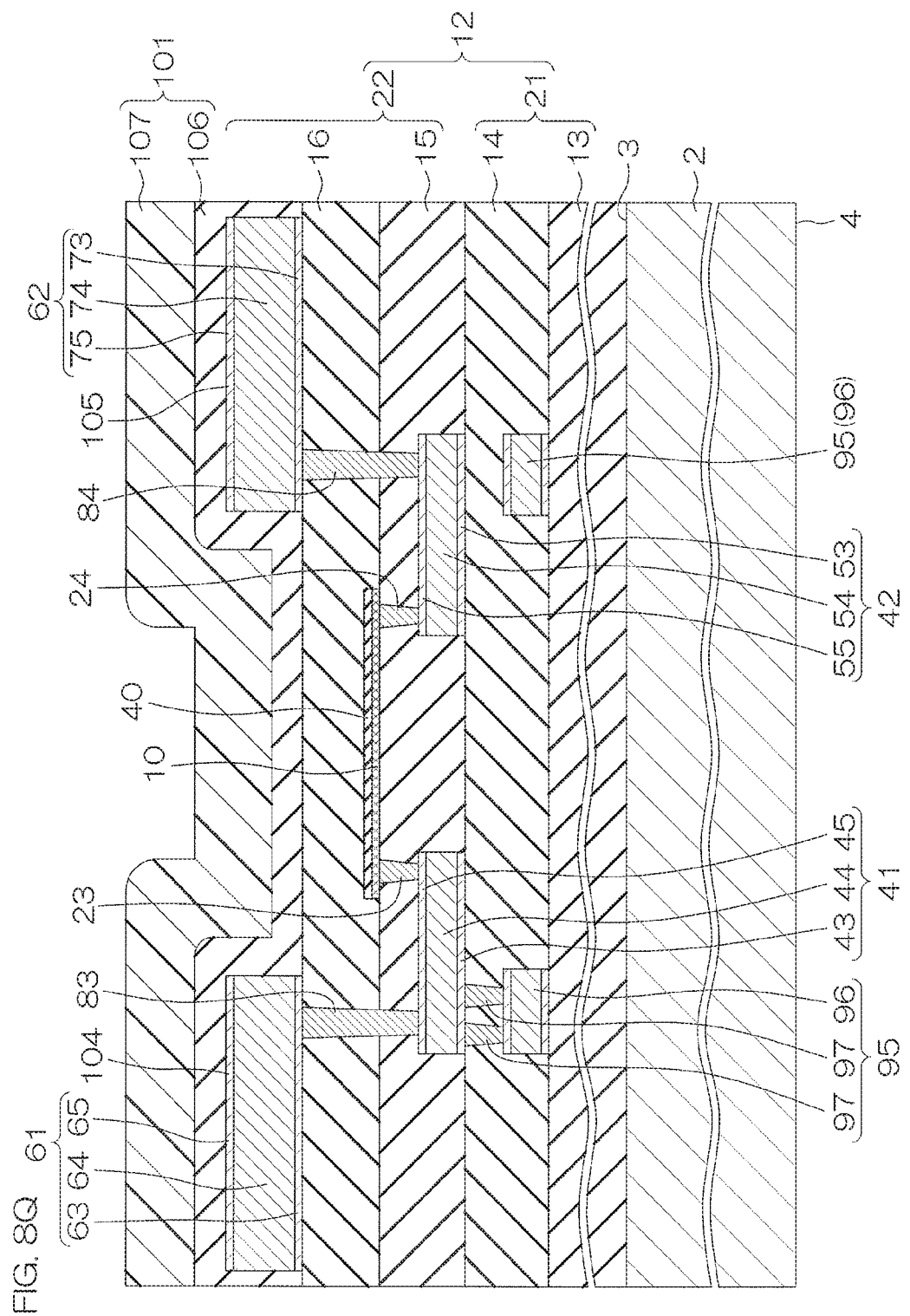

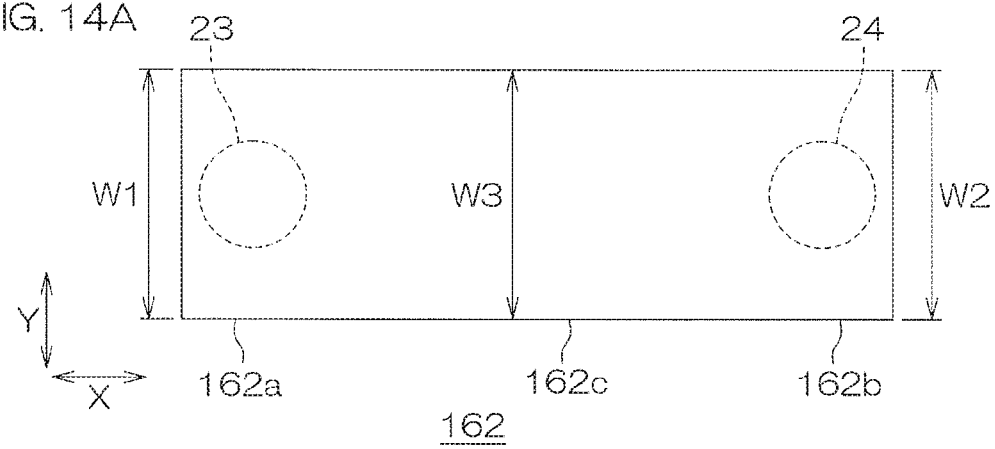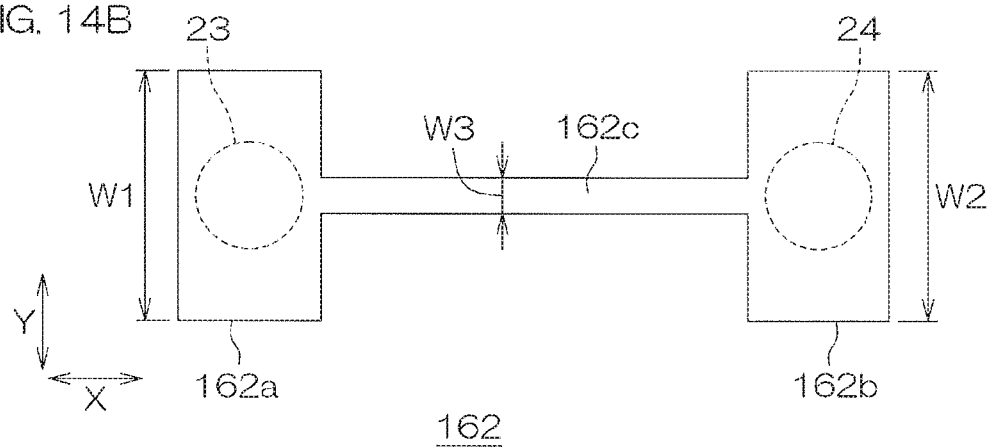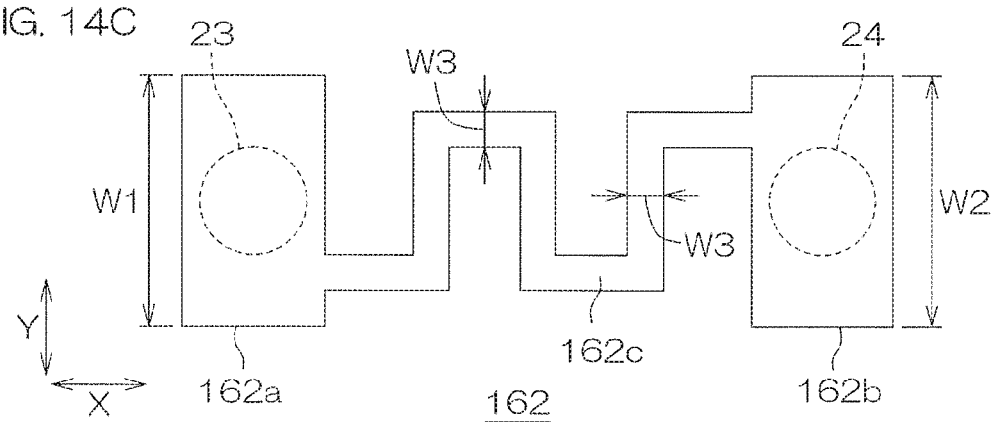

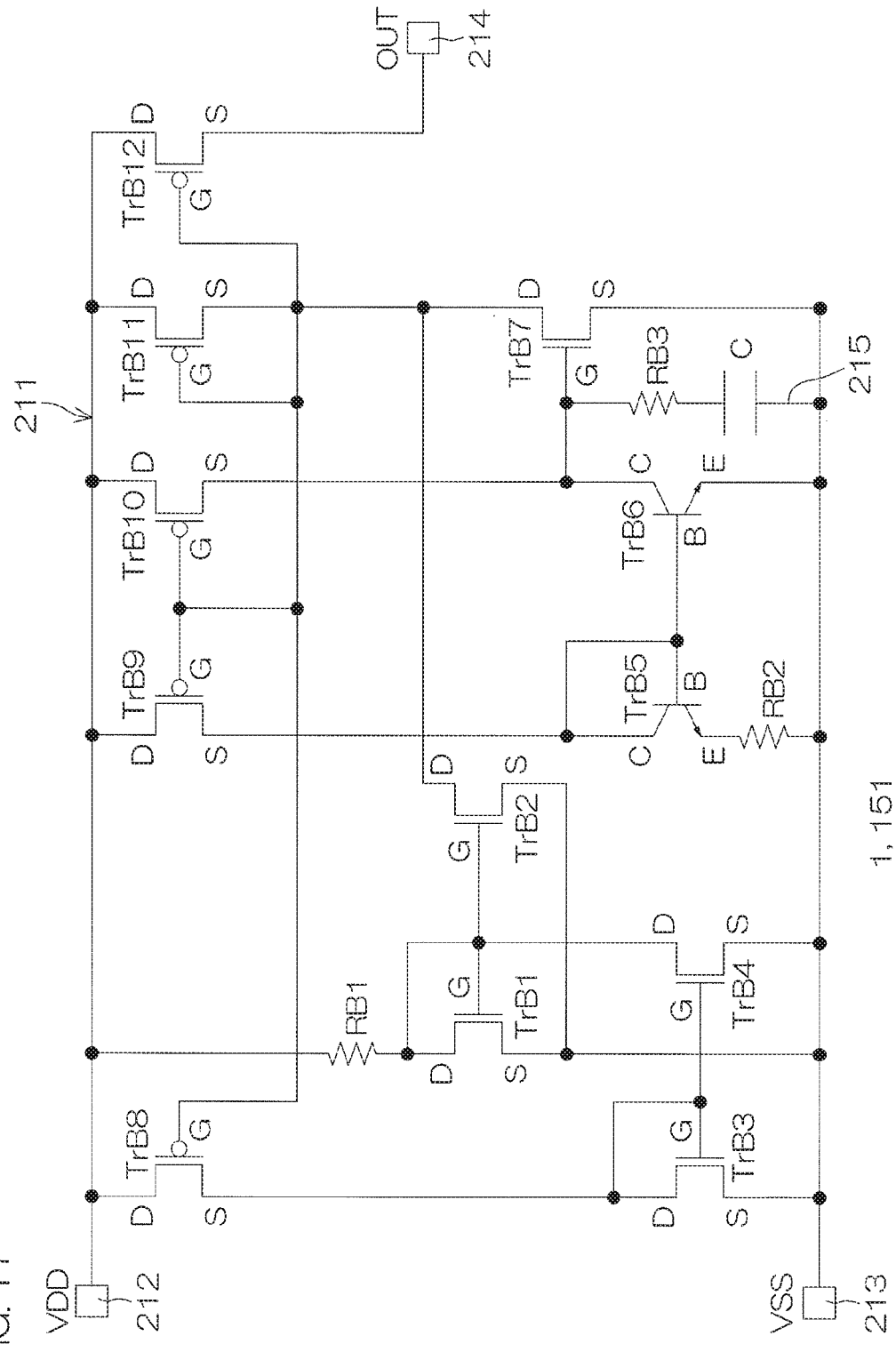

ELECTRONIC COMPONENT

CROSS-REFERENCE TO RELATED APPLICATIONS

This application claims the benefit of priority to Japanese Patent Application No. 2018-166368 filed on Sep. 5, 2018, and Japanese Patent Application No. 2019-073660 filed on Apr. 8, 2019. The entire contents of these applications are hereby incorporated herein by reference.

BACKGROUND OF THE INVENTION

1. Field of the Invention

The present invention relates to an electronic component.

2. Description of the Related Art

JP2009-038099 discloses a semiconductor device including a semiconductor substrate, an insulating film formed on the semiconductor substrate, a polysilicon resistance layer formed on the insulating film, an insulating film formed on the polysilicon resistance layer, and a wiring connected to the polysilicon resistance layer, on the polysilicon resistance layer.

JP2013-172000 discloses a semiconductor device including a silicon substrate, a LOCOS oxide film formed on the silicon substrate, a polysilicon resistor formed on the LOCOS oxide film, and a wiring connected to the polysilicon resistor on the polysilicon resistor.

JP2015-012259 discloses a semiconductor device including a silicon substrate, an insulating layer formed on the silicon substrate, a polysilicon resistance element formed on the insulating layer, and a wiring connected to the polysilicon resistance element on the polysilicon resistance element.

SUMMARY OF THE INVENTION

A preferred embodiment of the present invention provides an electronic component including a lower insulating layer, an upper insulating layer formed on the lower insulating layer, a first via electrode embedded in the lower insulating layer, a second via electrode embedded in the lower insulating layer at an interval from the first via electrode, and a resistance layer that is made of a metal thin film, is interposed in a region between the lower insulating layer and the upper insulating layer, and is electrically connected to the first via electrode and the second via electrode.

A preferred embodiment of the present invention provides an electronic component including a lower insulating layer, an upper insulating layer formed on the lower insulating layer, a first via electrode embedded in the lower insulating layer, a second via electrode embedded in the lower insulating layer at an interval from the first via electrode, a first upper wiring layer formed on the upper insulating layer, a second upper wiring layer formed on the upper insulating layer at an interval from the first upper wiring layer, and a resistance layer that is made of a metal thin film, is interposed in a region between the lower insulating layer and the upper insulating layer such as to be positioned in a region between the first upper wiring layer and the second upper wiring layer in plan view, and is electrically connected to the first via electrode and the second via electrode.

The aforementioned or other objects, features, and effects of the present invention will be clarified by the following description of preferred embodiments given below with reference to the accompanying drawings.

BRIEF DESCRIPTION OF DRAWINGS

FIG. 14A is a plan view of the fuse resistance layer according to a second configuration example.

FIG. 14B is a plan view of the fuse resistance layer according to a third configuration example.

FIG. 14C is a plan view of the fuse resistance layer according to a fourth configuration example.

FIG. 17 is a circuit diagram of an electrical structure according to a second configuration example of the electronic components according to the first to third preferred embodiments.

DETAILED DESCRIPTION OF PREFERRED EMBODIMENTS

Figure 1:
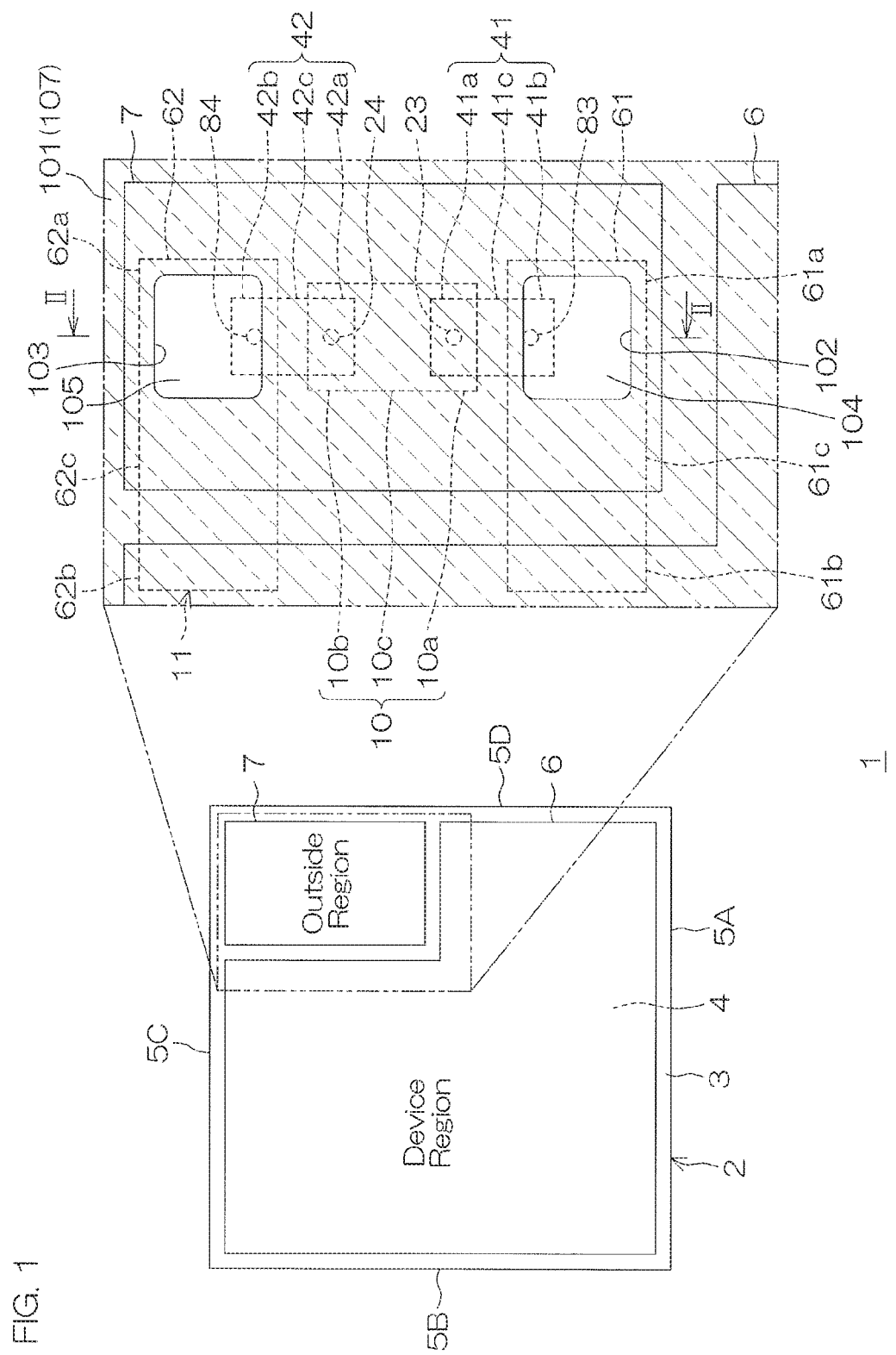
FIG. 1 is a schematic plan view of an electronic component according to a first preferred embodiment of the present invention and is a plan view showing a configuration incorporating a resistance layer according to a first configuration example.

A resistance layer including polysilicon is formed with a comparatively large thickness and a comparatively large planar area. The resistance layer including polysilicon is disposed in a region in proximity to a main surface of a substrate and therefore a contact with the resistance layer is formed on the resistance layer. On the other hand, with a multilayer wiring structure formed on the main surface of the substrate, a plurality of wiring layers are routed densely and, at the same time, flatness is required. Therefore, it cannot be said to be preferable to incorporate the resistance layer including polysilicon in an interior of the multilayer wiring structure from a standpoint of the resistance layer forming region and a standpoint of flatness of the multilayer wiring structure.

A preferred embodiment of the present invention thus provides an electronic component that enables a resistance layer to be incorporated appropriately in a multilayer wiring structure.

A preferred embodiment of the present invention provides an electronic component including a lower insulating layer, an upper insulating layer formed on the lower insulating layer, a first via electrode embedded in the lower insulating layer, a second via electrode embedded in the lower insulating layer at an interval from the first via electrode, and a resistance layer that is made of a metal thin film, is interposed in a region between the lower insulating layer and the upper insulating layer, and is electrically connected to the first via electrode and the second via electrode.

According to this electronic component, the resistance layer is made of a metal thin film. With a metal thin film, a planar area of the resistance layer can be reduced while decreasing a thickness of the resistance layer. The resistance layer can thereby be interposed appropriately in the region between the lower insulating layer and the upper insulating layer while securing flatness. Also, contacts to the resistance layer can be formed by the via electrodes embedded in the lower insulating layer and therefore flatness at an upper layer of the resistance layer can be increased appropriately. Consequently, the electronic component that enables the resistance layer to be incorporated appropriately in a multilayer wiring structure can be provided.

A preferred embodiment of the present invention provides an electronic component including a lower insulating layer, an upper insulating layer formed on the lower insulating layer, a first via electrode embedded in the lower insulating layer, a second via electrode embedded in the lower insulating layer at an interval from the first via electrode, a first upper wiring layer formed on the upper insulating layer, a second upper wiring layer formed on the upper insulating layer at an interval from the first upper wiring layer, and a resistance layer that is made of a metal thin film, is interposed in a region between the lower insulating layer and the upper insulating layer such as to be positioned in a region between the first upper wiring layer and the second upper wiring layer in plan view, and is electrically connected to the first via electrode and the second via electrode.

According to this electronic component, the resistance layer is made of a metal thin film. With a metal thin film, a planar area of the resistance layer can be reduced while decreasing a thickness of the resistance layer. The resistance layer can thereby be interposed appropriately in the region between the lower insulating layer and the upper insulating layer while securing flatness. Also, contacts to the resistance layer can be formed by the via electrodes embedded in the lower insulating layer and therefore flatness at an upper layer of the resistance layer can be increased appropriately. That is, flatness of the upper insulating layer can be increased appropriately.

The first upper wiring layer and the second upper wiring layer can thereby be formed appropriately on the upper insulating layer that is increased in flatness. Consequently, the electronic component that enables the resistance layer to be incorporated appropriately in a multilayer wiring structure can be provided.

Hereinafter, preferred embodiments of the present invention will be described in detail with reference to the attached drawings.

FIG. 1 is a schematic plan view of an electronic component 1 according to a first preferred embodiment of the present invention and is a plan view showing a configuration incorporating a resistance layer 10 according to a first configuration example.

The electronic component 1 is a semiconductor device including various functional devices formed using a conductor material or a semiconductor material or properties of a semiconductor material, etc. The electronic component 1 includes a chip-shaped semiconductor layer 2 formed in a rectangular parallelepiped shape. The semiconductor layer 2 includes a first main surface 3 at one side, a second main surface 4 at another side, and side surfaces 5A, 5B, 5C, and 5D connecting the first main surface 3 and the second main surface 4.

The first main surface 3 is a device forming surface. The first main surface 3 and the second main surface 4 are formed in quadrilateral shapes (square shapes in the present embodiment) in a plan view as viewed in a direction normal to the surfaces (hereinafter referred to simply as "plan view").

The semiconductor layer 2 may be an Si semiconductor layer including Si (silicon) as an example of a semiconductor material. The Si semiconductor layer may have a laminated structure that includes an Si semiconductor substrate and an Si epitaxial layer. The Si semiconductor layer may have a single layer structure made of an Si semiconductor substrate.

The semiconductor layer 2 may be an SiC semiconductor layer including SiC (silicon carbide) as an example of a semiconductor material. The SiC semiconductor layer may have a laminated structure that includes an SiC semiconductor substrate and an SiC epitaxial layer. The SiC semiconductor layer may have a single layer structure made of an SiC semiconductor substrate.

The semiconductor layer 2 may be a compound semiconductor layer including a compound semiconductor material as an example of a semiconductor material. The compound semiconductor layer may have a laminated structure that includes a compound semiconductor substrate and a compound semiconductor epitaxial layer. The compound semiconductor layer may have a single layer structure made of a compound semiconductor substrate.

The compound semiconductor material may be any of group III to V compound semiconductor materials. The semiconductor layer 2 may include at least one among AlN (aluminum nitride), InN (indium nitride), GaN (gallium nitride), and GaAs (gallium arsenide) as examples of group III to V compound semiconductor materials.

The semiconductor layer 2 includes a device region 6 and an outside region 7. The device region 6 is a region in which a functional device is formed. The device region 6 is formed in an inner region of the semiconductor layer 2 at intervals from the side surfaces 5A to 5D of the semiconductor layer 2. The device region 6 is formed in an L shape in plan view in the present embodiment. The planar shape of the device region 6 is arbitrary and is not restricted to the planar shape shown in FIG. 1.

The functional device is formed in the semiconductor layer 2. More specifically, the functional device is formed using the first main surface 3 of the semiconductor layer 2 and/or a surface layer portion of the first main surface 3. The functional device may include at least one among a passive device, a semiconductor rectifying device, and a semiconductor switching device. The passive device may include a semiconductor passive device.

The passive device (semiconductor passive device) may include at least one among a resistor, a capacitor, and a coil. The semiconductor rectifying device may include at least one among a pn junction diode, a Zener diode, a Schottky barrier diode, and a fast recovery diode.

The semiconductor switching device may include at least one among a BJT (bipolar junction transistor), a MISFET (metal insulator field effect transistor), an IGBT (insulated gate bipolar junction transistor), and a JFET (junction field effect transistor).

The functional device may include a circuit network selectively combining at least two among the passive device (semiconductor passive device), the semiconductor rectifying device, and the semiconductor switching device. The circuit network may form a portion or an entirety of an integrated circuit.

The integrated circuit may include an SSI (small scale integration), an LSI (large scale integration), an MSI (medium scale integration), a VLSI (very large scale integration), or an VLSI (ultra-very large scale integration).

The outside region 7 is a region outside the device region 6. The outside region 7 is free from a functional device. In the present embodiment, the outside region 7 is demarcated in a region between the side surfaces 5A to 5D of the semiconductor layer 2 and the device region 6. In the present embodiment, the outside region 7 is formed in a quadrilateral shape in plan view.

The planar shape of the outside region 7 is arbitrary and is not restricted to the planar shape shown in FIG. 1. A disposition and the planar shape of the outside region 7 is arbitrary and is not restricted to the disposition and the planar shape shown in FIG. 1. The outside region 7 may be formed at a central portion of the first main surface 3 in plan view.

A resistance circuit 11 including a resistance layer 10 made of a metal thin film is formed in the outside region 7 at an interval from the first main surface 3 of the semiconductor layer 2. That is, in the present embodiment, the resistance circuit 11 (resistance layer 10) is formed such as to avoid the device region 6 in plan view. The resistance circuit 11 (resistance layer 10) is electrically connected to the functional device.

By disposing the resistance circuit 11 (resistance layer 10) in the outside region 7, an electrical influence that the resistance circuit 11 has on the device region 6 can be suppressed and an electrical influence that the device region 6 has on the resistance circuit 11 can be suppressed. For example, a parasitic capacitance between the device region 6 and the resistance circuit 11 can be suppressed. That is, reduction of noise and improvement of Q value can be achieved.

Although with the present embodiment, an example where the resistance circuit 11 includes the single resistance layer 10 shall be described, the resistance circuit 11 may include a plurality (two or more) resistance layers 10 instead. In the following, the resistance layer 10 (resistance circuit 11) shall be described specifically with reference to FIG. 2 to FIG. 5 in addition to FIG. 1.

Figure 2:
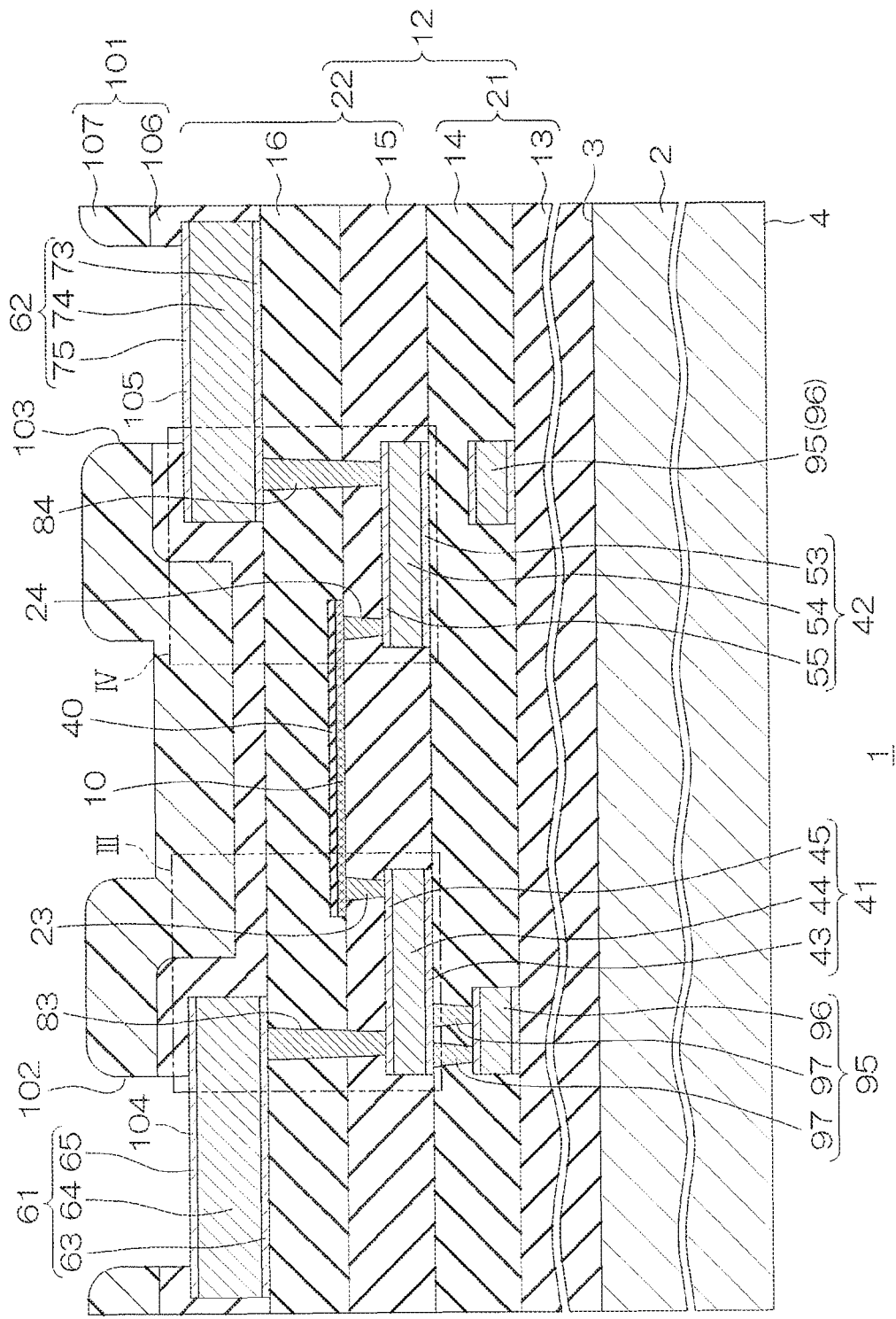
FIG. 2 is a sectional view taken along line II-II shown in FIG. 1.
Figure 3:
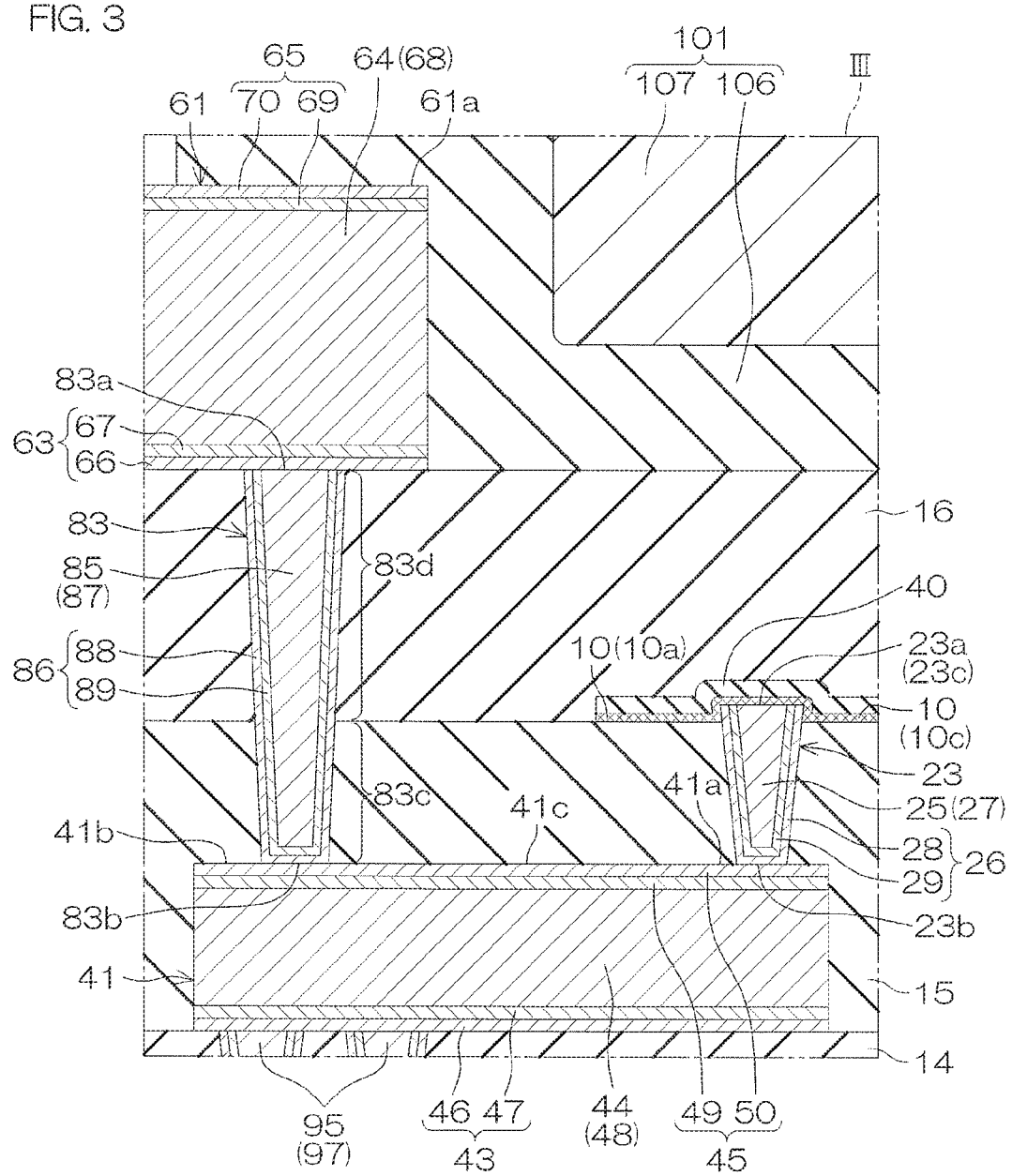
FIG. 3 is an enlarged view of a region III shown in FIG. 2.
Figure 4:
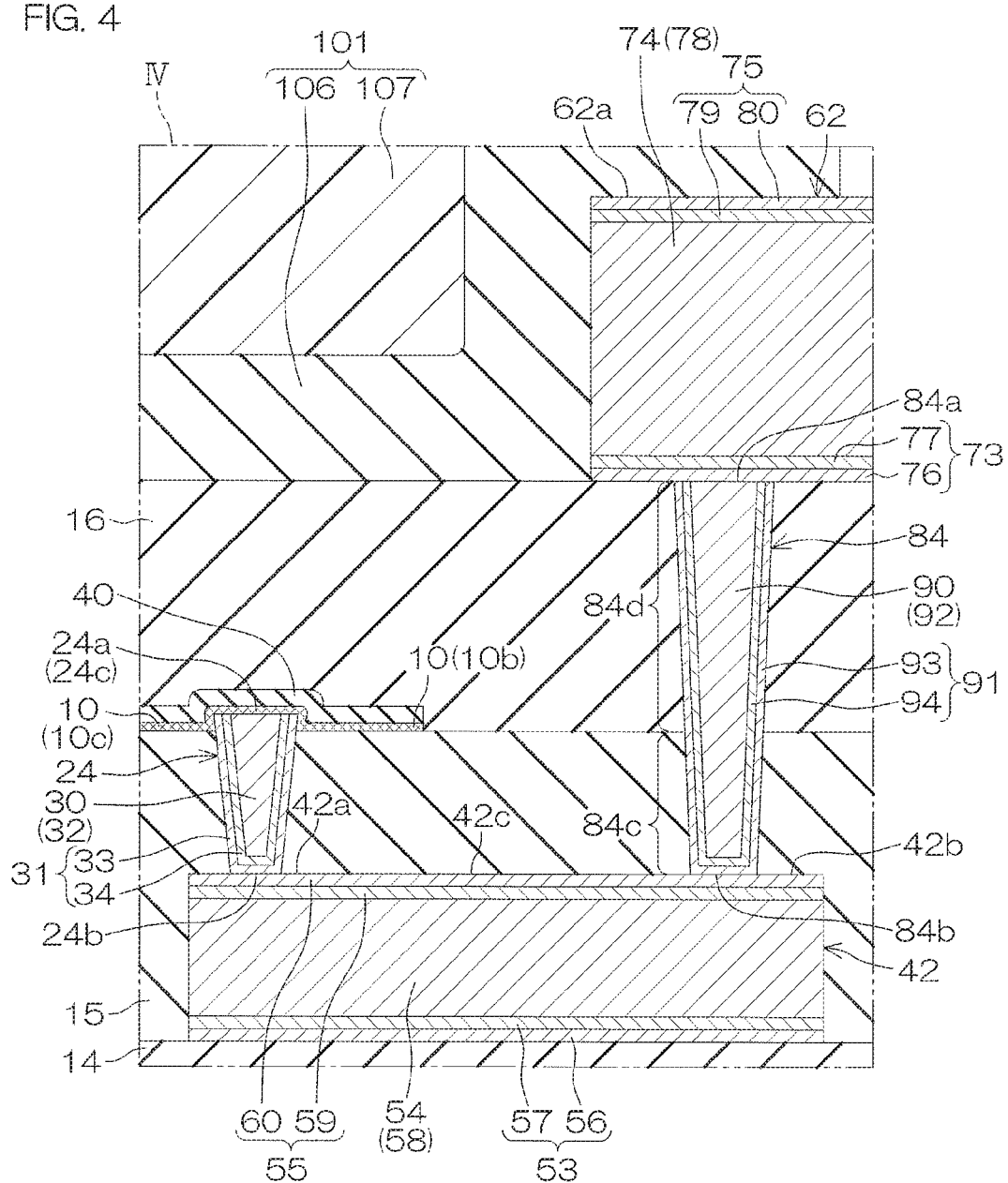
FIG. 4 is an enlarged view of a region IV shown in FIG. 2.
Figure 5:
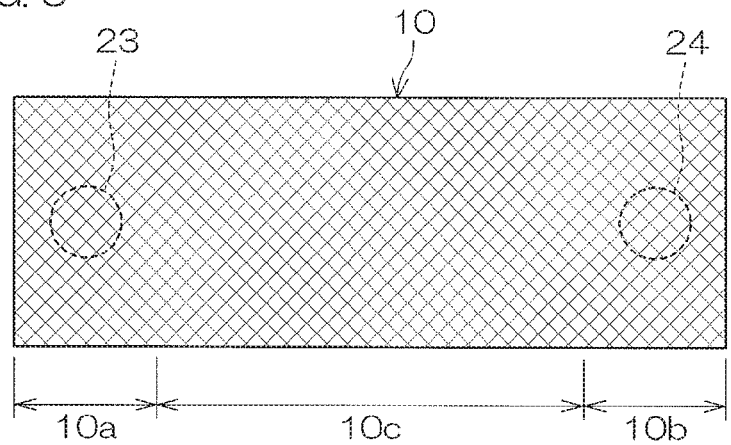
FIG. 5 is a plan view for describing a planar shape of the resistance layer.

FIG. 2 is a sectional view taken along line II-II shown in FIG. 1. FIG. 3 is an enlarged view of a region III shown in FIG. 2. FIG. 4 is an enlarged view of a region IV shown in FIG. 2. FIG. 5 is a plan view for describing a planar shape of the resistance layer 10.

Referring to FIG. 2 to FIG. 4, in the device region 6 and the outside region 7, a multilayer wiring structure 12 is formed on the first main surface 3 of the semiconductor layer 2. The multilayer wiring structure 12 has a laminated structure in which a plurality of insulating layers are laminated and includes a plurality of wiring layers selectively formed in the plurality of insulating layers.

In the present embodiment, the multilayer wiring structure 12 includes a first insulating layer 13, a second insulating layer 14, a third insulating layer 15 (lower insulating layer), and a fourth insulating layer 16 (upper insulating layer) that are laminated in that order from the first main surface 3 side of the semiconductor layer 2. The terms "first," "second," "third," and "fourth" related to the first to fourth insulating layers 13 to 16 are provided to identify the insulating layers in the drawing and are not intended to assign an order.

The number of laminations of the insulating layers in the multilayer wiring structure 12 is arbitrary and is not restricted to the number of laminations shown in FIG. 2. The multilayer wiring structure 12 may thus include less than four insulating layers or may include five or more insulating layers.

The first to fourth insulating layers 13 to 16 respectively have main surfaces. The main surfaces of the first to fourth insulating layers 13 to 16 are respectively formed flatly. The main surfaces of the first to fourth insulating layers 13 to 16 respectively extend parallel to the first main surface 3 of the semiconductor layer 2. The main surfaces of the first to fourth insulating layers 13 to 16 may respectively be ground surfaces. That is, the main surfaces of the first to fourth insulating layers 13 to 16 may respectively have grinding marks.

The first to fourth insulating layers 13 to 16 may each have a laminated structure that includes a silicon oxide film and a silicon nitride film. In this case, the silicon nitride film may be formed on the silicon oxide film or the silicon oxide film may be formed on the silicon nitride film.

The first to fourth insulating layers 13 to 16 may each have a single layer structure made of a silicon oxide film or a silicon nitride film. The first to fourth insulating layers 13 to 16 are preferably formed of an insulating material made of the same type of substance. In the present embodiment, the first to fourth insulating layers 13 to 16 each has a single layer structure made of a silicon oxide film.

Thicknesses TI of the first to fourth insulating layers 13 to 16 may each be not less than 100 nm and not more than 3500 nm. The thicknesses TI may each be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, not less than 2500 nm and not more than 3000 nm, or not less than 3000 nm and not more than 3500 nm. Preferably, the thicknesses TI are each not less than 100 nm and not more than 1500 nm. The thickness TI of the first to fourth insulating layers 13 to 16 may be equal to each other or may differ from each other.

In the present embodiment, the multilayer wiring structure 12 includes a connection circuit forming layer 21 and a resistance circuit forming layer 22 that are formed in mutually different layers.

The connection circuit forming layer 21 is formed at the first main surface 3 side of the semiconductor layer 2. The connection circuit forming layer 21 includes the first insulating layer 13 and the second insulating layer 14. The connection circuit forming layer 21 is a layer with one purpose being electrical connection of the device region 6 (functional device) and the outside region 7 (resistance circuit 11). A specific structure of the connection circuit forming layer 21 shall be described later.

The resistance circuit forming layer 22 is formed on the connection circuit forming layer 21. The resistance circuit forming layer 22 includes the third insulating layer 15 and the fourth insulating layer 16. The resistance circuit forming layer 22 is a layer with one purpose being forming of the resistance circuit 11 (resistance layer 10) in the outside region 7.

The resistance circuit 11 includes a first via electrode 23 and a second via electrode 24. The first via electrode 23 is embedded in the third insulating layer 15 and is exposed from the main surface of the third insulating layer 15. The second via electrode 24 is embedded in the third insulating layer 15 and is exposed from the main surface of the third insulating layer 15 at an interval from the first via electrode 23.

In the present embodiment, the first via electrode 23 is formed in a circular shape in plan view. The planar shape of the first via electrode 23 is arbitrary. The first via electrode 23 may be formed in a polygonal shape, such as a triangular shape, a quadrilateral shape, or a hexagonal shape, etc., or an elliptical shape in plan view instead of a circular shape.

Referring to FIG. 3, the first via electrode 23 includes a first end portion 23a at one side and a second end portion 23b at another side in a direction normal to the main surface of the third insulating layer 15. The first end portion 23a of the first via electrode 23 is exposed from the main surface of the third insulating layer 15. The second end portion 23b of the first via electrode 23 is positioned inside the third insulating layer 15. The first via electrode 23 is formed in a convergent shape that narrows in width from the first end portion 23a toward the second end portion 23b in sectional view.

In the present embodiment, the first end portion 23a of the first via electrode 23 includes a first projecting portion 23c projecting toward the fourth insulating layer 16 from the main surface of the third insulating layer 15. The first projecting portion 23c is formed by a main surface and a side surface of the first via electrode 23.

The first via electrode 23 has a laminated structure that includes a main body layer 25 and a barrier layer 26. The main body layer 25 is embedded in the third insulating layer 15. The main body layer 25 may include tungsten (W) or copper (Cu). In the present embodiment, the main body layer 25 has a single layer structure made of a tungsten layer 27.

The barrier layer 26 is interposed between the third insulating layer 15 and the main body layer 25. In the present embodiment, the barrier layer 26 has a laminated structure in which a plurality of electrode layers are laminated. In the present embodiment, the barrier layer 26 includes a Ti layer 28 and a TiN layer 29 that are formed in that order from the third insulating layer 15. The Ti layer 28 is in contact with the third insulating layer 15. The TiN layer 29 is in contact with the main body layer 25. The barrier layer 26 may instead have a single layer structure made of the Ti layer 28 or the TiN layer 29.

In the present embodiment, the second via electrode 24 is formed in a circular shape in plan view. The planar shape of the second via electrode 24 is arbitrary. The second via electrode 24 may be formed in a polygonal shape, such as a triangular shape, a quadrilateral shape, or a hexagonal shape, etc., or an elliptical shape in plan view instead of a circular shape.

Referring to FIG. 4, the second via electrode 24 includes a first end portion 24a at one side and a second end portion 24b at another side in the direction normal to the main surface of the third insulating layer 15. The first end portion 24a of the second via electrode 24 is exposed from the main surface of the third insulating layer 15. The second end portion 24b of the second via electrode 24 is positioned inside the third insulating layer 15. The second via electrode 24 is formed in a convergent shape that narrows in width from the first end portion 24a toward the second end portion 24b in sectional view.

In the present embodiment, the first end portion 24a of the second via electrode 24 includes a second projecting portion 24c projecting toward the fourth insulating layer 16 from the main surface of the third insulating layer 15. The second projecting portion 24c is formed by a main surface and a side surface of the second via electrode 24.

The second via electrode 24 has a laminated structure that includes a main body layer 30 and a barrier layer 31. The main body layer 30 is embedded in the third insulating layer 15. The main body layer 30 may include tungsten (W) or copper (Cu). In the present embodiment, the main body layer 30 has a single layer structure made of a tungsten layer 32.

The barrier layer 31 is interposed between the third insulating layer 15 and the main body layer 30. In the present embodiment, the barrier layer 31 has a laminated structure in which a plurality of electrode layers are laminated. In the present embodiment, the barrier layer 31 includes a Ti layer 33 and a TiN layer 34 that are formed in that order from the third insulating layer 15. The Ti layer 33 is in contact with the third insulating layer 15. The TiN layer 34 is in contact with the main body layer 30. The barrier layer 31 may instead have a single layer structure made of the Ti layer 33 or the TiN layer 34.

The resistance layer 10 is preferably made of a metal thin film including at least one among CrSi (chromium silicon alloy), TaN (tantalum nitride), and TiN (titanium nitride). The resistance layer 10 especially preferably includes CrSi. The resistance layer 10 may have a single layer structure made of a CrSi film, a TaN film, or a TiN film. The resistance layer 10 may have a laminated structure including a CrSi film and a TaN film laminated in any order.

The resistance layer 10 may have a laminated structure including a CrSi film and a TiN film laminated in any order. The resistance layer 10 may have a laminated structure including a TaN film and a TiN film laminated in any order. The resistance layer 10 may have a laminated structure including a CrSi film, a TaN film, and a TiN film laminated in any order. In the present embodiment, the resistance layer 10 has a single layer structure made of a CrSi film.

A sheet resistance value of the resistance layer 10 may be not less than 100Ω/□ and not more than 50000Ω/□. The sheet resistance value of the resistance layer 10 may be not less than 100Ω/□ and not more than 5000Ω/□, not less than 5000Ω/□ and not more than 10000Ω/□, not less than 10000Ω/□ and not more than 15000Ω/□, not less than 15000Ω/□ and not more than 20000Ω/□, not less than 20000Ω/□ and not more than 25000Ω/□, not less than 25000Ω/□ and not more than 30000Ω/□, not less than 30000Ω/□ and not more than 35000Ω/□, not less than 35000Ω/□ and not more than 40000Ω/□, not less than 40000Ω/□ and not more than 45000Ω/□, or not less than 45000Ω/□ and not more than 50000 Ω/□.

A Cr content with respect to a total weight of the resistance layer 10 may be not less than 5 wt % and not more than 50 wt %. The Cr content may be not less than 5 wt % and not more than 10 wt %, not less than 10 wt % and not more than 15 wt %, not less than 15 wt % and not more than 20 wt %, not less than 20 wt % and not more than 25 wt %, not less than 25 wt % and not more than 30 wt %, not less than 30 wt % and not more than 35 wt %, not less than 35 wt % and not more than 40 wt %, not less than 40 wt % and not more than 45 wt %, or not less than 45 wt % and not more than 50 wt %.

The resistance layer 10 has a thickness TR less than the thickness TI of the third insulating layer 15 (TR<TI). A ratio TR/TI of the thickness TR of the resistance layer 10 with respect to the thickness TI of the third insulating layer 15 may be not less than 0.001 and not more than 0.01. The ratio TR/TI may be not less than 0.001 and not more than 0.002, not less than 0.002 and not more than 0.004, not less than 0.004 and not more than 0.006, not less than 0.006 and not more than 0.008, or not less than 0.008 and not more than 0.01.

The thickness TR may be not less than 0.1 nm and not more than 100 nm. The thickness TR may be not less than 0.1 nm and not more than 10 nm, not less than 10 nm and not more than 20 nm, not less than 20 nm and not more than 30 nm, not less than 30 nm and not more than 40 nm, not less than 40 nm and not more than 50 nm, not less than 50 nm and not more than 60 nm, not less than 60 nm and not more than 70 nm, not less than 70 nm and not more than 80 nm, not less than 80 nm and not more than 90 nm, or not less than 90 nm and not more than 100 nm. The thickness TR is preferably not less than 1 nm and not more than 20 nm.

The resistance layer 10 is interposed in a region between the third insulating layer 15 and the fourth insulating layer 16. More specifically, the resistance layer 10 is formed as a film on the main surface of the third insulating layer 15. The resistance layer 10 occupies the main surface of the third insulating layer 15. On the main surface of the third insulating layer 15, no film-shaped or layer-shaped wiring besides the resistance layer 10 is formed in the device region 6 and the outside region 7. The third insulating layer 15 is provided for forming the resistance layer 10.

By disposing the resistance layer 10 in the outside region 7, an electrical influence that the resistance layer 10 has on the device region 6 can be suppressed and an electrical influence that the device region 6 has on the resistance layer 10 can be suppressed. For example, a parasitic capacitance between the device region 6 and the resistance layer 10 can be suppressed. That is, reduction of noise and improvement of Q value can be achieved.

Referring to FIG. 5, the resistance layer 10 is formed such as to span across the first via electrode 23 and the second via electrode 24. The resistance layer 10 is thereby electrically connected to the first via electrode 23 and the second via electrode 24. In the present embodiment, the resistance layer 10 is formed in a quadrilateral shape (more specifically, a rectangular shape) in plan view.

The resistance layer 10 includes a first end portion 10a at one side, a second end portion 10b at another side, and a connection portion 10c connecting the first end portion 10a and the second end portion 10b. The first end portion 10a of the resistance layer 10 covers the first via electrode 23. More specifically, the first end portion 10a covers the first end portion 23a (first projecting portion 23c) of the first via electrode 23. The first end portion 10a is formed as a film along the main surface and the side surface of the first via electrode 23.

The second end portion 10b of the resistance layer 10 covers the second via electrode 24. More specifically, the second end portion 10b covers the first end portion 24a (second projecting portion 24c) of the second via electrode 24. The second end portion 10b is formed as a film along the main surface and the side surface of the second via electrode 24.

The connection portion 10c extends as a band in a region between the first end portion 10a and the second end portion 10b. The connection portion 10c extends as a band along a straight line connecting the first end portion 10a and the second end portion 10b. In the present embodiment, the first end portion 10a, the second end portion 10b, and the connection portion 10c of the resistance layer 10 are formed with uniform width.

Figure 6:
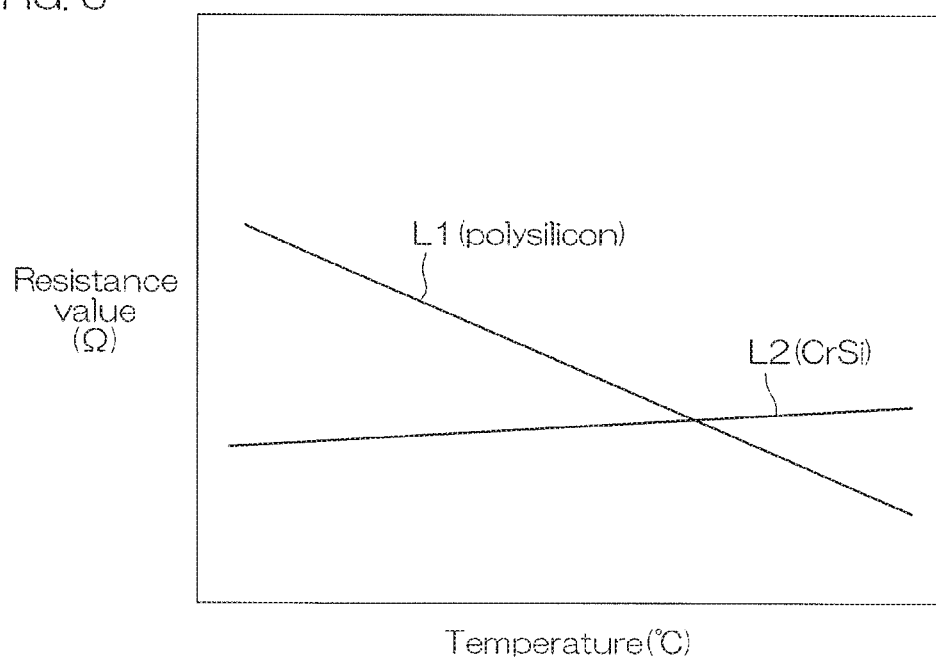
FIG. 6 is a graph for describing temperature characteristics of the resistance layer.

FIG. 6 is a graph for describing temperature characteristics of the resistance layer 10. In the graph of FIG. 6, the ordinate shows resistance value (Ω) and the abscissa shows temperature (° C.). A first line L1 and a second line L2 are shown in FIG. 6. The first line L1 shows characteristics in a case where the resistance layer 10 includes conductive polysilicon. The second line L2 shows characteristics in a case where the resistance layer 10 includes CrSi.

Referring to the first line L1, in the case of the resistance layer 10 including conductive polysilicon, the sheet resistance value decreased monotonously with temperature rise. The resistance layer 10 including conductive polysilicon was found to have a comparatively large variation rate with respect to temperature rise. On the other hand, referring to the second line L2, in the case of the resistance layer 10 made of a metal thin film including CrSi, a variation rate of the sheet resistance value with temperature rise was found to be smaller than the variation rate of the sheet resistance value of the first line L1.

That is, CrSi has a comparatively small temperature dependence compared to polysilicon and has a sheet resistance value that is better than the sheet resistance of polysilicon. Also, although unillustrated, CrSi has a comparatively small voltage dependence compared to polysilicon.

Therefore, by adopting CrSi in the resistance layer 10, a planar area of the resistance layer 10 can be reduced appropriately while decreasing the thickness of the resistance layer 10 appropriately. The resistance layer 10 can thereby be interposed appropriately in the region between the third insulating layer 15 and the fourth insulating layer 16 while securing flatness.

Also, design rules for the resistance layer 10 can be relaxed because the planar area of the resistance layer 10 can be reduced appropriately. That is, the resistance layer 10 can be disposed appropriately, not in the device region 6, but in the outside region 7. Mutual electrical influences between the resistance layer 10 and the device region 6 can thus be suppressed appropriately. The same effects as the above can be exhibited even when the resistance layer 10 includes TaN and/or TiN in addition to or in place of CrSi.

The resistance layer 10 may take on any of various configurations. Other configuration examples of the resistance layer 10 shall now be described with reference to FIG. 7A to FIG. 7E.

Figure 7A:
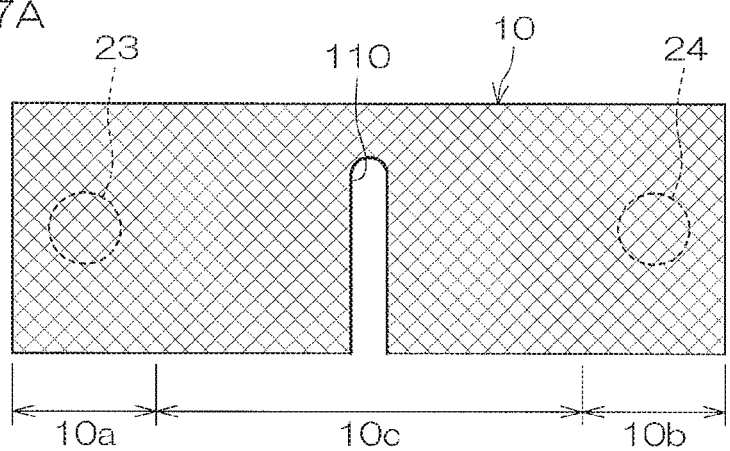
FIG. 7A is a plan view of the resistance layer according to a second configuration example.

FIG. 7A is a plan view of the resistance layer 10 according to a second configuration example. In the following, structures corresponding to structures described for the electronic component 1 shall be provided with the same reference symbols and description thereof shall be omitted.

Referring to FIG. 7A, the resistance layer 10 according to the second configuration example includes a single notched portion 110 formed in the connection portion 10c. The notched portion 110 extends in a direction intersecting a direction in which the connection portion 10c extends. In the present embodiment, the notched portion 110 extends in a direction orthogonal to the direction in which the connection portion 10c extends.

The notched portion 110 is a laser beam processing mark with which a partial region of the connection portion 10c has been fusion cut by a laser beam irradiating method. A current path of the resistance layer 10 is extended by the notched portion 110. The resistance value of the resistance layer 10 is thereby increased. The resistance value of the resistance layer 10 can be adjusted in an increasing direction by the notched portion 110.

Figure 7B:
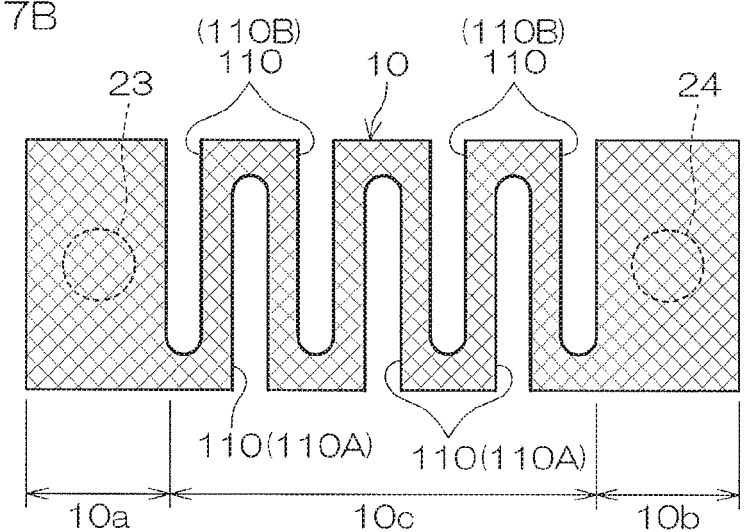
FIG. 7B is a plan view of the resistance layer according to a third configuration example.

FIG. 7B is a plan view of the resistance layer 10 according to a third configuration example. In the following, structures corresponding to the structures described for the electronic component 1 shall be provided with the same reference symbols and description thereof shall be omitted.

Referring to FIG. 7B, the resistance layer 10 according to the third configuration example includes a plurality of notched portions 110 formed in the connection portion 10c. The plurality of notched portions 110 each extends in a direction intersecting the direction in which the connection portion 10c extends. In the present embodiment, the plurality of notched portions 110 each extends in the direction orthogonal to the direction in which the connection portion 10c extends. More specifically, the plurality of notched portions 110 include one or a plurality (three, in the present embodiment) of first notched portions 110A and one or a plurality (four, in the present embodiment) of second notched portions 110B.

The plurality of first notched portions 110A are formed at intervals at one side of the connection portion 10c that extends in a long direction. The plurality of first notched portions 110A each extends in the direction intersecting the direction in which the connection portion 10c extends.

The plurality of second notched portions 110B are formed at intervals at another side of the connection portion 10c that extends in the long direction. The plurality of second notched portions 110B each extends in the direction intersecting the direction in which the connection portion 10c extends.

In the present embodiment, the plurality of first notched portions 110A and the plurality of second notched portions 110B are formed alternately along the direction in which the connection portion 10c extends. The resistance layer 10 is thereby formed in a meandering shape as a whole in plan view.

The plurality of first notched portions 110A and the plurality of second notched portions 110B are each a laser beam processing mark with which a partial region of the connection portion 10c has been fusion cut by a laser beam irradiating method. The current path of the resistance layer 10 is extended by the plurality of first notched portions 110A and the plurality of second notched portions 110B. The resistance value of the resistance layer 10 is thereby increased. The resistance value of the resistance layer 10 can be adjusted in the increasing direction by the plurality of first notched portions 110A and the plurality of second notched portions 110B.

Figure 7C:
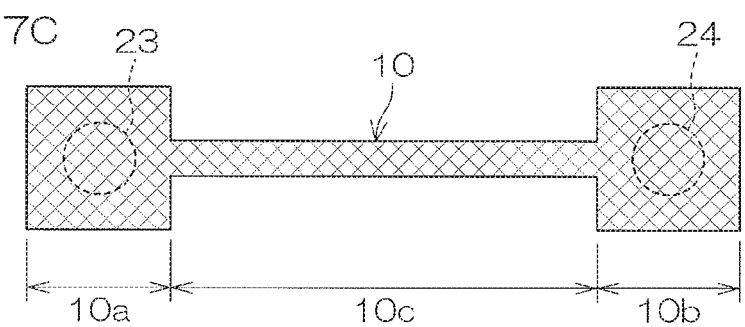
FIG. 7C is a plan view of the resistance layer according to a fourth configuration example.

FIG. 7C is a plan view of the resistance layer 10 according to a fourth configuration example. In the following, structures corresponding to the structures described for the electronic component 1 shall be provided with the same reference symbols and description thereof shall be omitted.

Referring to FIG. 7C, with the resistance layer 10 according to the fourth configuration example, the first end portion 10a, the second end portion 10b, and the connection portion 10c have mutually different widths. More specifically, the first end portion 10a is formed with a width differing from a width of the connection portion 10c. Also, the second end portion 10b is formed with a width differing from the width of the connection portion 10c. In the present embodiment, the second end portion 10b is formed with a width equal to the width of the first end portion 10a. The second end portion 10b may instead be formed with a width differing from the width of the first end portion 10a.

In the present embodiment, the first end portion 10a is formed in a quadrilateral shape (a square shape in the present embodiment) in plan view. Also, the second end portion 10b is formed in a quadrilateral shape (a square shape in the present embodiment) in plan view. Also, the connection portion 10c has a width narrower than the width of the first end portion 10a and the second end portion 10b.

Figure 7D:
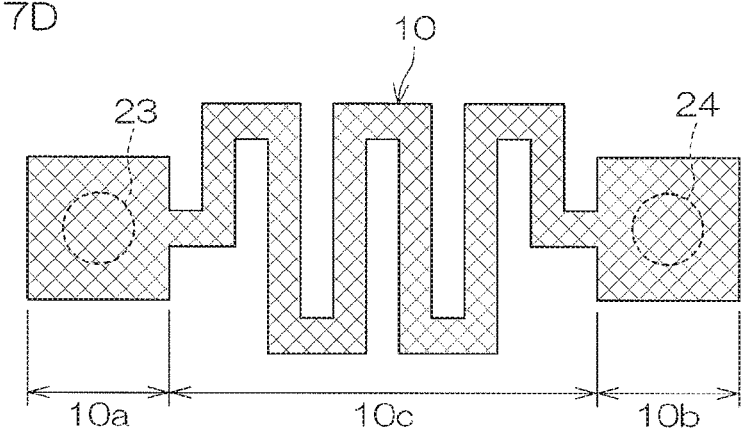
FIG. 7D is a plan view of the resistance layer according to a fifth configuration example.

FIG. 7D is a plan view of the resistance layer 10 according to a fifth configuration example. In the following, structures corresponding to the structures described for the electronic component 1 shall be provided with the same reference symbols and description thereof shall be omitted.

Referring to FIG. 7D, with the resistance layer 10 according to the fifth configuration example, the first end portion 10a, the second end portion 10b, and the connection portion 10c are formed in bands having mutually different widths. More specifically, the first end portion 10a is formed with a width differing from a width of the connection portion 10c. Also, the second end portion 10b is formed with a width differing from the width of the connection portion 10c. In the present embodiment, the second end portion 10b is formed with a width equal to the width of the first end portion 10a. The second end portion 10b may instead be formed with a width differing from the width of the first end portion 10a.

In the present embodiment, the first end portion 10a is formed in a quadrilateral shape (a square shape in the present embodiment) in plan view. Also, the second end portion 10b is formed in a quadrilateral shape (a square shape in the present embodiment) in plan view. Also, the connection portion 10c has a width narrower than the width of the first end portion 10a and the second end portion 10b. Further, the connection portion 10c extends in a meandering shape in the region between the first end portion 10a and the second end portion 10b.

Figure 7E:
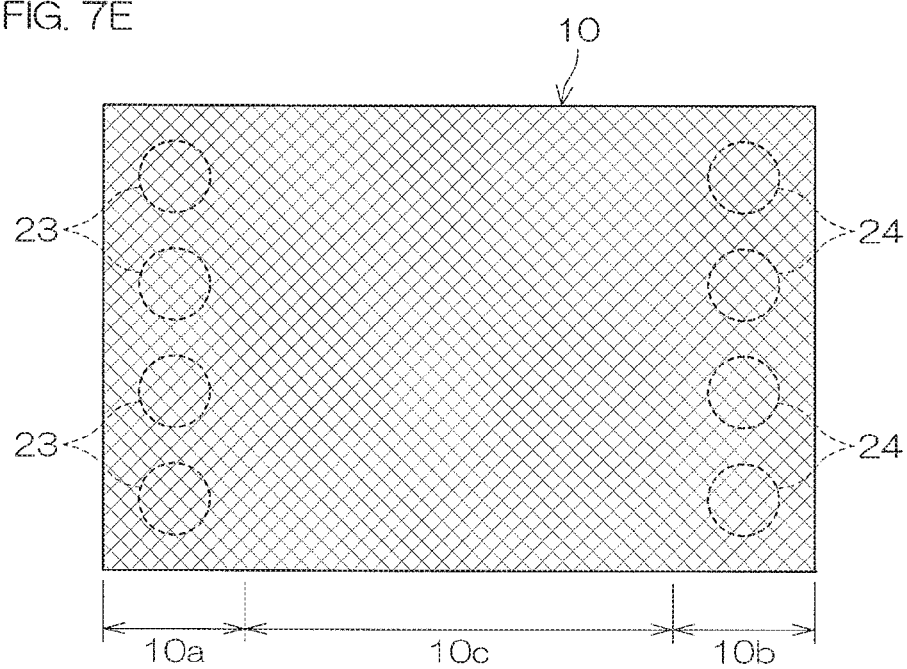
FIG. 7E is a plan view of the resistance layer according to a sixth configuration example.

FIG. 7E is a plan view of the resistance layer 10 according to a sixth configuration example. In the following, structures corresponding to the structures described for the electronic component 1 shall be provided with the same reference symbols and description thereof shall be omitted.

Referring to FIG. 7E, the resistance layer 10 according to the sixth configuration example is electrically connected to a plurality (two or more; four in the present embodiment) of first via electrodes 23 and a plurality (two or more; four in the present embodiment) of second via electrodes 24.

That is, a plurality (two or more; four in the present embodiment) of first via electrodes 23 and a plurality (two or more; four in the present embodiment) of second via electrodes 24 may be formed in the outside region 7. In this case, the resistance layer 10 may cover the plurality (two or more; four in the present embodiment) of first via electrodes 23 and the plurality (two or more; four in the present embodiment) of second via electrodes 24 collectively.

The number of the first via electrodes 23 and the number of the second via electrodes 24 are arbitrary. The number of the first via electrodes 23 and the number of the second via electrodes 24 may differ from each other. The number of the first via electrodes 23 may be not more than the number of the second via electrodes 24. The number of the first via electrodes 23 may be not less than the number of the second via electrodes 24.

Also, a plurality of second via electrodes 24 may be formed while a single first via electrode 23 is formed. A plurality of first via electrodes 23 may be formed while a single second via electrode 24 is formed.

Features of the resistance layers 10 according to the first configuration example, the second configuration example, the third configuration example, the fourth configuration example, the fifth configuration example, and the sixth configuration example may be combined with each other in any mode and any configuration. A resistance layer 10 having a configuration combining at least two features among the features of the resistance layers 10 according to the first to sixth configuration examples may be adopted.

For example, the feature of the resistance layer 10 according to the sixth configuration example may be incorporated in the resistance layers 10 according to the first to fifth configuration examples. In this case, the first end portion 10a of each of the first to fifth configuration examples covers a plurality of first via electrodes 23 collectively. Also, the second end portion 10b of each of the first to fifth configuration examples covers a plurality of second via electrodes 24 collectively.

Referring again to FIG. 2 to FIG. 4, the resistance circuit 11 further includes a protective layer 40 that protects the resistance layer 10. The protective layer 40 is interposed in the region between the third insulating layer 15 and the fourth insulating layer 16 and covers the resistance layer 10. The protective layer 40 is formed as a film along the resistance layer 10.

The protective layer 40 has a planar shape matching the planar shape of the resistance layer 10. The protective layer 40 has side surfaces continuous to side surfaces of the resistance layer 10. That is, the side surfaces of the protective layer 40 are formed flush with the side surfaces of the resistance layer 10.

The protective layer 40 may have a laminated structure including a silicon oxide film and a silicon nitride film. In this case, the silicon nitride film may be formed on the silicon oxide film or the silicon oxide film may be formed on the silicon nitride film. The protective layer 40 may instead have a single layer structure made of a silicon oxide film or a silicon nitride film. In the present embodiment, the protective layer 40 has a single layer structure made of a silicon oxide film.

A thickness of the protective layer 40 may be not less than 1 nm and not more than 5 μm. The thickness of the protective layer 40 may be not less than 1 nm and not more than 10 nm, not less than 10 nm and not more than 50 nm, not less than 50 nm and not more than 100 nm, not less than 100 nm and not more than 200 nm, not less than 200 nm and not more than 400 nm, not less than 400 nm and not more than 600 nm, not less than 600 nm and not more than 800 nm, or not less than 800 nm and not more than 1 μm.

The thickness of the protective layer 40 may be not less than 1 μm and not more than 1.5 μm, not less than 1.5 μm and not more than 2 μm, not less than 2 μm and not more than 2.5 μm, not less than 2.5 μm and not more than 3 μm, not less than 3 μm and not more than 3.5 μm, not less than 3.5 μm and not more than 4 μm, not less than 4 μm and not more than 4.5 μm, or not less than 4.5 μm and not more than 5 μm. The thickness of the protective layer 40 is preferably not more than the thickness TR of the resistance layer 10.

The resistance circuit 11 further includes a first lower wiring layer 41 and a second lower wiring layer 42. The first lower wiring layer 41 is formed in a region at the third insulating layer 15 side with respect to the resistance layer 10. More specifically, the first lower wiring layer 41 is formed on the connection circuit forming layer 21 (second insulating layer 14) and is covered by the third insulating layer 15. The first lower wiring layer 41 is embedded in the third insulating layer 15. The first lower wiring layer 41 is electrically connected to the resistance layer 10 via the first via electrode 23.

The second lower wiring layer 42 is formed in a region at the third insulating layer 15 side with respect to the resistance layer 10. More specifically, the second lower wiring layer 42 is formed on the connection circuit forming layer 21 (second insulating layer 14) and is covered by the third insulating layer 15. The second lower wiring layer 42 is embedded in the third insulating layer 15. The second lower wiring layer 42 is formed at an interval from the first lower wiring layer 41. The second lower wiring layer 42 is electrically connected to the resistance layer 10 via the second via electrode 24.

The resistance layer 10 is thereby connected in series to the first lower wiring layer 41 and the second lower wiring layer 42. The resistance layer 10 is formed on a line connecting the first lower wiring layer 41 and the second lower wiring layer 42 in plan view. In the present embodiment, the resistance layer 10 extends rectilinearly in a region between the first lower wiring layer 41 and the second lower wiring layer 42 in plan view.

The first lower wiring layer 41 and the second lower wiring layer 42 respectively have first thicknesses TL1. The first thicknesses TL1 may be not less than 100 nm and not more than 3000 nm. The first thicknesses TL1 may each be not less than 100 nm and not more than 500 nm, not less than 500 nm and not more than 1000 nm, not less than 1000 nm and not more than 1500 nm, not less than 1500 nm and not more than 2000 nm, not less than 2000 nm and not more than 2500 nm, or not less than 2500 nm and not more than 3000 nm.

The first thicknesses TL1 are preferably not less than 100 nm and not more than 1500 nm. The first thickness TL1 of the first lower wiring layer 41 and the first thickness TL1 of the second lower wiring layer 42 may differ from each other. The first thickness TL1 of the first lower wiring layer 41 and the first thickness TL1 of the second lower wiring layer 42 are preferably equal to each other.

Referring to FIG. 3, the first lower wiring layer 41 includes a first end portion 41a at one side, a second end portion 41b at another side, and a connection portion 41c connecting the first end portion 41a and the second end portion 41b. The first end portion 41a overlaps with the first end portion 10a of the resistance layer 10 in plan view. The first end portion 41a is electrically connected to the first end portion 10a of the resistance layer 10 via the first via electrode 23.

The second end portion 41b is positioned in a region outside the resistance layer 10 in plan view. In the present embodiment, the second end portion 41b is positioned in the outside region 7. The connection portion 41c extends as a band in a region between the first end portion 41a and the second end portion 41b in plan view. In the present embodiment, the connection portion 41c extends as a band along a straight line connecting the first end portion 41a and the second end portion 41b.

In the present embodiment, the first lower wiring layer 41 has a laminated structure in which a plurality of electrode layers are laminated. The first lower wiring layer 41 includes a first barrier layer 43, a main body layer 44, and a second barrier layer 45 that are laminated in that order from the top of the connection circuit forming layer 21 (second insulating layer 14).

In the present embodiment, the first barrier layer 43 has a laminated structure that includes a Ti layer 46 and a TiN layer 47 that are laminated in that order from the top of the connection circuit forming layer 21 (second insulating layer 14). The first barrier layer 43 may instead have a single layer structure made of the Ti layer 46 or the TiN layer 47.

The main body layer 44 has a resistance value less than a resistance value of the first barrier layer 43 and a resistance value of the second barrier layer 45. The main body layer 44 has a thickness exceeding a thickness of the first barrier layer 43 and a thickness of the second barrier layer 45. The main body layer 44 may include at least one type of substance among Al, Cu, AlSiCu alloy, AlSi alloy, and AlCu alloy. In the present embodiment, the main body layer 44 has a single layer structure made of an AlCu alloy layer 48.

In the present embodiment, the second barrier layer 45 has a laminated structure that includes a Ti layer 49 and a TiN layer 50 that are laminated in that order from the top of the main body layer 44. The second barrier layer 45 may instead have a single layer structure made of the Ti layer 49 or the TiN layer 50.

Referring to FIG. 4, the second lower wiring layer 42 includes a first end portion 42a at one side, a second end portion 42b at another side, and a connection portion 42c connecting the first end portion 42a and the second end portion 42b. The first end portion 42a overlaps with the second end portion 10b of the resistance layer 10 in plan view. The first end portion 42a is electrically connected to the second end portion 10b of the resistance layer 10 via the second via electrode 24.

The second end portion 42b is positioned in a region outside the resistance layer 10 in plan view. In the present embodiment, the second end portion 42b is positioned in the outside region 7. The connection portion 42c extends as a band in a region between the first end portion 42a and the second end portion 42b in plan view. In the present embodiment, the connection portion 42c extends as a band along a straight line connecting the first end portion 42a and the second end portion 42b.

In the present embodiment, the second lower wiring layer 42 has a laminated structure in which a plurality of electrode layers are laminated. The second lower wiring layer 42 includes a first barrier layer 53, a main body layer 54, and a second barrier layer 55 that are laminated in that order from the top of the connection circuit forming layer 21 (second insulating layer 14).

In the present embodiment, the first barrier layer 53 has a laminated structure that includes a Ti layer 56 and a TiN layer 57 that are laminated in that order from the top of the connection circuit forming layer 21 (second insulating layer 14). The first barrier layer 53 may instead have a single layer structure made of the Ti layer 56 or the TiN layer 57.

The main body layer 54 has a resistance value less than a resistance value of the first barrier layer 53 and a resistance value of the second barrier layer 55. The main body layer 54 has a thickness exceeding a thickness of the first barrier layer 53 and a thickness of the second barrier layer 55. The main body layer 54 may include at least one type of substance among Al, Cu, AlSiCu alloy, AlSi alloy, and AlCu alloy. In the present embodiment, the main body layer 54 has a single layer structure made of an AlCu alloy layer 58.

In the present embodiment, the second barrier layer 55 has a laminated structure that includes a Ti layer 59 and a TiN layer 60 that are laminated in that order from the top of the main body layer 54. The second barrier layer 55 may instead have a single layer structure made of the Ti layer 59 or the TiN layer 60.

The resistance circuit 11 further includes a first upper wiring layer 61 and a second upper wiring layer 62. The first upper wiring layer 61 is formed on the third insulating layer 15. The first upper wiring layer 61 forms one of top wiring layers of the multilayer wiring structure 12. The first upper wiring layer 61 is electrically connected to the first lower wiring layer 41.

The second upper wiring layer 62 is formed on the third insulating layer 15 at an interval from the first upper wiring layer 61. The second upper wiring layer 62 forms one of the top wiring layers of the multilayer wiring structure 12. The second upper wiring layer 62 is electrically connected to the second lower wiring layer 42.

The resistance layer 10 is thereby electrically connected to the first upper wiring layer 61 via the first lower wiring layer 41. Also, the resistance layer 10 is electrically connected to the second upper wiring layer 62 via the second lower wiring layer 42. The resistance layer 10 is serially connected to the first upper wiring layer 61 and the second upper wiring layer 62 via the first lower wiring layer 41 and the second lower wiring layer 42.

The first upper wiring layer 61 is formed at an interval from the resistance layer 10 in plan view. The first upper wiring layer 61 does not overlap with the resistance layer 10 in plan view. An entirety of the resistance layer 10 is exposed from the first upper wiring layer 61 in plan view.

The second upper wiring layer 62 is formed at an interval from the resistance layer 10 in plan view. The second upper wiring layer 62 does not overlap with the resistance layer 10 in plan view. The entirety of the resistance layer 10 is exposed from the second upper wiring layer 62 in plan view.

That is, the resistance layer 10 is formed in a region between the first upper wiring layer 61 and the second upper wiring layer 62 in plan view. A parasitic capacitance can thereby be suppressed in a region between the resistance layer 10 and the first upper wiring layer 61. Also, a parasitic capacitance can be suppressed in a region between the resistance layer 10 and the second upper wiring layer 62.

In the present embodiment, the resistance layer 10 is formed at intervals from the first upper wiring layer 61 and the second upper wiring layer 62 in plan view. The parasitic capacitance can thereby be suppressed appropriately in the region between the resistance layer 10 and the first upper wiring layer 61.

The first upper wiring layer 61 and the second upper wiring layer 62 respectively have second thicknesses TL2. The second thicknesses TL2 are not less than the first thicknesses TL1 (TL1≤TL2). More specifically, the second thicknesses TL2 exceed the first thicknesses TL1 (TL1<TL2).

The second thicknesses TL2 may be not less than 100 nm and not more than 15000 nm. The second thicknesses TL2 may each be not less than 100 nm and not more than 1500 nm, not less than 1500 nm and not more than 3000 nm, not less than 3000 nm and not more than 4500 nm, not less than 4500 nm and not more than 6000 nm, not less than 6000 nm and not more than 7500 nm, not less than 7500 nm and not more than 9000 nm, not less than 9000 nm and not more than 10500 nm, not less than 10500 nm and not more than 12000 nm, not less than 12000 nm and not more than 13500 nm, or not less than 13500 nm and not more than 15000 nm.

The second thickness TL2 of the first upper wiring layer 61 and the second thickness TL2 of the second upper wiring layer 62 may differ from each other. The second thickness TL2 of the first upper wiring layer 61 and the second thickness TL2 of the second upper wiring layer 62 are preferably equal to each other.

Referring to FIG. 3, the first upper wiring layer 61 includes a first end portion 61a at one side, a second end portion 61b at another side, and a connection portion 61c connecting the first end portion 61a and the second end portion 61b. The first end portion 61a is positioned in a region overlapping with the first end portion 41a of the first lower wiring layer 41 in plan view.

The second end portion 61b is positioned in a region outside the resistance layer 10 in plan view. In the present embodiment, the second end portion 61b is positioned in the device region 6 in plan view. The second end portion 61b may be positioned in the outside region 7 instead. The connection portion 61c extends as a band in a region between the first end portion 61a and the second end portion 61b in plan view. In the present embodiment, the connection portion 61c extends as a band along a straight line connecting the first end portion 61a and the second end portion 61b.

In the present embodiment, the first upper wiring layer 61 has a laminated structure in which a plurality of electrode layers are laminated. The first upper wiring layer 61 includes a first barrier layer 63, a main body layer 64, and a second barrier layer 65 that are laminated in that order from the top of the connection circuit forming layer 21 (second insulating layer 14).

In the present embodiment, the first barrier layer 63 has a laminated structure that includes a Ti layer 66 and a TiN layer 67 that are laminated in that order from the top of the connection circuit forming layer 21 (second insulating layer 14). The first barrier layer 63 may instead have a single layer structure made of the Ti layer 66 or the TiN layer 67.

The main body layer 64 has a resistance value less than a resistance value of the first barrier layer 63 and a resistance value of the second barrier layer 65. The main body layer 64 has a thickness exceeding a thickness of the first barrier layer 63 and a thickness of the second barrier layer 65. The main body layer 64 may include at least one type of substance among Al, Cu, AlSiCu alloy, AlSi alloy, and AlCu alloy. In the present embodiment, the main body layer 64 has a single layer structure made of an AlCu alloy layer 68.

In the present embodiment, the second barrier layer 65 has a laminated structure that includes a Ti layer 69 and a TiN layer 70 that are laminated in that order from the top of the main body layer 64. The second barrier layer 65 may instead have a single layer structure made of the Ti layer 69 or the TiN layer 70.

Referring to FIG. 4, the second upper wiring layer 62 includes a first end portion 62a at one side, a second end portion 62b at another side, and a connection portion 62c connecting the first end portion 62a and the second end portion 62b. The first end portion 62a is positioned in a region overlapping with the second end portion 42b of the second lower wiring layer 42 in plan view.

The second end portion 62b is positioned in a region outside the resistance layer 10 in plan view. In the present embodiment, the second end portion 62b is positioned in the device region 6 in plan view. The second end portion 62b may be positioned in the outside region 7 in plan view instead. The connection portion 62c extends as a band in a region between the first end portion 62a and the second end portion 62b in plan view. In the present embodiment, the connection portion 62c extends as a band along a straight line connecting the first end portion 62a and the second end portion 62b.

In the present embodiment, the second upper wiring layer 62 has a laminated structure in which a plurality of electrode layers are laminated. The second upper wiring layer 62 includes a first barrier layer 73, a main body layer 74, and a second barrier layer 75 that are laminated in that order from the top of the connection circuit forming layer 21 (second insulating layer 14).

In the present embodiment, the first barrier layer 73 has a laminated structure that includes a Ti layer 76 and a TiN layer 77 that are laminated in that order from the top of the connection circuit forming layer 21 (second insulating layer 14). The first barrier layer 73 may instead have a single layer structure made of the Ti layer 76 or the TiN layer 77.

The main body layer 74 has a resistance value less than a resistance value of the first barrier layer 73 and a resistance value of the second barrier layer 75. The main body layer 74 has a thickness exceeding a thickness of the first barrier layer 73 and a thickness of the second barrier layer 75. The main body layer 74 may include at least one type of substance among Al, Cu, AlSiCu alloy, AlSi alloy, and AlCu alloy. In the present embodiment, the main body layer 74 has a single layer structure made of an AlCu alloy layer 78.

In the present embodiment, the second barrier layer 75 has a laminated structure that includes a Ti layer 79 and a TiN layer 80 that are laminated in that order from the top of the main body layer 74. The second barrier layer 75 may instead have a single layer structure made of the Ti layer 79 or the TiN layer 80.

Referring to FIG. 1 to FIG. 4, the resistance circuit 11 includes a first long via electrode 83 and a second long via electrode 84. The first long via electrode 83 is electrically connected to the first lower wiring layer 41 and the first upper wiring layer 61. The second long via electrode 84 is electrically connected to the second lower wiring layer 42 and the second upper wiring layer 62.

The resistance layer 10 is thereby electrically connected to the first upper wiring layer 61 via the first via electrode 23, the first lower wiring layer 41, and the first long via electrode 83. Also, the resistance layer 10 is electrically connected to the second upper wiring layer 62 via the second via electrode 24, the second lower wiring layer 42, and the second long via electrode 84.

The first long via electrode 83 is formed at a side of the resistance layer 10. In the present embodiment, the first long via electrode 83 is positioned on a straight line connecting the first via electrode 23 and the second via electrode 24.

The second long via electrode 84 is formed in a side of the resistance layer 10 at an interval from the first long via electrode 83. In the present embodiment, the second long via electrode 84 faces the first long via electrode 83 across the resistance layer 10. The second long via electrode 84 is positioned on the straight line connecting the first via electrode 23 and the second via electrode 24.

The resistance layer 10 is thereby positioned on a straight line connecting the first long via electrode 83 and the second long via electrode 84. The resistance layer 10 is positioned on a straight line connecting the first via electrode 23, the second via electrode 24, the first long via electrode 83, and the second long via electrode 84. In the present embodiment, the resistance layer 10 extends along the straight line connecting the first long via electrode 83 and the second long via electrode 84.

In the present embodiment, the first long via electrode 83 is formed in a circular shape in plan view. The planar shape of the first long via electrode 83 is arbitrary. The first long via electrode 83 may be formed in a polygonal shape, such as a triangular shape, a quadrilateral shape, or a hexagonal shape, etc., or an elliptical shape in plan view instead of a circular shape.

The first long via electrode 83 traverses the resistance layer 10 in the direction normal to the main surface of the third insulating layer 15. The first long via electrode 83 penetrates through the third insulating layer 15 and the fourth insulating layer 16 to be embedded in the third insulating layer 15 and the fourth insulating layer 16 and is exposed from the main surface of the fourth insulating layer 16.

The first long via electrode 83 includes a first end portion 83a at one side and a second end portion 83b at another side in the direction normal to the main surface of the third insulating layer 15. The first end portion 83a is exposed from the main surface of the fourth insulating layer 16. The first end portion 83a is electrically connected to the first end portion 61a of the first upper wiring layer 61.

The second end portion 83b is positioned inside the third insulating layer 15. The second end portion 83b is electrically connected to the second end portion 41b of the first lower wiring layer 41. The first long via electrode 83 is formed in a convergent shape that narrows in width from the first end portion 83a toward the second end portion 83b in sectional view.

The first long via electrode 83 includes a lower portion 83c positioned at the third insulating layer 15 side with respect to the resistance layer 10 and an upper portion 83d positioned at the fourth insulating layer 16 side with respect to the resistance layer 10. In the direction normal to the main surface of the third insulating layer 15, a length of the upper portion 83d is not less than a length of the lower portion 83c. More specifically, the length of the upper portion 83d exceeds the length of the lower portion 83c.

The first long via electrode 83 has a laminated structure that includes a main body layer 85 and a barrier layer 86. The main body layer 85 is embedded in the third insulating layer 15 and the fourth insulating layer 16. The main body layer 85 may include tungsten (W) or copper (Cu). In the present embodiment, the first long via electrode 83 has a single layer structure made of a tungsten layer 87.

The barrier layer 86 is interposed between the main body layer 85 and the third insulating layer 15 and between the main body layer 85 and the fourth insulating layer 16. In the present embodiment, the barrier layer 86 has a laminated structure in which a plurality of electrode layers are laminated. In the present embodiment, the barrier layer 86 includes a Ti layer 88 and a TiN layer 89 that are formed in that order from the third insulating layer 15.

The Ti layer 88 is in contact with the third insulating layer 15 and the fourth insulating layer 16. The TiN layer 89 is in contact with the main body layer 85. The barrier layer 86 may instead have a single layer structure made of the Ti layer 88 or the TiN layer 89.

In the present embodiment, the second long via electrode 84 is formed in a circular shape in plan view. The planar shape of the second long via electrode 84 is arbitrary. The second long via electrode 84 may be formed in a polygonal shape, such as a triangular shape, a quadrilateral shape, or a hexagonal shape, etc., or an elliptical shape in plan view instead of a circular shape.

The second long via electrode 84 traverses the resistance layer 10 in the direction normal to the main surface of the third insulating layer 15. The second long via electrode 84 penetrates through the third insulating layer 15 and the fourth insulating layer 16 to be embedded in the third insulating layer 15 and the fourth insulating layer 16 and is exposed from the main surface of the fourth insulating layer 16.

The second long via electrode 84 includes a first end portion 84a at one side and a second end portion 84b at another side in the direction normal to the main surface of the third insulating layer 15. The first end portion 84a is exposed from the main surface of the fourth insulating layer 16. The first end portion 84a is electrically connected to the first end portion 62a of the second upper wiring layer 62.

The second end portion 84b is positioned inside the third insulating layer 15. The second end portion 84b is electrically connected to the second end portion 42b of the second lower wiring layer 42. The second long via electrode 84 is formed in a convergent shape that narrows in width from the first end portion 84a toward the second end portion 84b in sectional view.

The second long via electrode 84 includes a lower portion 84c positioned at the third insulating layer 15 side with respect to the resistance layer 10 and an upper portion 84d positioned at the fourth insulating layer 16 side with respect to the resistance layer 10. In the direction normal to the main surface of the third insulating layer 15, a length of the upper portion 84d is not less than a length of the lower portion 84c. More specifically, the length of the upper portion 84d exceeds the length of the lower portion 84c.

The second long via electrode 84 has a laminated structure that includes a main body layer 90 and a barrier layer 91. The main body layer 90 is embedded in the third insulating layer 15 and the fourth insulating layer 16. The main body layer 90 may include tungsten (W) or copper (Cu). In the present embodiment, the second long via electrode 84 has a single layer structure made of a tungsten layer 92.

The barrier layer 91 is interposed between the main body layer 90 and the third insulating layer 15 and between the main body layer 90 and the fourth insulating layer 16. In the present embodiment, the barrier layer 91 has a laminated structure in which a plurality of electrode layers are laminated. In the present embodiment, the barrier layer 91 includes a Ti layer 93 and a TiN layer 94 that are formed in that order from the third insulating layer 15.

The Ti layer 93 is in contact with the third insulating layer 15 and the fourth insulating layer 16. The TiN layer 94 is in contact with the main body layer 90. The barrier layer 91 may instead have a single layer structure made of the Ti layer 93 or the TiN layer 94.

Referring to FIG. 2, the connection circuit forming layer 21 includes a wiring 95 electrically connecting the functional device and the resistance layer 10. The wiring 95 is formed selectively inside the first insulating layer 13 and the second insulating layer 14 and is routed from the device region 6 to the outside region 7.

More specifically, the wiring 95 includes one or a plurality of connection wiring layers 96 electrically connected to the functional device in the device region 6. The one or plurality of connection wiring layers 96 are formed on either or both of the first insulating layer 13 and the second insulating layer

14. In FIG. 2, an example where two connection wiring layers 96 are formed on the first insulating layer 13 is shown.

The one or plurality of connection wiring layers 96 are selectively routed from the device region 6 to the outside region 7. Each connection wiring layer 96 has the same laminated structure as the first lower wiring layer 41 (second lower wiring layer 42) and the first upper wiring layer 61 (second upper wiring layer 62). A specific description of the connection wiring layers 96 shall be omitted.

The wiring 95 includes one or a plurality of connection via electrodes 97. The one or plurality of connection via electrodes 97 connect the one or plurality of connection wiring layers 96 to any first lower wiring layer 41 (second lower wiring layer 42) or any first upper wiring layer 61 (second upper wiring layer 62).

The one or plurality of connection via electrodes 97 are formed on either or both of the first insulating layer 13 and the second insulating layer 14. In FIG. 2, an example where one connection wiring layer 96 is connected to the first lower wiring layer 41 by two connection via electrodes 97 is shown.

Each connection via electrode 97 has the same laminated structure as the first via electrode 23 (second via electrode 24) and the first long via electrode 83 (second long via electrode 84). A specific description of the connection via electrodes 97 shall be omitted.

The second end portion 61*b* of the first upper wiring layer 61 may be connected to any connection wiring layer 96 via a connection via electrode 97. The second end portion 62*b* of the second upper wiring layer 62 may be connected to any connection wiring layer 96 via a connection via electrode 97.

Referring to FIG. 2, a top insulating layer 101 is formed on the multilayer wiring structure 12. The top insulating layer 101 selectively covers the first upper wiring layer 61 and the second upper wiring layer 62. The top insulating layer 101 covers a connection portion of the first upper wiring layer 61 and the first long via electrode 83 in plan view. The top insulating layer 101 covers a connection portion of the second upper wiring layer 62 and the second long via electrode 84 in plan view.

In the outside region 7, a first pad opening 102 and a second pad opening 103 are formed in the top insulating layer 101. The first pad opening 102 exposes a partial region of the first upper wiring layer 61 as a first pad region 104. More specifically, the first pad opening 102 exposes a region of the first upper wiring layer 61 as the first pad region 104 besides the connection portion of the first upper wiring layer 61 and the first long via electrode 83.

The second pad opening 103 exposes a partial region of the second upper wiring layer 62 as a second pad region 105. More specifically, the second pad opening 103 exposes a region of the second upper wiring layer 62 as the second pad region 105 besides the connection portion of the second upper wiring layer 62 and the second long via electrode 84.

In the present embodiment, the top insulating layer 101 has a laminated structure that includes a passivation layer 106 and a resin layer 107. In FIG. 1, the resin layer 107 is shown with hatching for clarity.

The passivation layer 106 may have a laminated structure that includes a silicon oxide film and a silicon nitride film. In this case, the silicon nitride film may be formed on the silicon oxide film or the silicon oxide film may be formed on the silicon nitride film.

The passivation layer 106 may have a single layer structure made of a silicon oxide film or a silicon nitride film. The passivation layer 106 is preferably formed of an insulating material that differs in type of substance from the multilayer wiring structure 12. In the present embodiment, the passivation layer 106 has a single layer structure made of a silicon nitride film.

The resin layer 107 may include a photosensitive resin. The photosensitive resin may be of a positive type or a negative type. In the present embodiment, the resin layer 107 includes a polyimide as an example of a negative type photosensitive resin. The resin layer 107 may include a polybenzoxazole as an example of a positive type photosensitive resin instead.

As described above, according to the electronic component 1, the resistance layer 10 is made of a metal thin film and therefore the resistance layer 10 can be incorporated appropriately in the multilayer wiring structure 12. That is, CrSi, TaN, or TiN that is adopted as a metal material of the resistance layer 10 has a comparatively low temperature dependence and voltage dependence and has a sheet resistance value better than the sheet resistance of polysilicon.

Therefore, by adopting a metal thin film including at least one among CrSi, TaN, and TiN in the resistance layer 10, the planar area of the resistance layer 10 can be reduced appropriately while decreasing the thickness of the resistance layer 10 appropriately.

The resistance layer 10 can thereby be interposed appropriately in the region between the third insulating layer 15 and the fourth insulating layer 16 while securing flatness. Also, contacts to the resistance layer 10 can be formed by the first via electrode 23 and the second via electrode 24 embedded in the third electrode layer 15 and therefore flatness at an upper layer of the resistance layer 10 can be increased appropriately. That is, flatness of the fourth insulating layer 16 can be increased appropriately.

The first upper wiring layer 61 and the second upper wiring layer 62 can thereby be formed appropriately on the fourth insulating layer 16 that is increased in flatness. Consequently, the electronic component 1 that enables the resistance layer 10 to be incorporated appropriately in the multilayer wiring structure 12 can be provided.

Figure 8A:
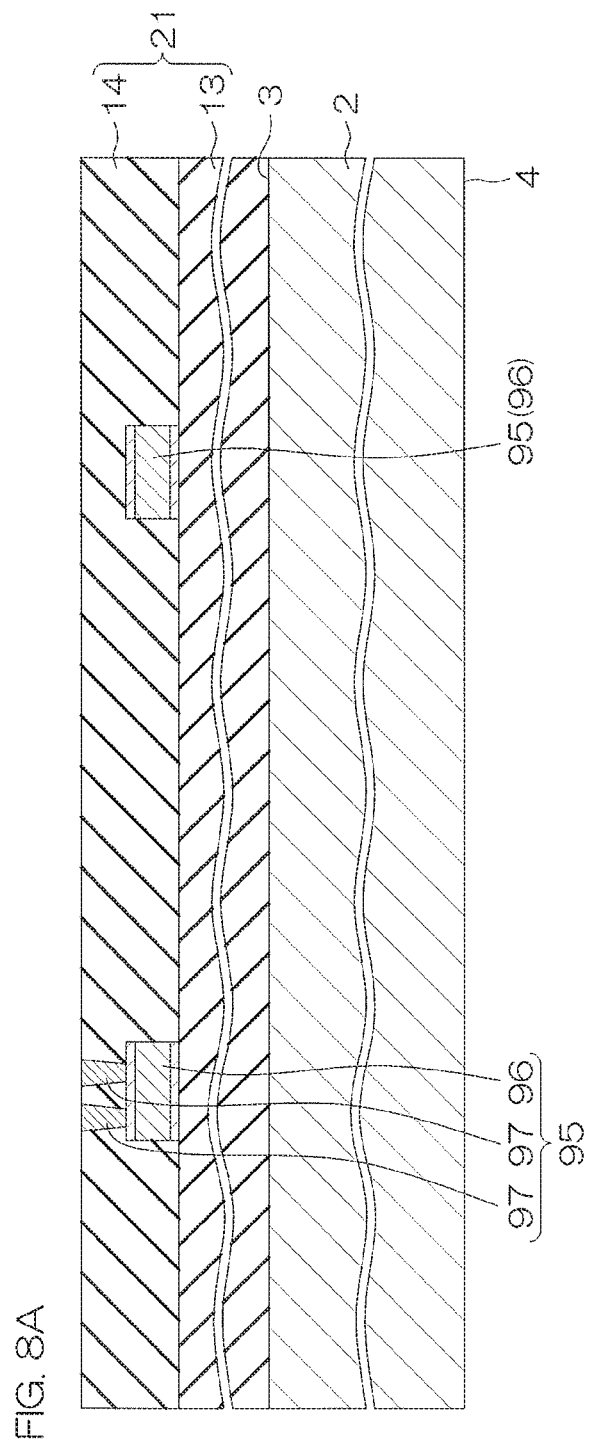
FIG. 8A to FIG. 8S are sectional views of a portion corresponding to FIG. 2 and are sectional views for describing an example of a method for manufacturing the electronic component shown in FIG. 1.
Figure 8B:
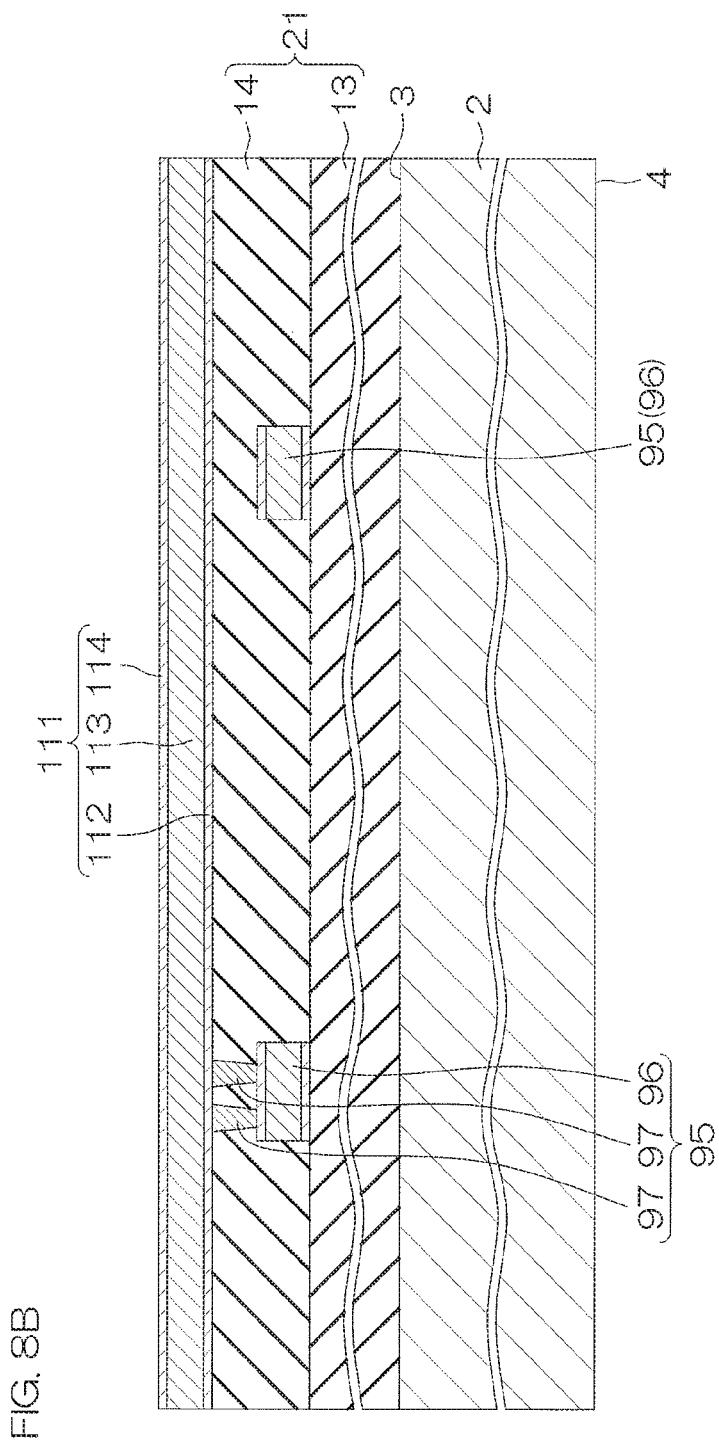
Figure 8D:
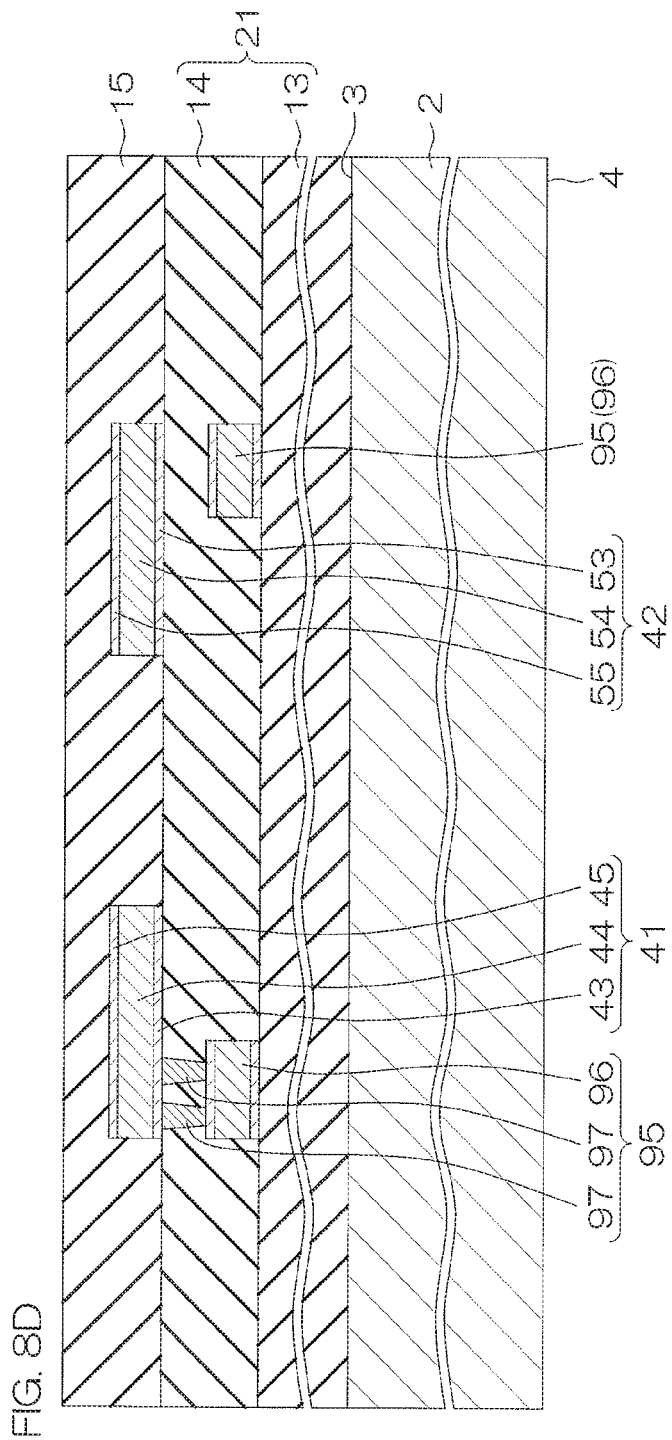
Figure 8F:
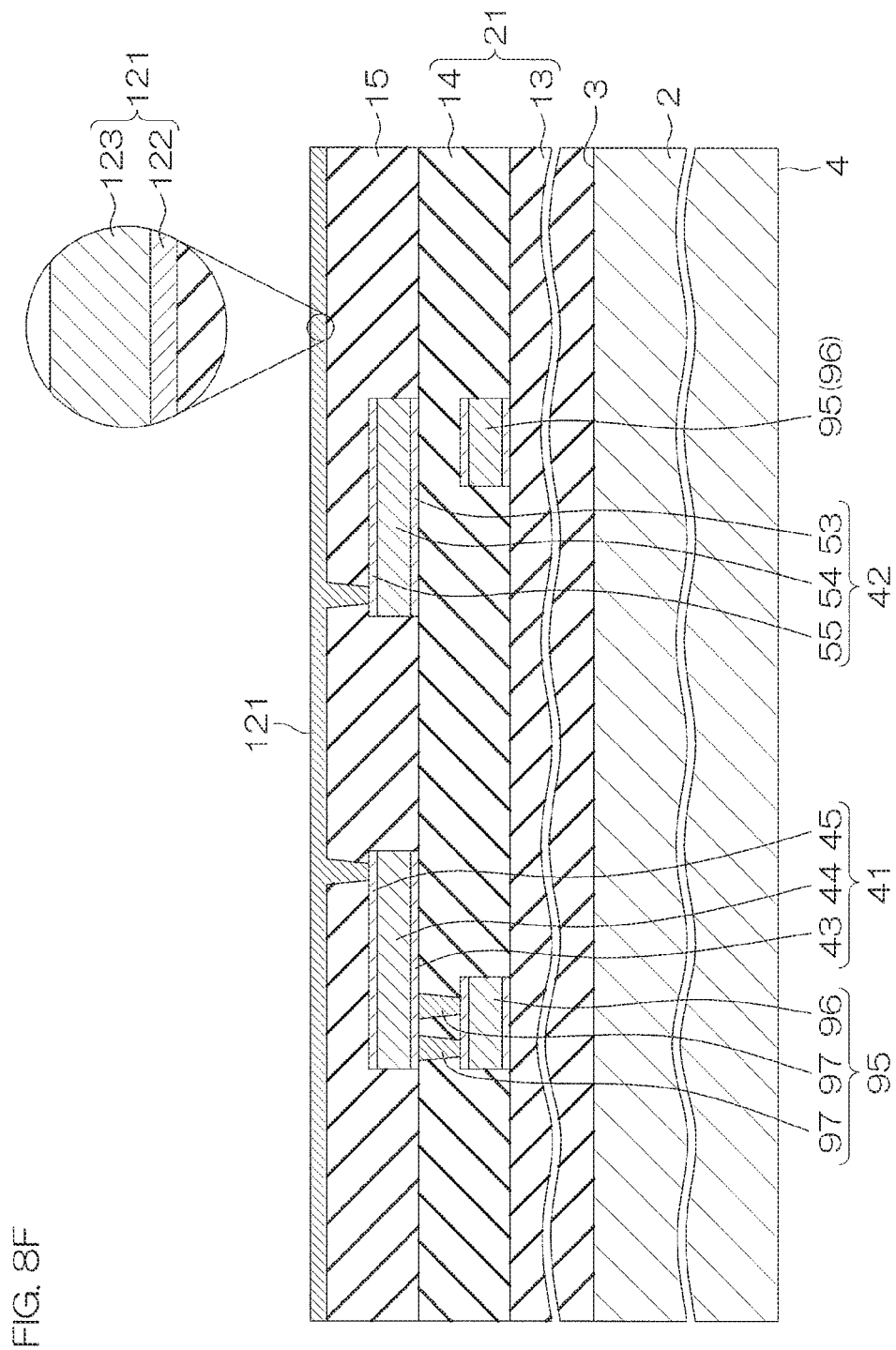
Figure 8G:
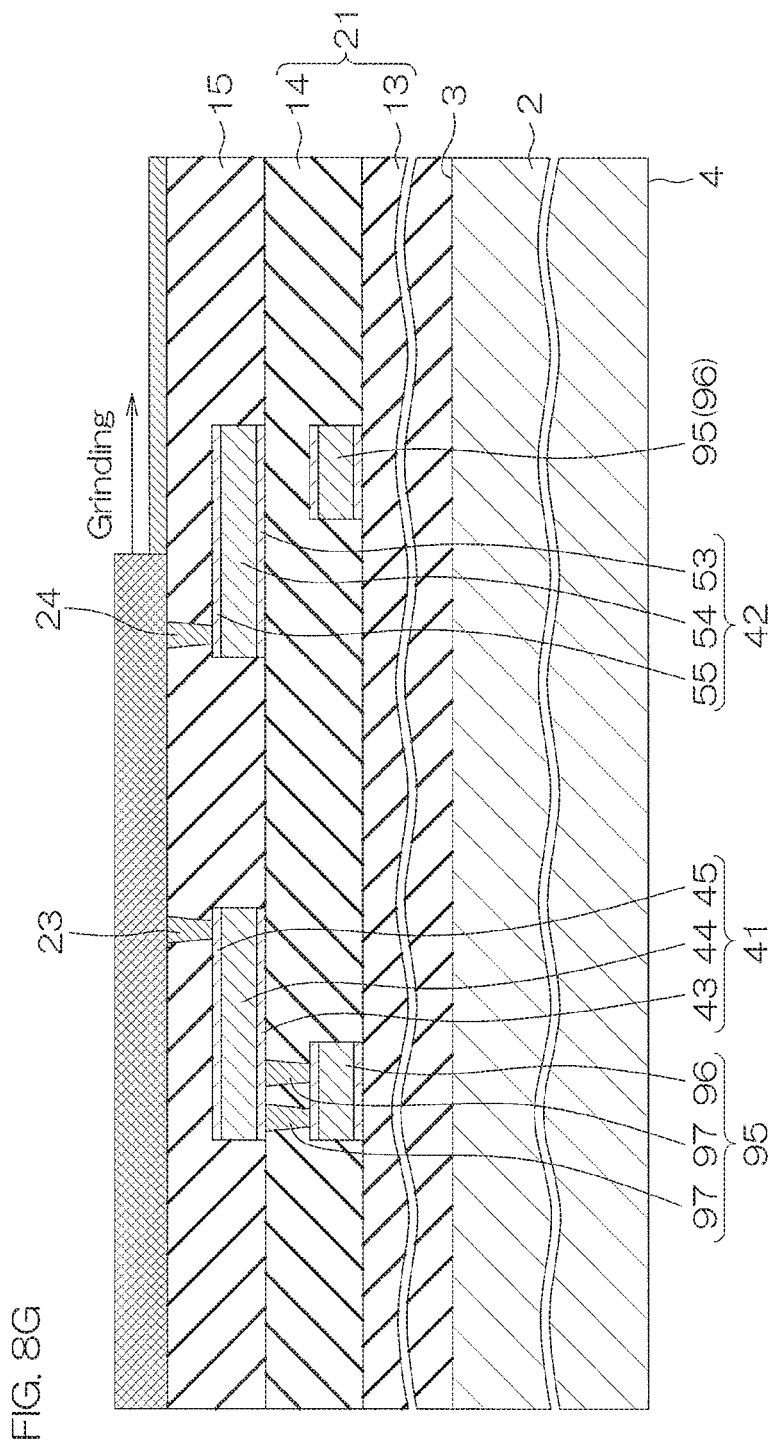
Figure 8H:
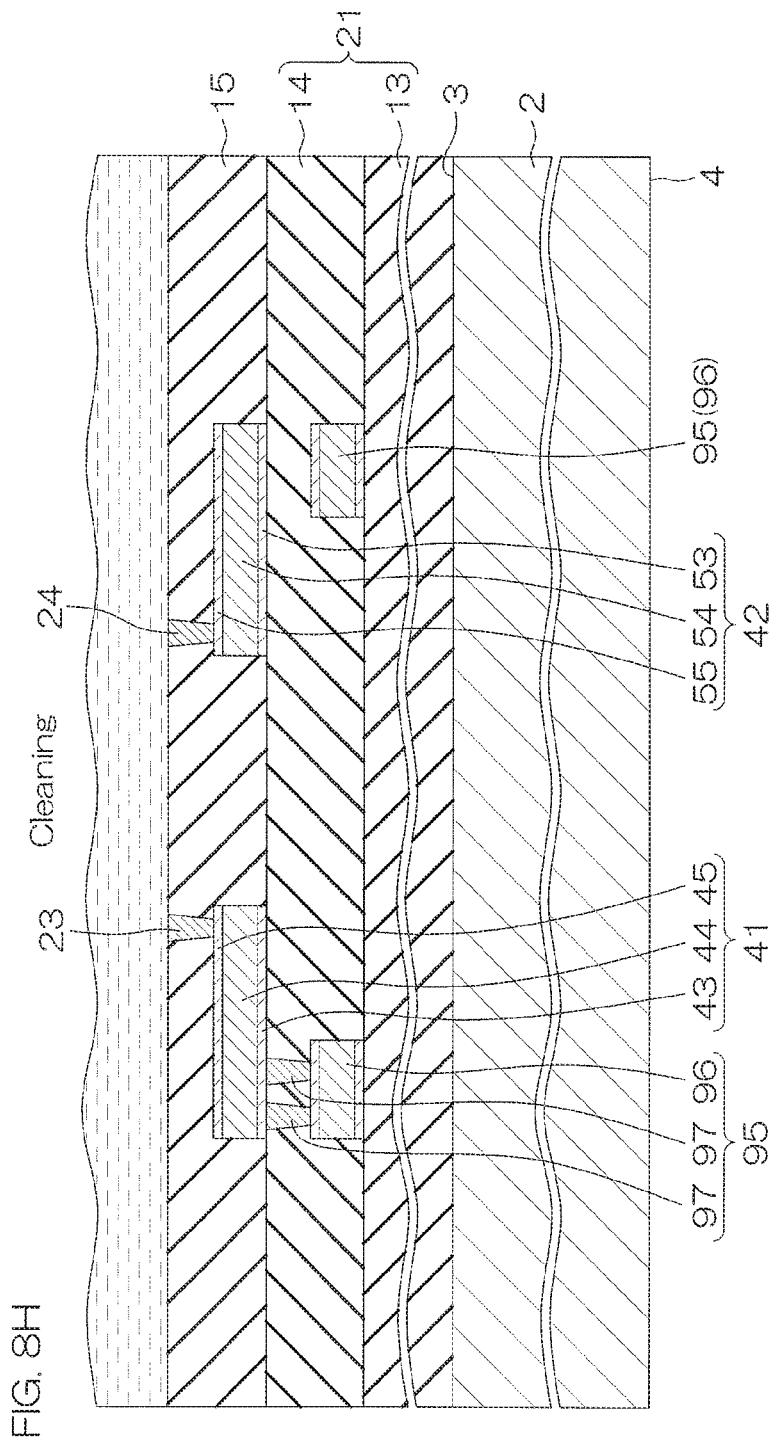
Figure 8I:
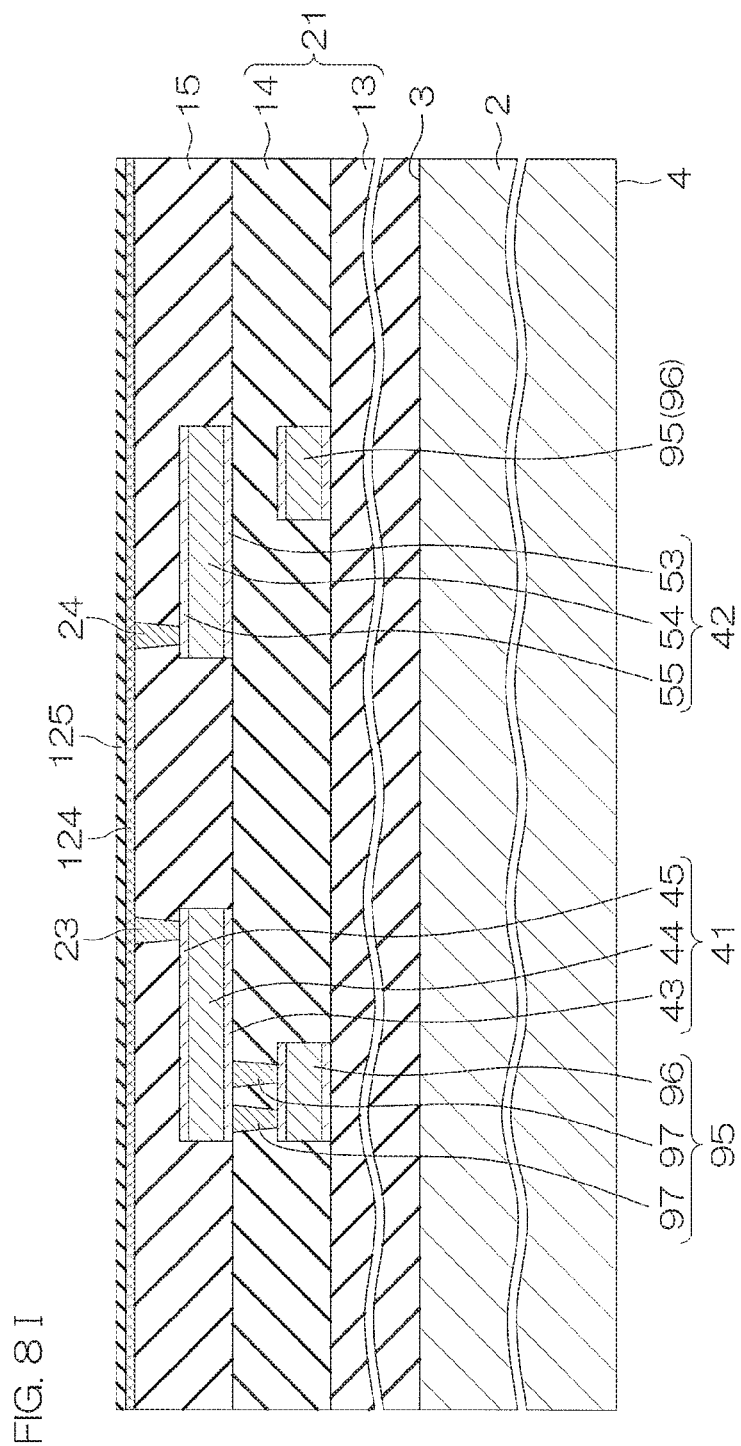
Figure 8J:
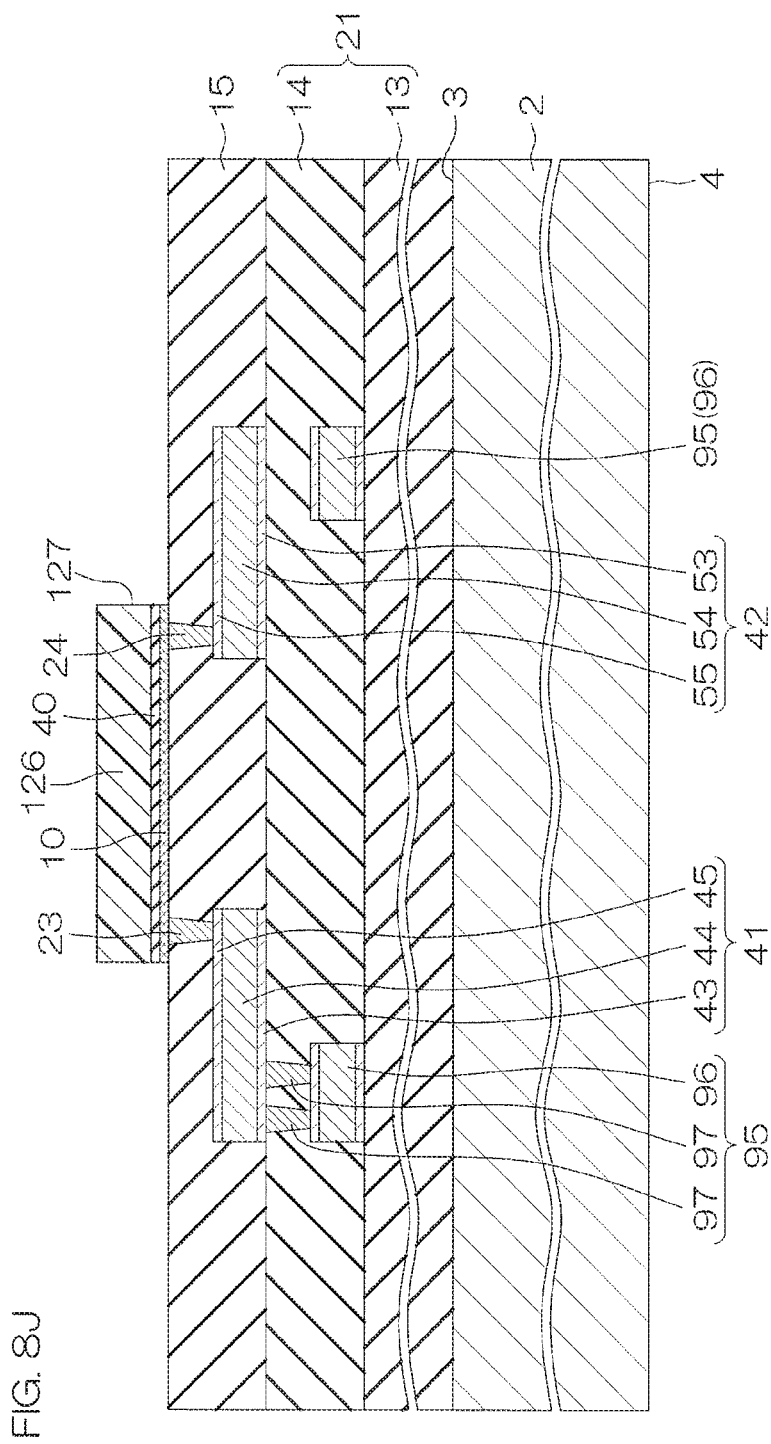
Figure 8K:
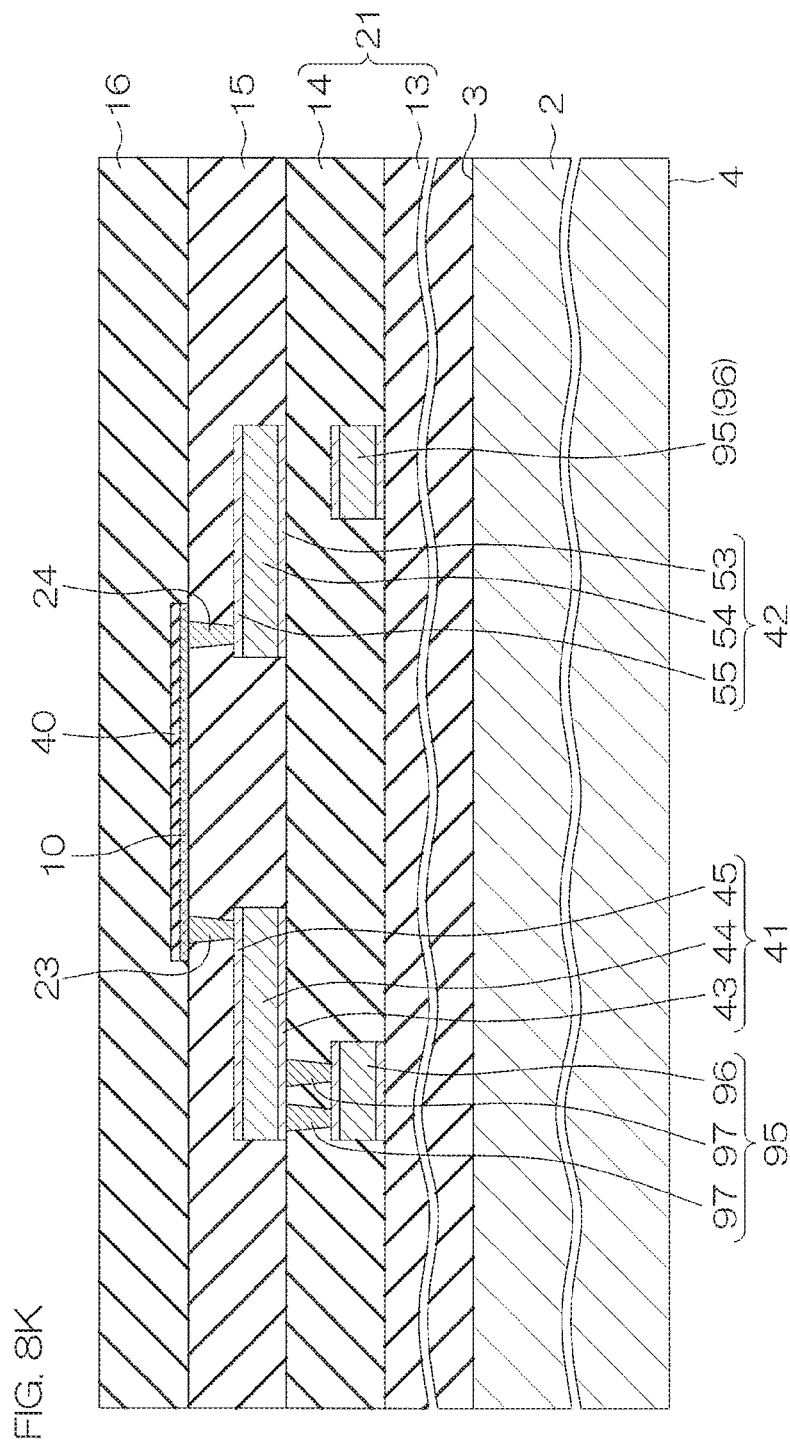
Figure 8M:
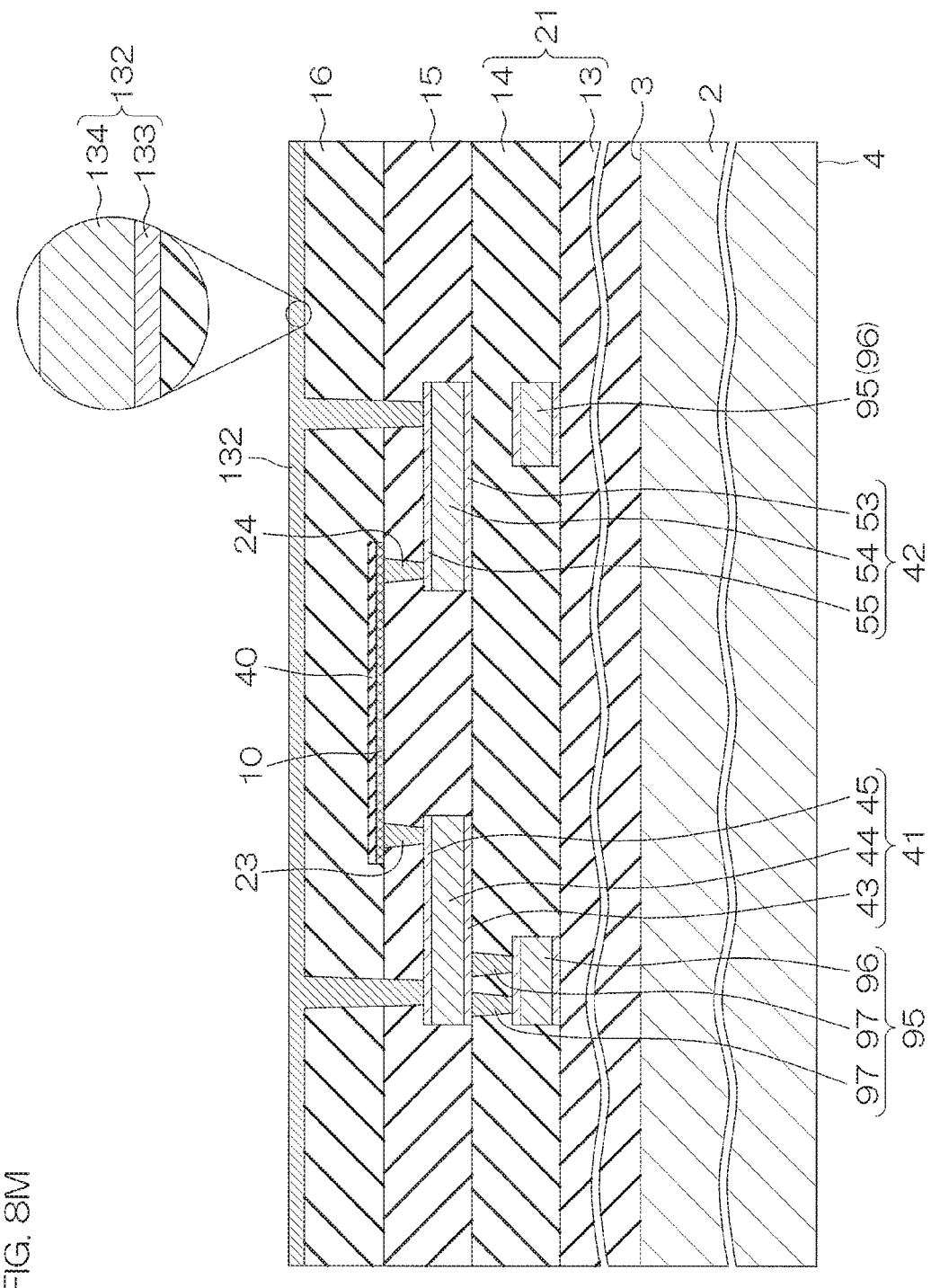
Figure 8N:
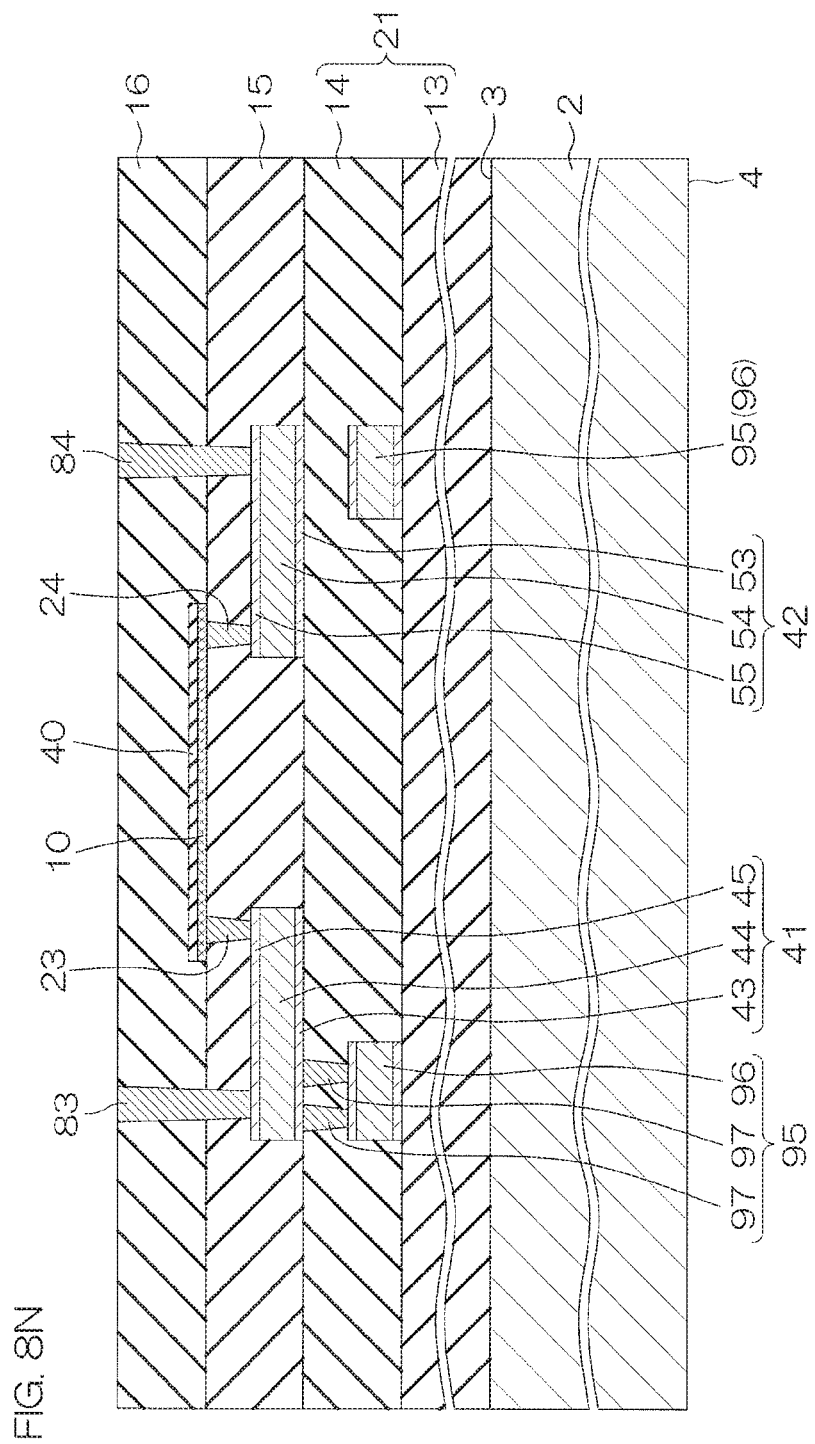
Figure 80:
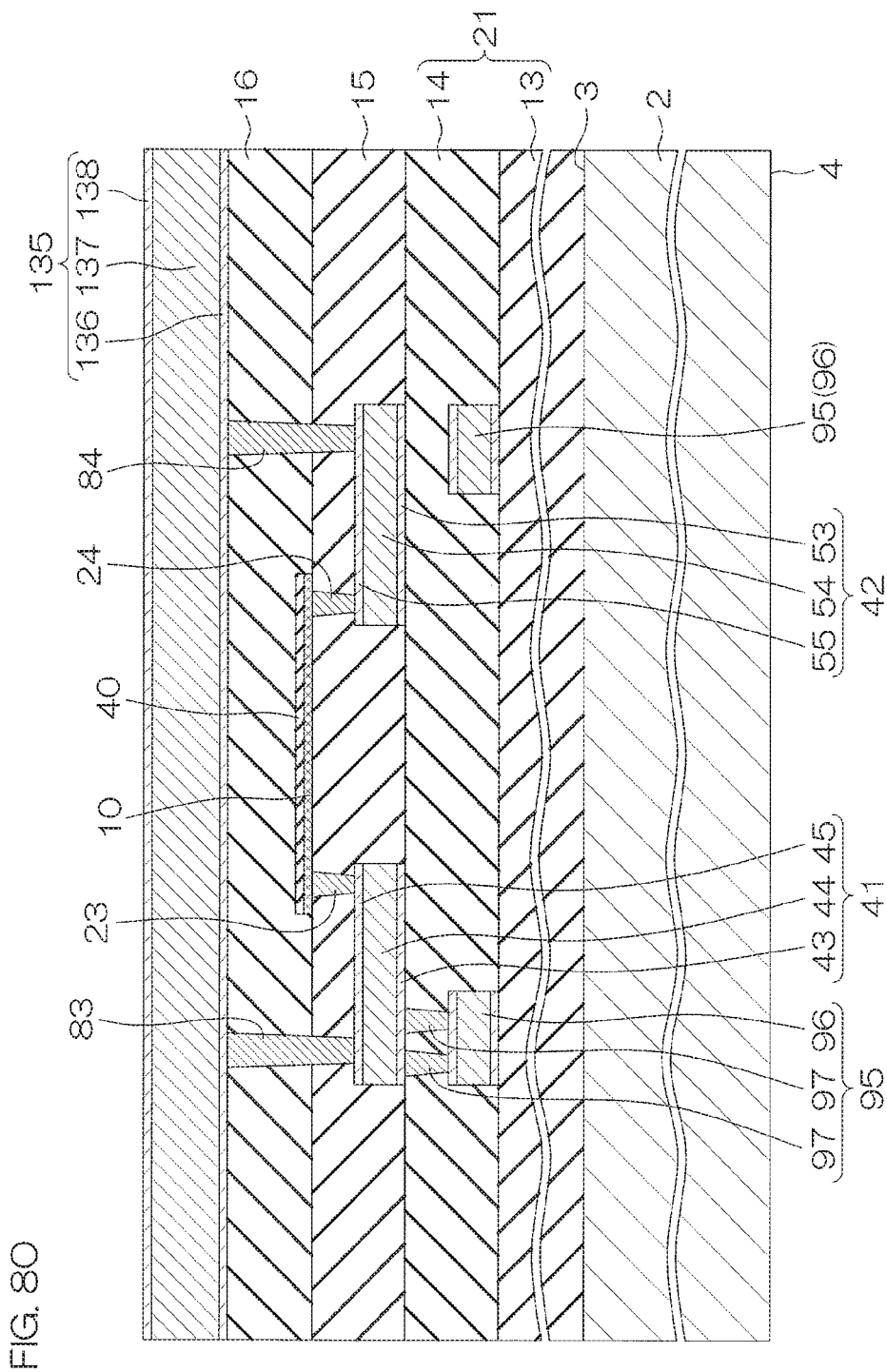
Figure 8P:
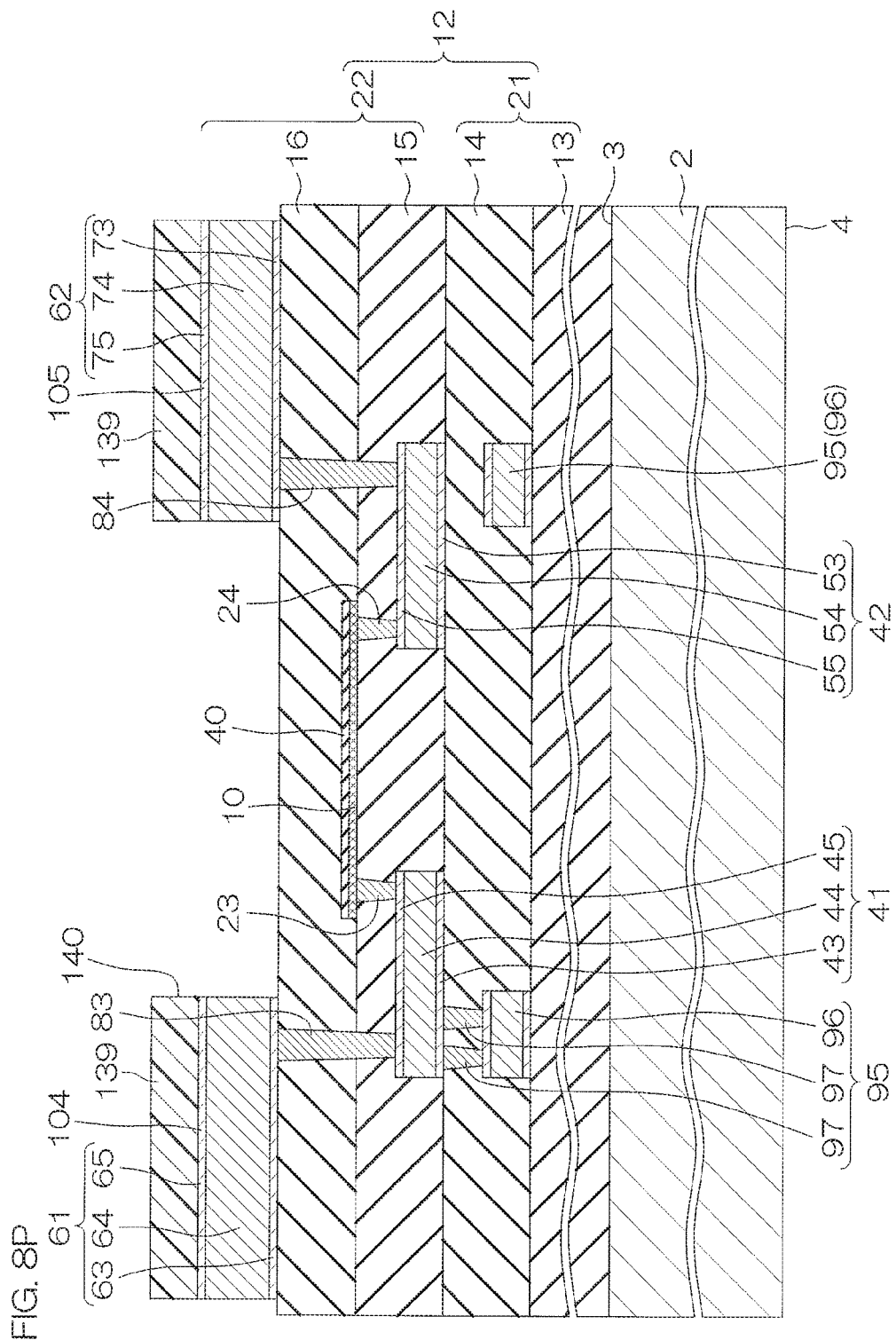
Figure 8R:
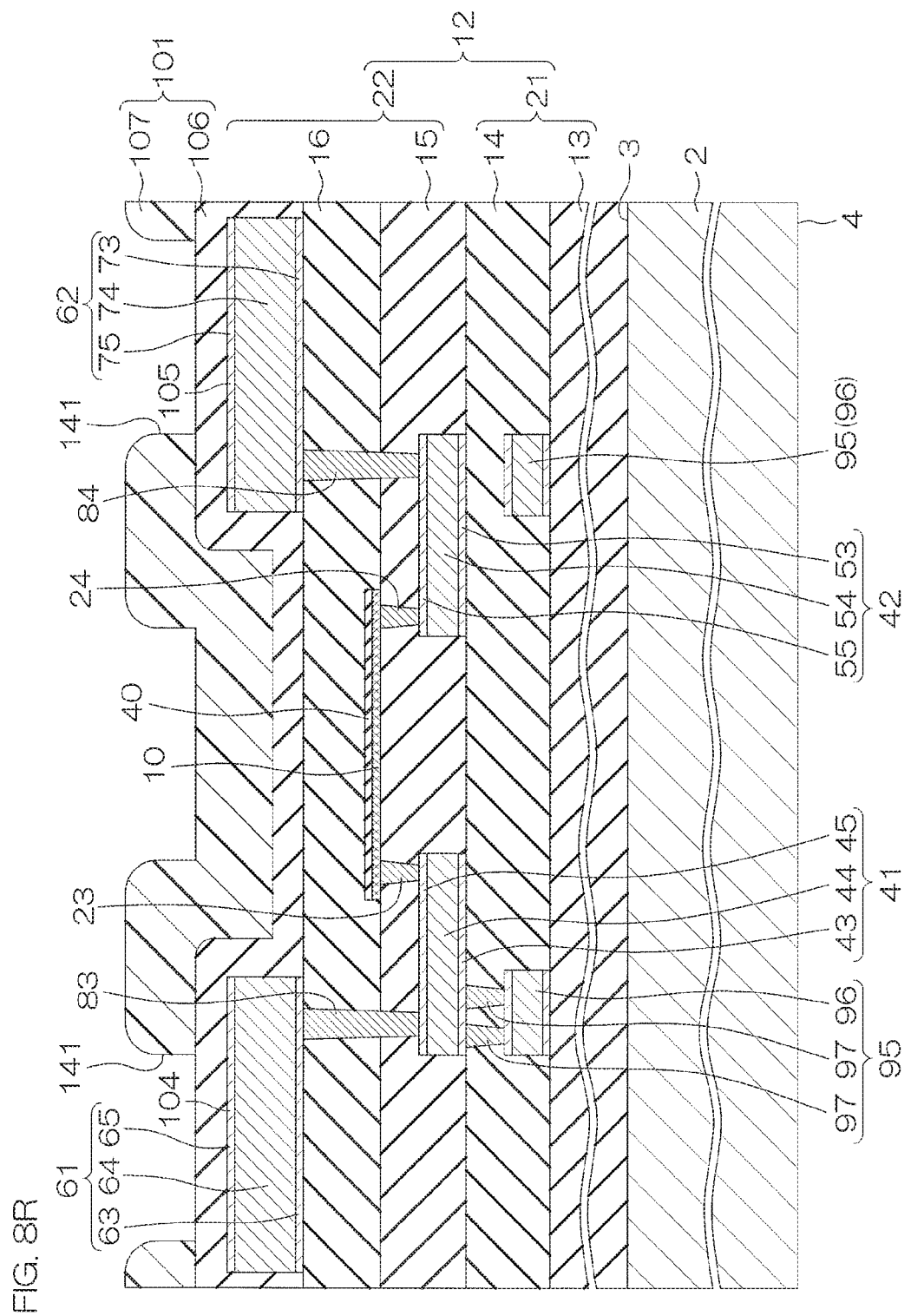
Figure 8S:
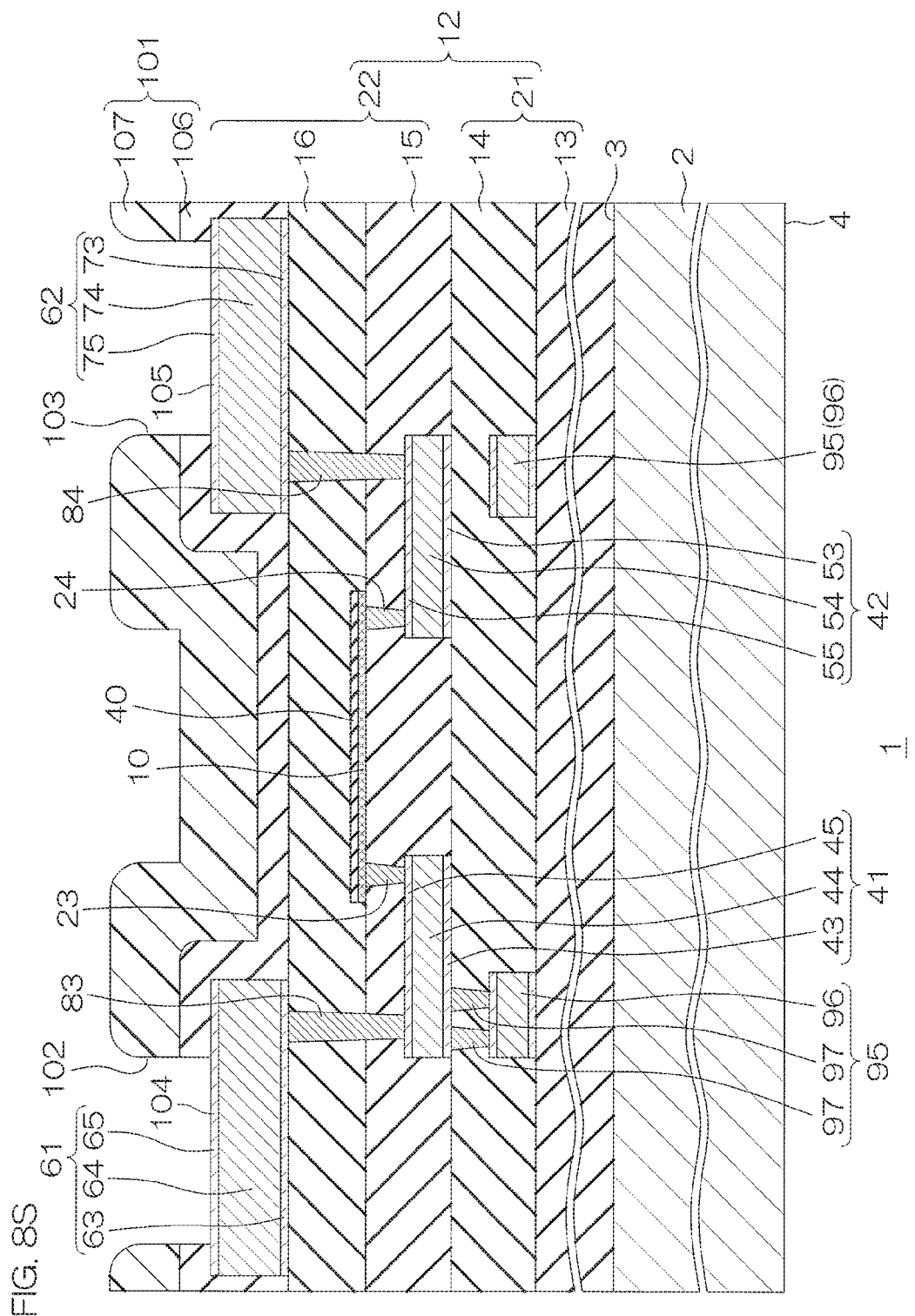

FIG. 8A to FIG. 8S are sectional views for describing an example of a method for manufacturing the electronic component 1 shown in FIG. 1. FIG. 8A to FIG. 8S are sectional views of a portion corresponding to FIG. 2.

Referring to FIG. 8A, in manufacturing the electronic component 1, first, the semiconductor layer 2 in which the device region 6 and the outside region 7 are formed is prepared. Next, the connection circuit forming layer 21 of the multilayer wiring structure 12 is formed on the first main surface 3 of the semiconductor layer 2.

The connection circuit forming layer 21 includes the first insulating layer 13, the second insulating layer 14, the one or plurality of connection wiring layers 96, and the one or plurality of connection via electrodes 97. A description of a step of forming the connection circuit forming layer 21 shall be omitted.

Next, referring to FIG. 8B, a first base wiring layer 111 that is to be a base of the first lower wiring layer 41 and the second lower wiring layer 42 is formed on the connection circuit forming layer 21. The step of forming the first base wiring layer 111 includes steps of forming a first barrier layer 112, a main body layer 113, and a second barrier layer 114 in that order from the top of the connection circuit forming layer 21.

The step of forming the first barrier layer 112 includes steps of forming a Ti layer and a TiN layer in that order from the top of the connection circuit forming layer 21. The Ti layer and the TiN layer may be formed respectively by a sputtering method. The step of forming the main body layer 113 includes a step of forming an AlCu alloy layer on the first barrier layer 112. The AlCu alloy layer may be formed by a sputtering method.

The step of forming the second barrier layer 114 includes steps of forming a Ti layer and a TiN layer in that order from the top of the main body layer 113. The Ti layer and the TiN layer may be formed respectively by a sputtering method.

Next, referring to FIG. 8C, a mask 115 having a predetermined pattern is formed on the first base wiring layer 111. The mask 115 covers regions of the first base wiring layer 111 in which the first lower wiring layer 41 and the second lower wiring layer 42 are to be formed and has an opening 116 that exposes other regions.

Next, unnecessary portions of the first base wiring layer 111 are removed by an etching method through the mask 115. The first base wiring layer 111 is thereby divided into the first lower wiring layer 41 and the second lower wiring layer 42. The mask 115 is thereafter removed.

Next, referring to FIG. 8D, the third insulating layer 15 that covers the first lower wiring layer 41 and the second lower wiring layer 42 is formed on the connection circuit forming layer 21. The third insulating layer 15 may be formed by a CVD (chemical vapor deposition) method.

Next, referring to FIG. 8E, a first via hole 117 that exposes the first lower wiring layer 41 and a second via hole 118 that exposes the second lower wiring layer 42 are formed in the third insulating layer 15.

In this step, first, a mask 119 having a predetermined pattern is formed on the third insulating layer 15. The mask 119 has a plurality of openings 120 that expose regions of the third insulating layer 15 in which the first via hole 117 and the second via hole 118 are to be formed.

Next, unnecessary portions of the third insulating layer 15 are removed by an etching method through the mask 119. The first via hole 117 and the second via hole 118 are thereby formed in the third insulating layer 15. The mask 119 is thereafter removed.

Next, referring to FIG. 8F, a base electrode layer 121 that is to be a base of the first via electrode 23 and the second via electrode 24 is formed on the third insulating layer 15. The step of forming the base electrode layer 121 includes steps of forming a barrier layer 122 and a main body layer 123 in that order from the top of the third insulating layer 15.

The step of forming the barrier layer 122 includes steps of forming a Ti layer and a TiN layer in that order from the top of the third insulating layer 15. The Ti layer and the TiN layer may be formed respectively by a sputtering method. The step of forming the main body layer 123 includes a step of forming a tungsten layer on the barrier layer 122. The tungsten layer may be formed by a CVD method.

Next, referring to FIG. 8G, a step of removing the base electrode layer 121 is performed. The base electrode layer 121 is removed until the third insulating layer 15 is exposed. The step of removing the base electrode layer 121 may include a step of removing the base electrode layer 121 by grinding.

In the present embodiment, the step of grinding the base electrode layer 121 is performed by a CMP (chemical mechanical polishing) method using a polishing agent (abrasive grains). The step of grinding the base electrode layer 121 may include a step of flattening the main surface of the third insulating layer 15. The first via electrode 23 is thereby formed inside the first via hole 117. Also, the second via electrode 24 is formed inside the second via hole 118.

Next, referring to FIG. 8H, the polishing agent (abrasive grains) attached to the main surface of the third insulating layer 15 is removed by cleaning using a chemical liquid. In this step, a portion of the third insulating layer 15 is removed together with the polishing agent (abrasive grains) by the chemical liquid.

A portion of the first via electrode 23 is thereby formed as the first projecting portion 23c projecting from the third insulating layer 15. Also, a portion of the second via electrode 24 is formed as the second projecting portion 24c projecting from the third insulating layer 15.

Next, referring to FIG. 8I, a base resistance layer 124 that is to be a base of the resistance layer 10 is formed on the main surface of the third insulating layer 15. The base resistance layer 124 includes CrSi. The base resistance layer 124 may be formed by a sputtering method.

Next, a base protective layer 125 that is to be a base of the protective layer 40 is formed on the base resistance layer 124. The base protective layer 125 includes silicon oxide. The base protective layer 125 may be formed by a CVD method.

Next, the base resistance layer 124 (CrSi) is crystallized. The step of crystallizing the base resistance layer 124 includes a step of performing annealing at a temperature and for a time at and until which the base resistance layer 124 (CrSi) crystallizes. The base resistance layer 124 may be heated at a temperature of not less than 400° C. and not more than 600° C. for not less than 60 minutes and not more than 120 minutes. The step of crystallizing the base resistance layer 124 may be performed before the step of forming the protective layer 40 after the step of forming the base resistance layer 124.

Next, referring to FIG. 8J, a mask 126 having a predetermined pattern is formed on the base protective layer 125. The mask 126 covers a region of the base protective layer 125 in which the protective layer 40 is to be formed and has an opening 127 that exposes other regions.

Next, unnecessary portions of the base protective layer 125 are removed by an etching method through the mask 126. The protective layer 40 is thereby formed.

Next, unnecessary portions of the base resistance layer 124 are removed by an etching method using the mask 126 and the protective layer 40 as masks. The resistance layer 10 is thereby formed. The mask 126 is thereafter removed. The mask 126 may be removed before the step of forming the resistance layer 10 after the step of forming the protective layer 40.

Next, referring to FIG. 8K, the fourth insulating layer 16 that covers the protective layer 40 and the resistance layer 10 is formed on the third insulating layer 15. The fourth insulating layer 16 may be formed by a CVD method.

Next, referring to FIG. 8L, a first via hole 128 that exposes the first lower wiring layer 41 and a second via hole 129 that exposes the second lower wiring layer 42 are formed in the third insulating layer 15 and the fourth insulating layer 16.

In this step, first, a mask 130 having a predetermined pattern is formed on the fourth insulating layer 16. The mask 130 has a plurality of openings 131 that expose regions of the fourth insulating layer 16 in which the first via hole 128 and the second via hole 129 are to be formed.

Next, unnecessary portions of the third insulating layer 15 and the fourth insulating layer 16 are removed by an etching method through the mask 130. The first via hole 128 and the second via hole 129 are thereby formed in the third insulating layer 15 and the fourth insulating layer 16. The mask 130 is thereafter removed.

Next, referring to FIG. 8M, a base electrode layer 132 that is to be a base of the first long via electrode 83 and the second long via electrode 84 is formed on the fourth insulating layer 16. The step of forming the base electrode layer 132 includes steps of forming a barrier layer 133 and a main body layer 134 in that order from the top of the fourth insulating layer 16.

The step of forming the barrier layer 133 includes steps of forming a Ti layer and a TiN layer in that order from the top of the fourth insulating layer 16. The Ti layer and the TiN layer may be formed respectively by a sputtering method. The step of forming the main body layer 134 includes a step of forming a tungsten layer on the barrier layer 133. The tungsten layer may be formed by a CVD method.

Next, referring to FIG. 8N, a step of removing the base electrode layer 132 is performed. The base electrode layer 132 is removed until the fourth insulating layer 16 is exposed. The step of removing the base electrode layer 132 may include a step of removing the base electrode layer 132 by grinding.

In the present embodiment, the step of grinding the base electrode layer 132 is performed by a CMP method using a polishing agent (abrasive grains). The step of grinding the base electrode layer 132 may include a step of flattening the main surface of the fourth insulating layer 16. The first long via electrode 83 and the second long via electrode 84 are thereby formed inside the first via hole 128 and inside the second via hole 129, respectively.

After the step of grinding the base electrode layer 132, the polishing agent (abrasive grains) attached to the main surface of the fourth insulating layer 16 may be removed by cleaning using a chemical liquid. A portion of the fourth insulating layer 16 may be removed together with the polishing agent (abrasive grains) by the chemical liquid. In this case, a portion of the first long via electrode 83 may be formed as a projecting portion projecting from the fourth insulating layer 16. Also, a portion of the second long via electrode 84 may be formed as a projecting portion projecting from the fourth insulating layer 16.

Next, referring to FIG. 8O, a second base wiring layer 135 that is to be a base of the first upper wiring layer 61 and the second upper wiring layer 62 is formed on the fourth insulating layer 16. The step of forming the second base wiring layer 135 includes steps of forming a first barrier layer 136, a main body layer 137, and a second barrier layer 138 in that order from the top of the fourth insulating layer 16.

The step of forming the first barrier layer 136 includes steps of forming a Ti layer and a TiN layer in that order from the top of the fourth insulating layer 16. The Ti layer and the TiN layer may be formed respectively by a sputtering method. The step of forming the main body layer 137 includes a step of forming an AlCu alloy layer on the first barrier layer 136. The AlCu alloy layer may be formed by a sputtering method.

The step of forming the second barrier layer 138 includes steps of forming a Ti layer and a TiN layer in that order from the top of the main body layer 137. The Ti layer and the TiN layer may be formed respectively by a sputtering method.

Next, referring to FIG. 8P, a mask 139 having a predetermined pattern is formed on the second base wiring layer 135. The mask 139 covers regions of the second base wiring layer 135 in the outside region 7 in which the first upper wiring layer 61 and the second upper wiring layer 62 are to be formed and has an opening 140 that exposes other regions.

Next, unnecessary portions of the second base wiring layer 135 are removed by an etching method through the mask 139. The second base wiring layer 135 is thereby divided into the first upper wiring layer 61 and the second upper wiring layer 62. Also, the multilayer wiring structure 12 that includes the connection circuit forming layer 21 and the resistance circuit forming layer 22 is thereby formed on the first main surface 3 of the semiconductor layer 2. The mask 139 is thereafter removed.

Next, referring to FIG. 8Q, the passivation layer 106 is formed on the multilayer wiring structure 12. The passivation layer 106 includes silicon nitride. The passivation layer 106 may be formed by a CVD method.

Next, the resin layer 107 is coated on the passivation layer 106. The resin layer 107 may include a polyimide as an example of a negative type photosensitive resin.

Next, referring to FIG. 8R, the resin layer 107 is selectively exposed and thereafter developed. A plurality of openings 141 that are to be bases of the first pad opening 102 and the second pad opening 103 are thereby formed in the resin layer 107.

Next, referring to FIG. 8S, unnecessary portions of the passivation layer 106 are removed by an etching method via the resin layer 107. The first pad opening and the second opening 103 that expose the first upper wiring layer 61 and the second upper wiring layer 62 respectively are thereby formed. The electronic component 1 is manufactured through steps including the above.

Figure 9:
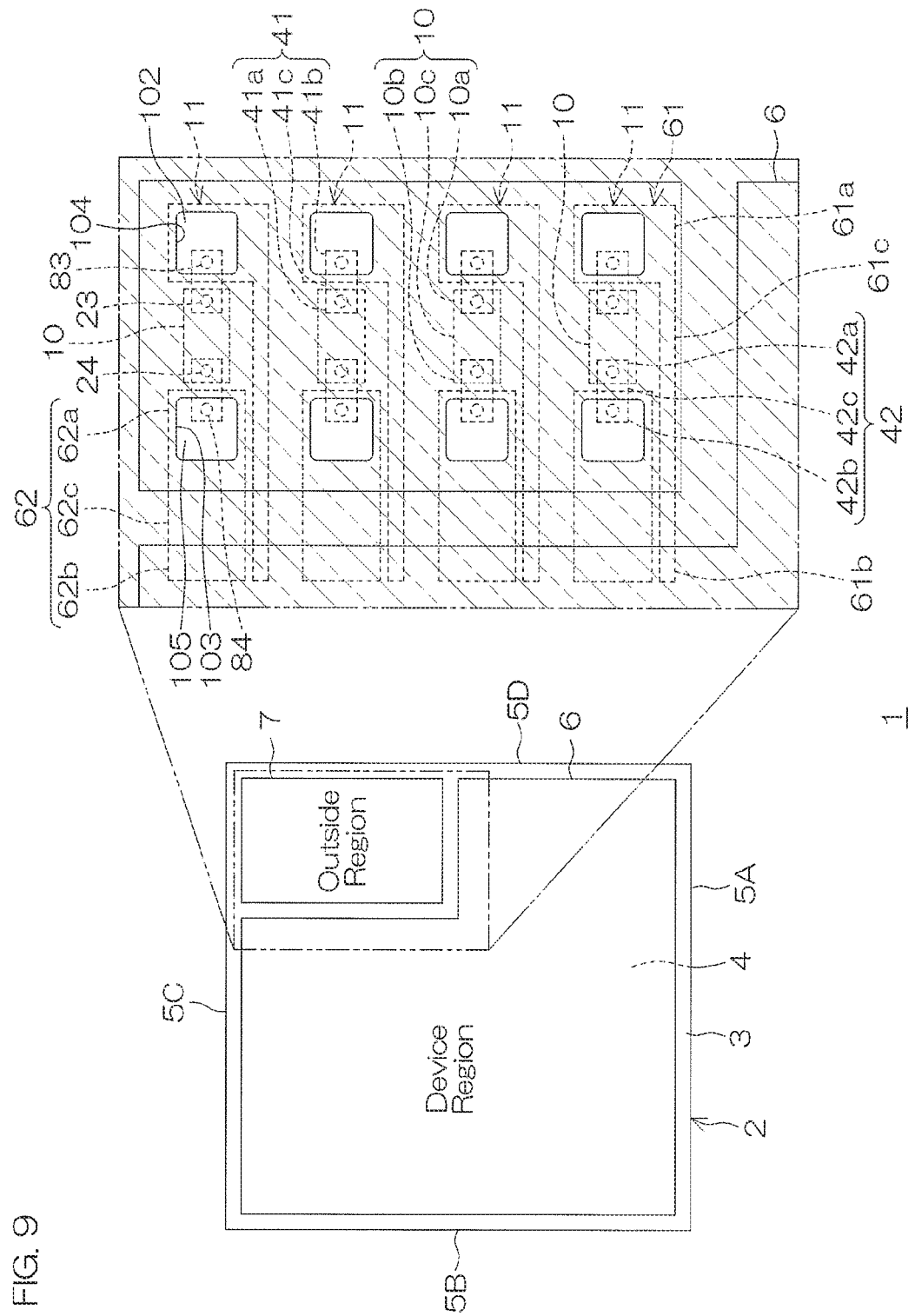
FIG. 9 is a schematic plan view of an electronic component according to a second preferred embodiment of the present invention and is a plan view showing a configuration incorporating the resistance layer according to the first configuration example.

FIG. 9 is a schematic plan view of an electronic component 151 according to a second preferred embodiment of the present invention and is a plan view showing a configuration incorporating the resistance layer 10 according to the first configuration example. In the following, structures corresponding to the structures described for the electronic component 1 shall be provided with the same reference symbols and description thereof shall be omitted.

The electronic component 1 includes the single resistance circuit 11 (resistance layer 10) formed in the outside region 7. On the other hand, referring to FIG. 9, the electronic component 151 includes a plurality (two or more; four in the present embodiment) of resistance circuits 11 (resistance layers 10) formed in the outside region 7. The number of resistance circuits 11 (resistance layers 10) is arbitrary and five or more may be formed in accordance with the configuration of the functional device.

The plurality of resistance circuits 11 (resistance layers 10) are respectively electrically connected to the device region 6 (functional device) via the connection circuit forming layer 21. The plurality of resistance circuits 11 (resistance layers 10) may be electrically connected to the device region 6 independently of each other. At least two of the plurality of resistance circuits 11 (resistance layers 10) may be connected to each other in parallel or in series.

In the present embodiment, the plurality of resistance circuits 11 each includes the resistance layer 10 according to the first configuration example. However, the plurality of resistance circuits 11 may each include any one of the resistance layers 10 according to the first to sixth configuration examples instead.

At least two of the plurality of resistance circuits 11 may include the resistance layer 10 according to the same configuration example. The plurality of resistance circuits 11 may include the resistance layers 10 according to different configuration examples. The plurality of resistance circuits 11 may include resistance layers 10 having a configuration combining at least two features among the features of the resistance layers 10 according to the first to sixth configuration examples.

The same effects as the effects described for the electronic component 1 can be exhibited as well by the electronic component 151 described above.

Figure 10:
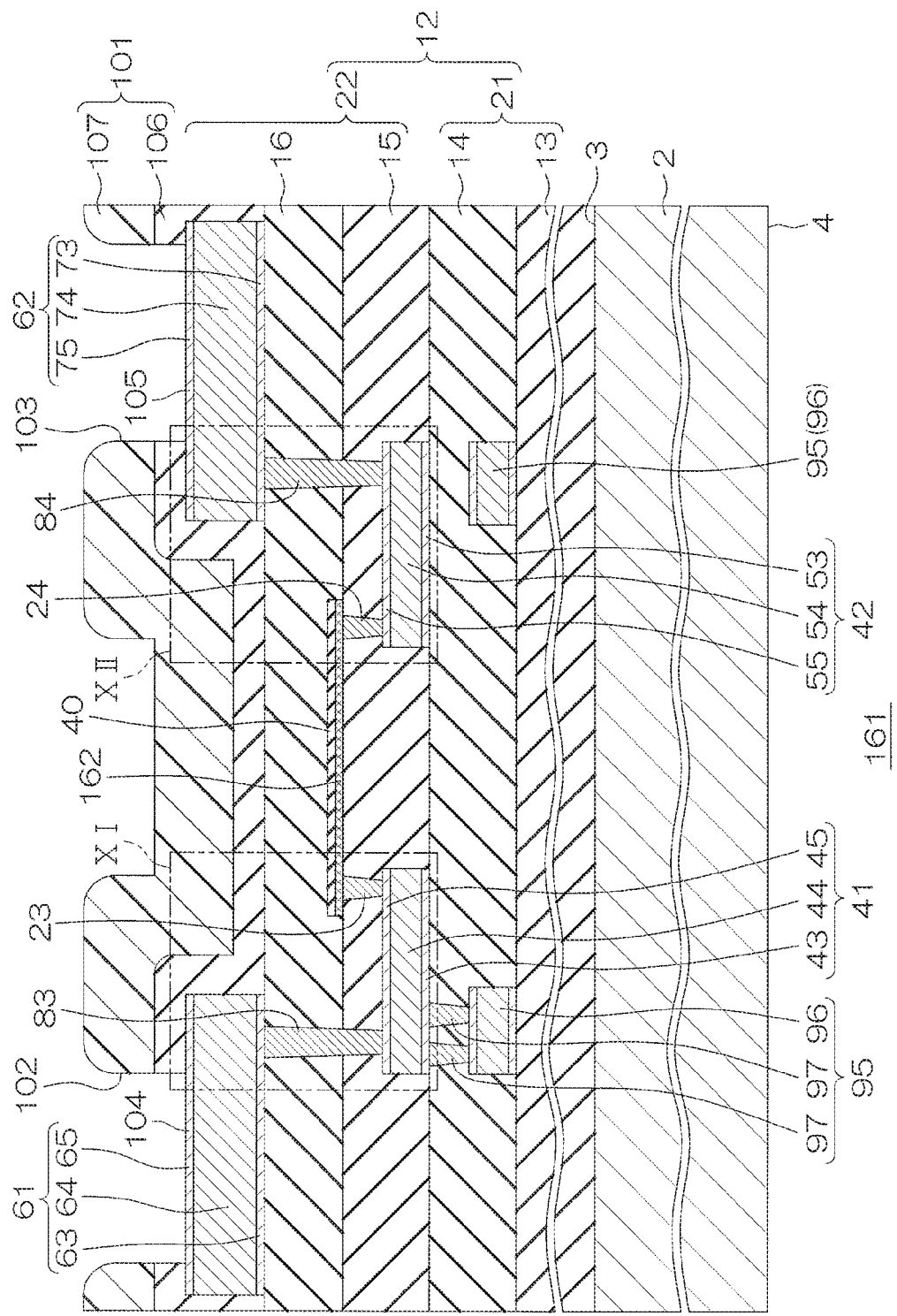
FIG. 10 is a schematic sectional view of an electronic component according to a third preferred embodiment of the present invention and is a sectional view showing a configuration incorporating a fuse resistance layer according to a first configuration example.
Figure 11:
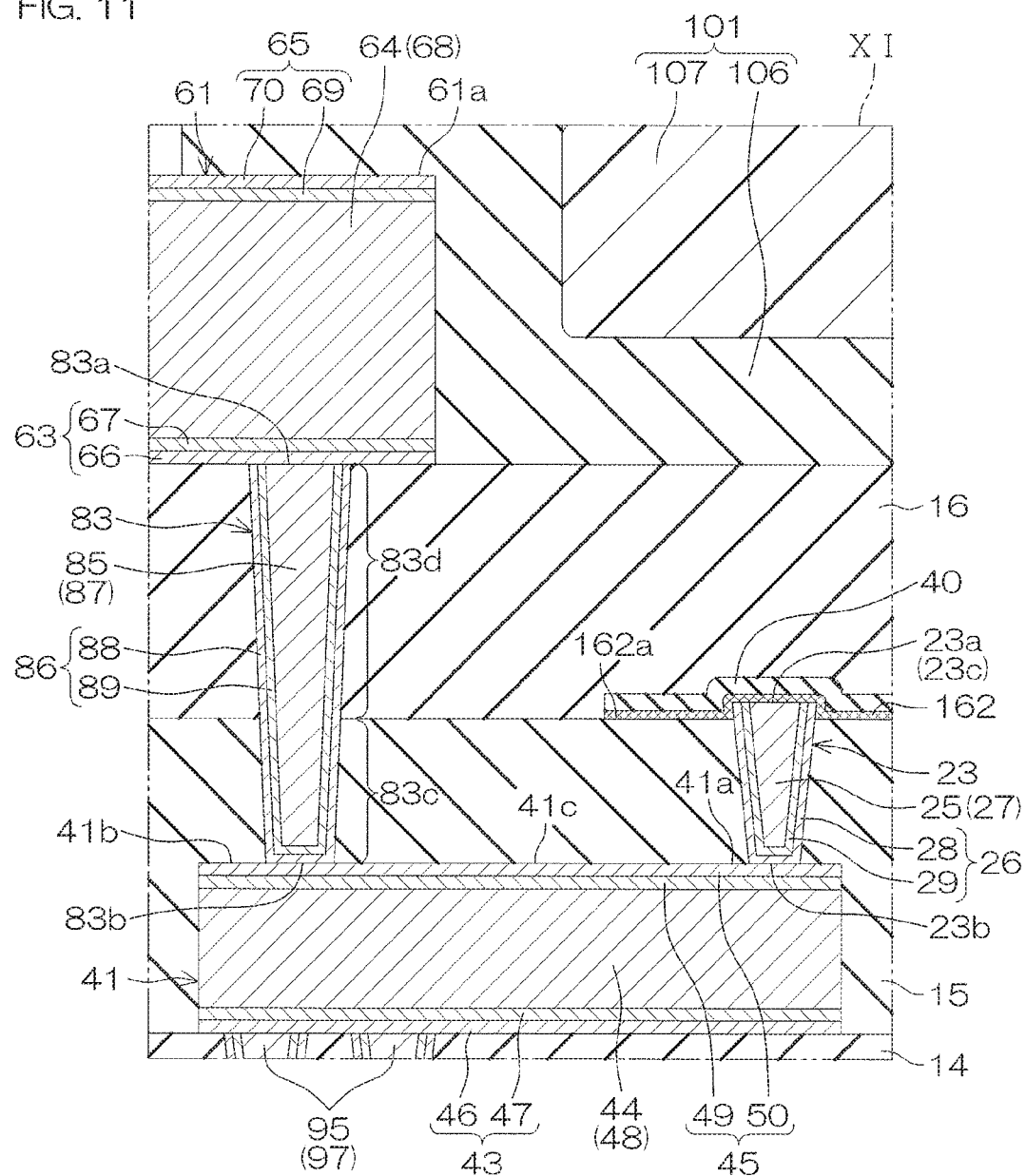
FIG. 11 is an enlarged view of a region XI shown in FIG. 10.
Figure 12:
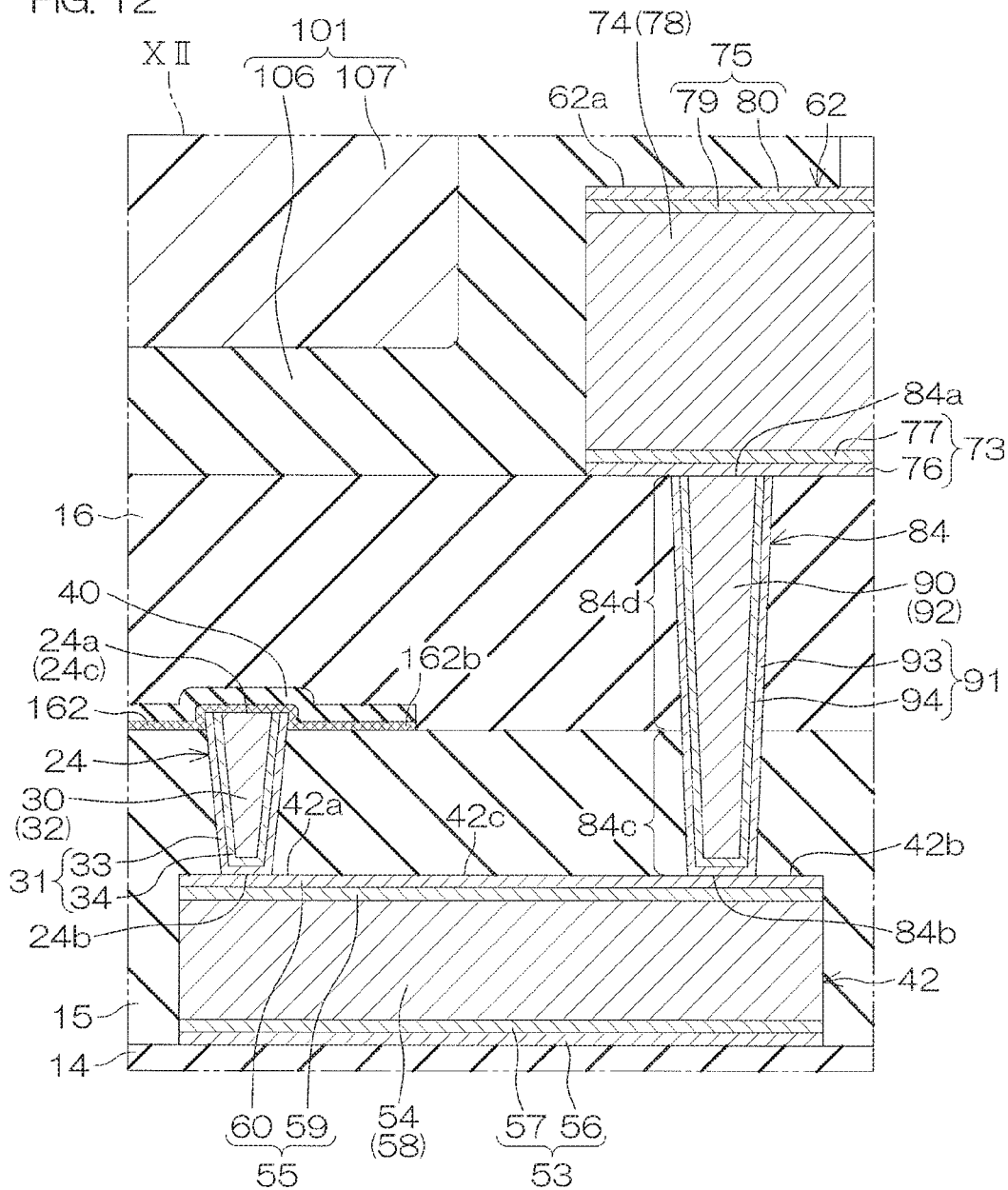
FIG. 12 is an enlarged view of a region XII shown in FIG. 10.

FIG. 10 is a schematic sectional view of an electronic component 161 according to a third preferred embodiment of the present invention and is a sectional view showing a configuration incorporating a fuse resistance layer 162 according to a first configuration example. FIG. 11 is an enlarged view of a region XI shown in FIG. 10. FIG. 12 is an enlarged view of a region XII shown in FIG. 10. In the following, structures corresponding to the structures described for the electronic component 1 shall be provided with the same reference symbols and description thereof shall be omitted.

Referring to FIG. 10 to FIG. 12, the resistance circuit 11 of the electronic component 161 includes the fuse resistance layer 162 (resistance layer) made of a metal thin film. The fuse resistance layer 162 is melted by a predetermined voltage (current) to open a current path. The fuse resistance layer 162 is formed by changing a layout of the mask 126 in the step of forming the resistance layer 10 (see FIG. 8J).

The fuse resistance layer 162 is preferably made of a metal thin film including at least one among CrSi (chromium silicon alloy), TaN (tantalum nitride), and TiN (titanium nitride). The metal thin film especially preferably includes CrSi. The fuse resistance layer 162 may have a single layer structure made of a CrSi film, a TaN film, or a TiN film. The fuse resistance layer 162 may have a laminated structure including a CrSi film and a TaN film laminated in any order.

The fuse resistance layer 162 may have a laminated structure including a CrSi film and a TiN film laminated in any order. The fuse resistance layer 162 may have a laminated structure including a TaN film and a TiN film laminated in any order. The fuse resistance layer 162 may have a laminated structure including a CrSi film, a TaN film, and a TiN film laminated in any order. In the present embodiment, the fuse resistance layer 162 has a single layer structure made of a CrSi film.

By adopting CrSi in the fuse resistance layer 162, a planar area of the fuse resistance layer 162 can be reduced appropriately while decreasing the thickness of the fuse resistance layer 162 appropriately. The fuse resistance layer 162 can thereby be interposed appropriately inside the multilayer wiring structure 12 while securing flatness.

Also, design rules for the fuse resistance layer 162 can be relaxed because the planar area of the fuse resistance layer 162 can be reduced appropriately. That is, the fuse resistance layer 162 can be disposed appropriately, not in the device region 6, but in the outside region 7. Mutual electrical influences between the fuse resistance layer 162 and the device region 6 can thus be suppressed appropriately. The same effects as the above can be exhibited even when the fuse resistance layer 162 includes TaN and/or TiN in addition to or in place of CrSi.

Also, the fuse resistance layer 162 made of a metal thin film is thin in comparison to polysilicon, etc., and can therefore suppress damage to the surroundings due to fusing. The fuse resistance layer 162 is used as a trimming device for resistance value adjustment of an electronic circuit or as a protective device that protects an electronic circuit from an overvoltage (overcurrent). In the present embodiment, the fuse resistance layer 162 is a trimming device for resistance value adjustment of an electronic circuit.

In a case where the fuse resistance layer 162 is used for resistance value adjustment, a step of cutting the fuse resistance layer 162 can be performed during wafer testing or after a packaging step. Also, the resistance value can be adjusted without performing a laser irradiation method and therefore a workload can be reduced.

A sheet resistance value of the fuse resistance layer 162 may be not less than 100Ω/□ and not more than 50000Ω/□. The sheet resistance value of the fuse resistance layer 162 may be not less than 100Ω/□ and not more than 5000Ω/□, not less than 5000Ω/□ and not more than 10000Ω/□, not less than 10000Ω/□ and not more than 15000Ω/□, not less than 15000Ω/□ and not more than 20000Ω/□, not less than 20000Ω/□ and not more than 25000Ω/□, not less than 25000Ω/□ and not more than 30000Ω/□, not less than 30000Ω/□ and not more than 35000Ω/□, not less than 35000Ω/□ and not more than 40000Ω/□, not less than 40000Ω/□ and not more than 45000Ω/□, or not less than 45000Ω/□ and not more than 50000 Ω/□.

A Cr content with respect to a total weight of the fuse resistance layer 162 may be not less than 5 wt % and not more than 50 wt %. The Cr content may be not less than 5 wt % and not more than 10 wt %, not less than 10 wt % and not more than 15 wt %, not less than 15 wt % and not more than 20 wt %, not less than 20 wt % and not more than 25 wt %, not less than 25 wt % and not more than 30 wt %, not less than 30 wt % and not more than 35 wt %, not less than 35 wt % and not more than 40 wt %, not less than 40 wt % and not more than 45 wt %, or not less than 45 wt % and not more than 50 wt %.

The fuse resistance layer 162 has a thickness TR less than the thickness TI of the third insulating layer 15 (TR<TI). A ratio TR/TI of the thickness TR of the fuse resistance layer 162 with respect to the thickness TI of the third insulating layer 15 may be not less than 0.001 and not more than 0.01. The ratio TR/TI may be not less than 0.001 and not more than 0.002, not less than 0.002 and not more than 0.004, not less than 0.004 and not more than 0.006, not less than 0.006 and not more than 0.008, or not less than 0.008 and not more than 0.01.

The thickness TR may be not less than 0.1 nm and not more than 100 nm. The thickness TR may be not less than 0.1 nm and not more than 10 nm, not less than 10 nm and not more than 20 nm, not less than 20 nm and not more than 30 nm, not less than 30 nm and not more than 40 nm, not less than 40 nm and not more than 50 nm, not less than 50 nm and not more than 60 nm, not less than 60 nm and not more than 70 nm, not less than 70 nm and not more than 80 nm, not less than 80 nm and not more than 90 nm, or not less than 90 nm and not more than 100 nm. The thickness TR is preferably not less than 1 nm and not more than 20 nm.

In the present embodiment, the fuse resistance layer 162 is formed in a portion of the multilayer wiring structure 12 positioned in the outside region 7 in the same mode as the resistance layer 10. By disposing the fuse resistance layer 162 in the outside region 7, an electrical influence that the fuse resistance layer 162 has on the device region 6 can be suppressed and an electrical influence that the device region 6 has on the fuse resistance layer 162 can be suppressed. For example, a parasitic capacitance between the device region 6 and the fuse resistance layer 162 can be suppressed. That is, reduction of noise and improvement of Q value can be achieved.

More specifically, the fuse resistance layer 162 is interposed in a region between the third insulating layer 15 and the fourth insulating layer 16 in the outside region 7. The fuse resistance layer 162 is formed as a film on the main surface of the third insulating layer 15. The resistance layer 10 described above may be formed on the main surface of the third insulating layer 15. In this case, the third insulating layer 15 is preferably occupied by the resistance layer 10 and the fuse resistance layer 162. The fuse resistance layer 162 may be connected directly to the resistance layer 10 or may be electrically connected to the resistance layer 10 via a wiring.

The fuse resistance layer 162 is formed to span across the first via electrode 23 and the second via electrode 24. The fuse resistance layer 162 is thereby electrically connected to the first via electrode 23 and the second via electrode 24.

The fuse resistance layer 162 is electrically connected to the first upper wiring layer 61 via the first via electrode 23, the first lower wiring layer 41, and the first long via electrode 83. The fuse resistance layer 162 is electrically connected to the second upper wiring layer 62 via the second via electrode 24, the second lower wiring layer 42, and the second long via electrode 84.

The fuse resistance layer 162 is positioned on a straight line connecting the first long via electrode 83 and the second long via electrode 84. The fuse resistance layer 162 is positioned on a straight line connecting the first via electrode 23, the second via electrode 24, the first long via electrode 83, and the second long via electrode 84. In the present embodiment, the fuse resistance layer 162 extends along the straight line connecting the first long via electrode 83 and the second long via electrode 84.

Figure 13:
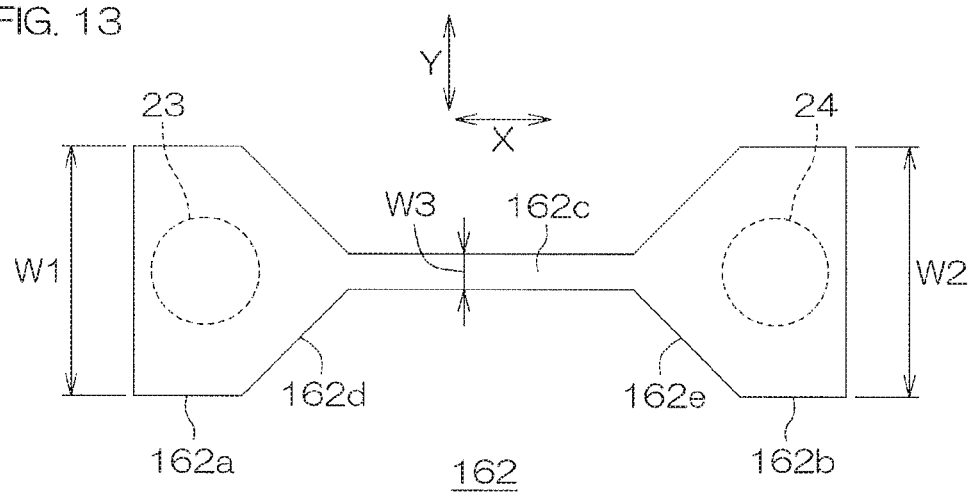
FIG. 13 is a plan view of a planar shape of the fuse resistance layer.

FIG. 13 is a plan view of a planar shape of the fuse resistance layer 162. Referring to FIG. 13, the fuse resistance layer 162 extends as a band along a first direction X. The fuse resistance layer 162 includes a first end portion 162a at one side, a second end portion 162b at another side, and a fusible portion 162c connecting the first end portion 162a and the second end portion 162b.

In the present embodiment, the fuse resistance layer 162 includes a first constricted portion 162d interposed between the first end portion 162a and the fusible portion 162c and a second constricted portion 162e interposed between the second end portion 162b and the fusible portion 162c.

The first end portion 162a covers the first via electrode 23. More specifically, the first end portion 162a covers the first end portion 23a (first projecting portion 23c) of the first via electrode 23. The first end portion 162a is formed as a film along the main surface and the side surface of the first via electrode 23.

The first end portion 162a is formed in a quadrilateral shape in plan view. The planar shape of the first end portion 162a is arbitrary. The first end portion 162a may be formed in a polygonal shape other than a quadrilateral shape or in a circular shape or elliptical shape in plan view. The first end portion 162a has a first width W1 in a second direction Y orthogonal to the first direction X.

The second end portion 162b covers the second via electrode 24. More specifically, the second end portion 162b covers the first end portion 24a (second projecting portion 24c) of the second via electrode 24. The second end portion 162b is formed as a film along the main surface and the side surface of the second via electrode 24.

The second end portion 162b is formed in a quadrilateral shape in plan view. The planar shape of the second end portion 162b is arbitrary. The second end portion 162b may be formed in a polygonal shape other than a quadrilateral shape or in a circular shape or elliptical shape in plan view. The second end portion 162b has a second width W2 in the second direction Y.

The fusible portion 162c extends as a band in a region between the first end portion 162a and the second end portion 162b. The fusible portion 162c extends as a band along a straight line connecting the first end portion 162a and the second end portion 162b. In the second direction Y, the fusible portion 162c has a third width W3 less than the first width W1. The third width W3 of the fusible portion 162c is less than the second width W2.

The first constricted portion 162d is formed in a convergent shape from the first end portion 162a toward the fusible portion 162c in plan view. The first constricted portion 162d narrows a current path directed toward the fusible portion 162c from the first end portion 162a.

The second constricted portion 162e is formed in a convergent shape from the second end portion 162b toward the fusible portion 162c in plan view. The second constricted portion 162e narrows a current path directed toward the fusible portion 162c from the second end portion 162b.

When a predetermined voltage is applied across the first end portion 162a and the second end portion 162b, the fusible portion 162c fuses due to Joule heat. The first end portion 162a and the second end portion 162b are thereby opened electrically.

The fuse resistance layer 162 may take on any of various configurations. Other configuration examples of the fuse resistance layer 162 shall now be described with reference to FIG. 14A to FIG. 14C.

FIG. 14A is a plan view of the fuse resistance layer 162 according to a second configuration example. In the following, structures corresponding to structures described with FIG. 10 to FIG. 13 shall be provided with the same reference symbols and description thereof shall be omitted.

Referring to FIG. 14A, the fuse resistance layer 162 according to the second configuration example is formed with uniform width. More specifically, the fuse resistance layer 162 according to the second configuration example includes the fusible portion 162c having the third width W3 that is equal to the first width W1 of the first end portion 162a and the second width W2 of the second end portion 162b. The fuse resistance layer 162 according to the second configuration example does not include the first constricted portion 162d and the second constricted portion 162e.

FIG. 14B is a plan view of the fuse resistance layer 162 according to a second configuration example. In the following, structures corresponding to the structures described with FIG. 10 to FIG. 13 shall be provided with the same reference symbols and description thereof shall be omitted.

Referring to FIG. 14B, the fuse resistance layer 162 according to the third configuration example includes the fusible portion 162c that is directly connected to the first end portion 162a and the second end portion 162b. That is, the fuse resistance layer 162 according to the third configuration example does not include the first constricted portion 162d and the second constricted portion 162e.

FIG. 14C is a plan view of the fuse resistance layer 162 according to a fourth configuration example. In the following, structures corresponding to the structures described with FIG. 10 to FIG. 13 shall be provided with the same reference symbols and description thereof shall be omitted.

Referring to FIG. 14C, the fuse resistance layer 162 according to the third configuration example includes the fusible portion 162c having portions extending along the first direction X and portions extending along the second direction Y in plan view. In the present embodiment, the fusible portion 162c extends in a meandering shape in plan view.

Referring to FIG. 10 to FIG. 12, the protective layer 40 described above is interposed in the region between the third insulating layer 15 and the fourth insulating layer 16 and covers the fuse resistance layer 162. The protective layer 40 is formed as a film along the fuse resistance layer 162. The protective layer 40 has a planar shape matching the planar shape of the fuse resistance layer 162. The protective layer 40 has side surfaces continuous to side surfaces of the fuse resistance layer 162. That is, the side surfaces of the protective layer 40 are formed flush with the side surfaces of the fuse resistance layer 162.

Figure 15:
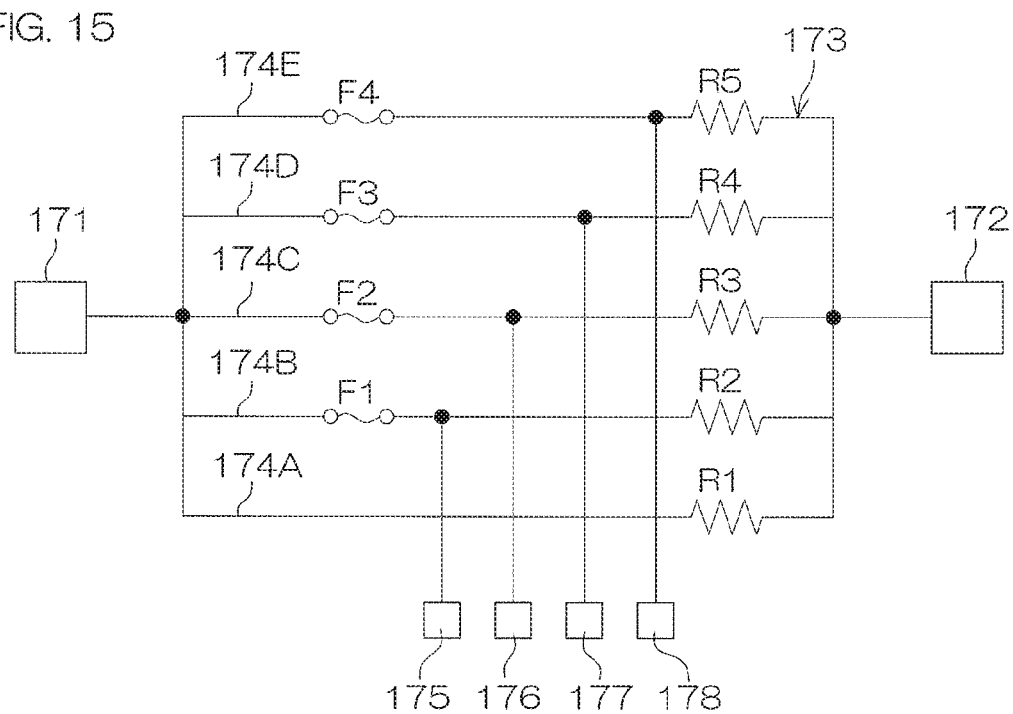
FIG. 15 is a principal circuit example of the electronic component shown in FIG. 10.

FIG. 15 is a principal circuit example of the electronic component 161 shown in FIG. 10.

The electronic component 161 includes a reference voltage electrode 171, a high voltage electrode 172, and a resistance parallel circuit 173 electrically connected between the reference voltage electrode 171 and the high voltage electrode 172. The resistance parallel circuit 173 includes a plurality of resistance circuits 174A, 174B, 174C, 174D, and 174E that are mutually connected in parallel.

The number of resistance circuits 174A to 174E is arbitrary and is adjusted in accordance with a resistance value to be achieved. In the present embodiment, the plurality of resistance circuits 174A to 174E include a first resistance circuit 174A, a second resistance circuit 174B, a third resistance circuit 174C, a fourth resistance circuit 174D, and a fifth resistance circuit 174E.

The first resistance circuit 174A includes a first resistor R1 that serves as a reference resistor. The second resistance circuit 174B includes a serial circuit having a first fuse F1 and a second resistor R2. The third resistance circuit 174C includes a serial circuit having a second fuse F2 and a third resistor R3. The fourth resistance circuit 174D includes a serial circuit having a third fuse F3 and a fourth resistor R4. The fifth resistance circuit 174E includes a serial circuit having a fourth fuse F4 and a fifth resistor R5.

At least one or all of the first to fifth resistors R1 to R5 may be formed by the resistance layers 10. At least one or all of the first to fifth resistors R1 to R5 may be formed by resistance layers (for example, polysilicon resistance layers) other than the resistance layers 10. The first to fifth resistors R1 to R5 may have mutually different resistance values or may have mutually equal resistance values. The first to fourth fuses F1 to F4 are respectively formed by the fuse resistance layers 162.

The electronic component 161 includes a first input electrode 175, a second input electrode 176, a third input electrode 177, and a fourth input electrode 178.

The first input electrode 175 is connected between the first fuse F1 and the second resistor R2 in the second resistance circuit 174B. The second input electrode 176 is connected between the second fuse F2 and the third resistor R3 in the third resistance circuit 174C. The third input electrode 177 is connected between the third fuse F3 and the fourth resistor R4 in the fourth resistance circuit 174D. The fourth input electrode 178 is connected between the fourth fuse F4 and the fifth resistor R5 in the fifth resistance circuit 174E.

When a predetermined voltage is applied across the reference voltage electrode 171 and the first input electrode 175, a current flows through the first fuse F1 and the first fuse F1 fuses. The second resistor R2 is thereby made electrically open from the reference voltage electrode 171 and the high voltage electrode 172.

When a predetermined voltage is applied across the reference voltage electrode 171 and the second input electrode 176, a current flows through the second fuse F2 and the second fuse F2 fuses. The third resistor R3 is thereby made electrically open from the reference voltage electrode 171 and the high voltage electrode 172.

When a predetermined voltage is applied across the reference voltage electrode 171 and the third input electrode 177, a current flows through the third fuse F3 and the third fuse F3 fuses. The fourth resistor R4 is thereby made electrically open from the reference voltage electrode 171 and the high voltage electrode 172.

When a predetermined voltage is applied across the reference voltage electrode 171 and the fourth input electrode 178, a current flows through the fourth fuse F4 and the fourth fuse F4 fuses. The fifth resistor R5 is thereby made electrically open from the reference voltage electrode 171 and the high voltage electrode 172.

A resistance value between the reference voltage electrode 171 and the high voltage electrode 172 is adjusted by cutting any one or all of the first to fourth fuses F1 to F4. If adjustment of the resistance value is not required, the first to fourth fuses F1 to F4 are not cut.

The first to fourth input electrodes 175 to 178 are not necessarily required. For example, the first to fourth fuses F1 to F4 may be formed to have mutually different resistance values and such as to be cut at mutually different current values (voltage values). In this case, the voltage value applied across the reference voltage electrode 171 and the high voltage electrode 172 is adjusted in accordance with the number of first to fourth fuses F1 to F4 to be cut.

The resistance value between the reference voltage electrode 171 and the high voltage electrode 172 is determined by a combined resistance of the first to fifth resistors R1 to R5 that are electrically connected to the reference voltage electrode 171 and the high voltage electrode 172. The resistance value between the reference voltage electrode 171 and the high voltage electrode 172 is digitally adjusted by the first to fourth fuses F1 to F4.

As described above, the electronic component 161 includes the fuse resistance layers 162 that are made of metal thin films. Each fuse resistance layer 162 is preferably made of a metal thin film including at least one among CrSi (chromium silicon alloy), TaN (tantalum nitride), and TiN (titanium nitride).

The fuse resistance layer 162 is melted by a predetermined voltage (current) to open a current path. The fuse resistance layer 162 made of a metal thin film can be formed comparatively thinly in comparison to polysilicon, etc. Damage to the surroundings due to fusing of the fuse resistance layer 162 can thereby be suppressed. Consequently, the fuse resistance layer 162 can be incorporated appropriately inside the multilayer wiring structure 12 as a trimming device for resistance value adjustment of an electronic circuit or as a protective device that protects an electronic circuit from an overvoltage (overcurrent).

In the case where the fuse resistance layer 162 is used for resistance value adjustment, the step of cutting the fuse resistance layer 162 can be performed during the wafer testing or after the packaging step. Also, the resistance value can be adjusted without performing the laser irradiation method and therefore the workload can be reduced.

With each of the preferred embodiments described above, an example where one or a plurality of the resistance circuits 11 (resistance layers 10 or fuse resistance layers 162) are formed in the outside region 7 was described. However, in each of the preferred embodiments described above, one or a plurality of the resistance circuits 11 (resistance layers 10 or fuse resistance layers 162) may be formed in the device region 6 instead.

Also, in each of the preferred embodiments described above, one or a plurality of the resistance circuits 11 (resistance layers 10 or fuse resistance layers 162) may be formed in the device region 6 and the outside region 7 respectively. Or, one or a plurality of the resistance circuits 11 (resistance layers 10 or fuse resistance layers 162) may be formed just in the device region 6 instead of in the outside region 7.

With each of the preferred embodiments described above, an example where the first upper wiring layer 61 and the second upper wiring layer 62 form the top wiring layers of the multilayer wiring structure 12 was described. However, the first upper wiring layer 61 and the second upper wiring layer 62 do not have to be the top wiring layers of the multilayer wiring structure 12. In this case, an insulating layer having the same structure as the first to fourth insulating layers 13 to 16 and a wiring layer having the same structure as the first lower wiring layer 41 (second lower wiring layer 42) or the first upper wiring layer 61 (second upper wiring layer 62) are laminated in any mode or at any period on the fourth insulating layer 16.

With each of the preferred embodiments described above, an example where the resistance layer 10 and/or the fuse resistance layer 162 occupies the main surface of the third insulating layer 15 was described. However, in each of the preferred embodiments described above, a wiring layer having the same structure as the first lower wiring layer 41 (second lower wiring layer 42) or the first upper wiring layer 61 (second upper wiring layer 62) may also be formed on the main surface of the third insulating layer 15. However, with such a structure, there is concern about increase in manufacturing workload and increased difficulty of securing flatness, and it can thus be said that the structure with which the resistance layer 10 and/or the fuse resistance layer 162 occupies the main surface of the third insulating layer 15 is preferable.

Figure 16:
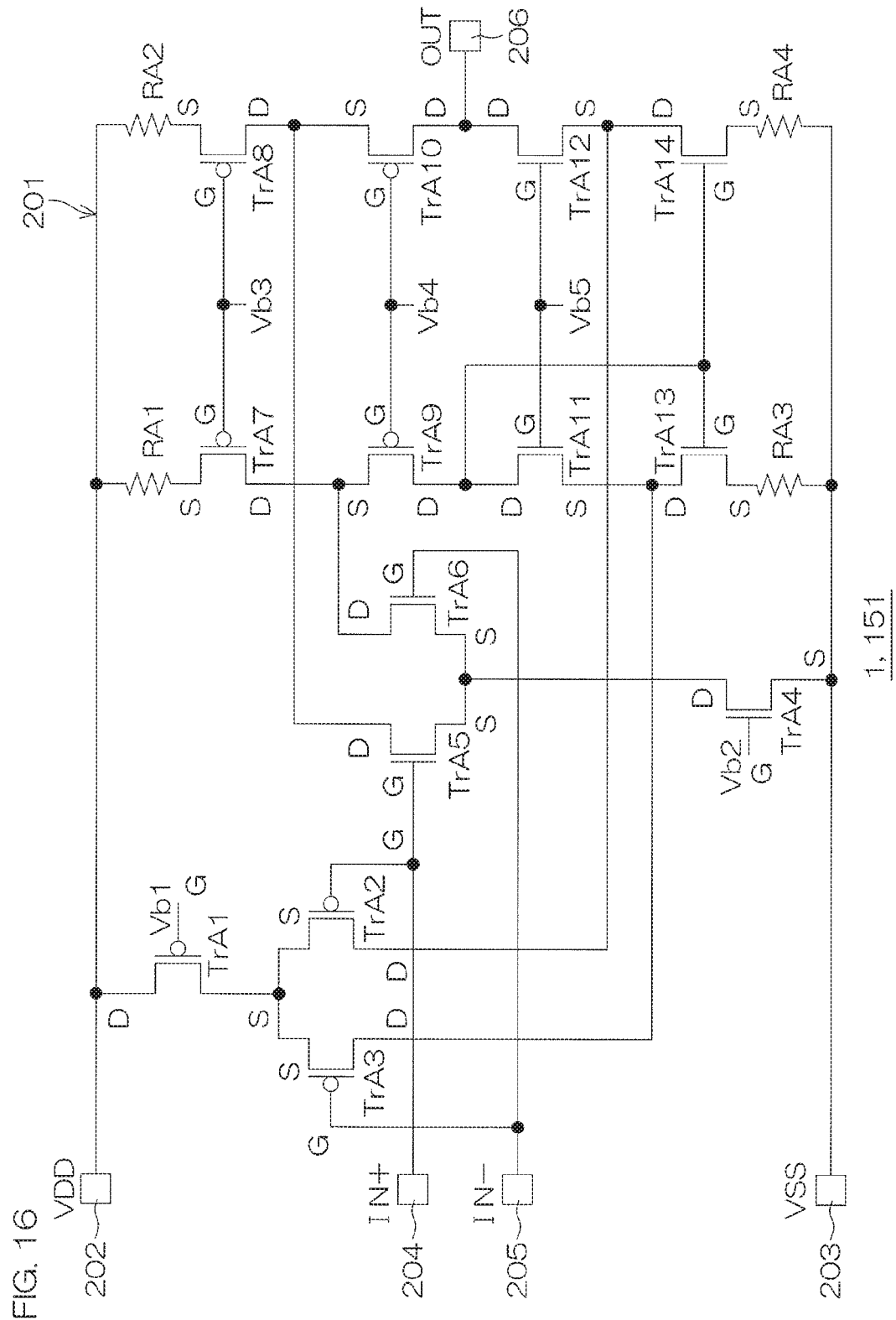
FIG. 16 is a circuit diagram of an electrical structure according to a first configuration example of the electronic components according to the first to third preferred embodiments.

The electronic component 1 according to the first preferred embodiment, the electronic component 151 according to the second preferred embodiment, and the electronic component 161 according to the third preferred embodiment may have the electrical structure shown in FIG. 16. FIG. 16 is a circuit diagram of the electrical structure according to a first configuration example of the electronic components 1, 151, and 161 according to the first to third preferred embodiments.

Referring to FIG. 16, each of the electronic components 1, 151, and 161 includes an operational amplifier circuit 201. The operational amplifier circuit 201 includes a positive supply terminal 202, a negative supply terminal 203, a non-inverted positive supply terminal 204, an inverted positive supply terminal 205, an output terminal 206, transistors TrA1 to TrA14 (semiconductor switching devices), and resistors RA1 to RA4 (passive devices).

A supply voltage VDD is input into the positive supply terminal 202. A reference voltage VSS is input into the negative supply terminal 203. The reference voltage VSS may be a ground voltage. A non-inverted voltage VIN+ is input into the non-inverted positive supply terminal 204. An inverted voltage VIN− is input into the inverted positive supply terminal 205. The operational amplifier circuit 201 amplifies and outputs a differential voltage of the non-inverted voltage VIN+ and the inverted voltage VIN− from the output terminal 206. That is, the operational amplifier circuit 201 is a differential operational amplifier circuit.

The transistors TrA1 to TrA14 are respectively formed in the device region 6 in the semiconductor layer 2. That is, the functional device formed in the device region 6 includes a circuit network formed by the transistors TrA1 to TrA14. The transistors TrA1 to TrA3 and TrA7 to TrA10 are respectively made of p type MISFETs. The transistors TrA4 to TrA6 and TrA11 to TrA14 are respectively made of n type MISFETs.

On the other hand, the resistors RA1 to RA4 are formed in the outside region 7 in the semiconductor layer 2. At least one or all of the resistors RA1 to RA4 are formed by the resistor layers 10 (CrSi). The resistors RA1 to RA4 are selectively connected via the connection circuit forming layer 21 (connection wiring layers 96 and connection via electrodes 97) to the circuit network formed by the transistors TrA1 to TrA14. The resistors RA1 to RA4 may respectively have resistance values adjusted by the fuse resistance layers 162. The resistors RA1 to RA4 form current value setting resistors and determine a current amplification factor.

A bias voltage Vb1 is input into a gate of the transistor TrA1. A drain of the transistor TrA1 is connected to the positive supply terminal 202. A source of the transistor TrA1 is connected to a source of the transistor TrA2 and a source of the transistor TrA3. A gate of the transistor TrA2 is connected to the non-inverted positive supply terminal 204. A gate of the transistor TrA3 is connected to the inverted positive supply terminal 205.

A bias voltage Vb2 is input into a gate of the transistor TrA4. A drain of the transistor TrA4 is connected to a source of the transistor TrA5 and a source of the transistor TrA6. A source of the transistor TrA4 is connected to the negative supply terminal 203. A gate of the transistor TrA5 is connected to the non-inverted positive supply terminal 204. A gate of the transistor TrA6 is connected to the inverted positive supply terminal 205.

A gate of the transistor TrA7 is connected to a gate of the transistor TrA8. A bias voltage Vb3 is input into the gate of the transistor TrA7 and the gate of the transistor TrA8. A source of the transistor TrA7 is connected to the positive supply terminal 202 via the resistor RA1.

A drain of the transistor TrA7 is connected to a source of the transistor TrA9. A source of the transistor TrA8 is connected to the positive supply terminal 202 via the resistor RA2. A drain of the transistor TrA8 is connected to a source of the transistor TrA10.

A gate of the transistor TrA9 is connected to a gate of the transistor TrA10. A bias voltage Vb4 is input into the gate of the transistor TrA9 and the gate of the transistor TrA10.

A drain of the transistor TrA9 is connected to a drain of the transistor TrA11. A drain of the transistor TrA10 is connected to a drain of the transistor TrA12.

A drain of the transistor TrA6 is connected to a connection portion of the drain of the transistor TrA7 and the source of the transistor TrA9. A drain of the transistor TrA5 is connected to a connection portion of the drain of the transistor TrA8 and the source of the transistor TrA10.

A gate of the transistor TrA11 is connected to a gate of the transistor TrA12. A bias voltage Vb5 is input into the gate of the transistor TrA11 and the gate of the transistor TrA12.

A source of the transistor TrA11 is connected to a drain of the transistor TrA13. A source of the transistor TrA12 is connected to a drain of the transistor TrA14.

A gate of the transistor TrA13 is connected to a gate of the transistor TrA14. The gate of the transistor TrA13 and the gate of the transistor TrA14 are connected to the drain of the transistor TrA11.

A source of the transistor TrA13 is connected to the negative supply terminal 203 via the resistor RA3. A source of the transistor TrA14 is connected to the negative supply terminal 203 via the resistor RA4.

With the present embodiment, an example where the operational amplifier circuit 201 includes the transistors TrA1 to TrA6 was described. However, an operational amplifier circuit 201 that does not include the transistors TrA1 to TrA3 may be adopted instead or an operational amplifier circuit 201 that does not include the transistors TrA4 to TrA6 may be adopted instead.

The electronic component 1 according to the first preferred embodiment, the electronic component 151 according to the second preferred embodiment, and the electronic component 161 according to the third preferred embodiment may have the electrical structure shown in FIG. 17. FIG. 17 is a circuit diagram of the electrical structure according to a second configuration example of the electronic components 1, 151, and 161 according to the first to third preferred embodiments.

Referring to FIG. 17, each of the electronic components 1, 151, and 161 includes a current amplifying type constant current regulator 211. The constant current regulator 211 includes a positive supply terminal 212, a negative supply terminal 213, an output terminal 214, transistors TrB1 to TrB12 (semiconductor switching devices), resistors RB1 to RB3 (passive devices), and a capacitor C (passive device).

A supply voltage VDD is input into the positive supply terminal 212. A reference voltage VSS is input into the negative supply terminal 213. The reference voltage VSS may be a ground voltage. The constant current regulator 211 outputs a constant current that is in accordance with a potential difference of the supply voltage VDD and the reference voltage VSS from the output terminal 214.

The transistors TrB1 to TrB12, the resistors RB1 and RB3, and the capacitor C are respectively formed in the device region 6 in the semiconductor layer 2. That is, the functional device formed in the device region 6 includes a circuit network formed by the transistors TrB1 to TrB12, the resistors RB1 and RB3, and the capacitor C.

The transistors TrB1 to TrB4 and TrB7 are respectively made of n type MISFETs. The transistors TrB5 and TrB6 are respectively made of npn type BJTs. The transistors TrB8 to TrB12 are respectively made of p type MISFETs. The resistors RB1 and RB3 may respectively be formed by polysilicon resistors.

The resistor RB2 is formed in the outside region 7 in the semiconductor layer 2. The resistor RB2 is formed by the resistor layer 10 (CrSi). The resistor RB2 may have a resistance value adjusted by the fuse resistance layer 162. The resistor RB2 forms a current value setting resistor and determines a current amplification factor. The resistor RB2 is selectively connected via the connection circuit forming layer 21 (connection wiring layer 96 and connection via electrode 97) to the circuit network formed by the transistors TrB1 to TrB12, the resistors RB1 and RB3, and the capacitor C.

A gate of the transistor TrB1 is connected to a gate of the transistor TrB2. The gate of the transistor TrB1 and the gate of the transistor TrB2 are connected to a drain of the transistor TrB1.

The drain of the transistor TrB1 is connected to the positive supply terminal 212 via the resistor RB1. A source of the transistor TrB1 is connected to the negative supply terminal 213. A source of the transistor TrB2 is connected to the source of the transistor TrB1.

A gate of the transistor TrB3 is connected to a gate of the transistor TrB4. The gate of the transistor TrB3 and the gate of the transistor TrB4 are connected to a drain of the transistor TrB3.

A source of the transistor TrB3 is connected to the negative supply terminal 213. A drain of the transistor TrB2 is connected to the gate of the transistor TrB1 and the gate of the transistor TrB2. A source of the transistor TrB4 is connected to the negative supply terminal 213.

A base of the transistor TrB5 is connected to a base of the transistor TrB6. The base of the transistor TrB5 and the base of the transistor TrB6 are connected to a collector of the transistor TrB5. An emitter of the transistor TrB5 is connected to the negative supply terminal 213 via the resistor RB2. An emitter of the transistor TrB6 is connected to the negative supply terminal 213.

A gate of the transistor TrB7 is connected to a collector of the transistor TrB6. A drain of the transistor TrB7 is connected to the drain of the transistor TrB2. A source of the transistor TrB7 is connected to the negative supply terminal 213.

The resistor RB3 forms an RC serial circuit 215 with the capacitor C. The RC serial circuit 215 is connected between the gate of the transistor TrB7 and the negative supply terminal 213.

Gates of the transistors TrB8 to TrB12 are connected mutually. The gates of the transistors TrB8 to TrB12 are respectively connected to the gate of the transistor TrB7. Drains of the transistors TrB8 to TrB12 are respectively connected to the positive supply terminal 212.

A source of the transistor TrB8 is connected to the drain of the transistor TrB3. A source of the transistor TrB9 is connected to the collector of the transistor TrB5. A source of the transistor TrB10 is connected to the collector of the transistor TrB6.

A source of the transistor TrB11 is connected to the gates of the transistors TrB8, TrB9, TrB10, and TrB12 and to the drain of the transistor TrB7. A source of the transistor TrB12 is connected to the output terminal 214.

The preferred embodiments of the present invention can be implemented in yet other configurations.

With each of the preferred embodiments described above, an example where one or a plurality of the resistance circuits 11 (resistance layers 10) are formed in the outside region 7 was described. However, in each of the preferred embodiments described above, one or a plurality of the resistance circuits 11 (resistance layers 10) may be formed in the device region 6 instead.

Also, in each of the preferred embodiments described above, one or a plurality of the resistance circuits 11 (resistance layers 10) may be formed in the device region 6 and the outside region 7 respectively. Or, one or a plurality of the resistance circuits 11 (resistance layers 10) may be formed just in the device region 6 instead of in the outside region 7.

Examples of features extracted from the present specification and drawings are indicated below.

[Item 1] An electronic component including a semiconductor layer that includes a device region in which a functional device is formed and an outside region outside the device region and that has a main surface, a multilayer wiring structure including a plurality of insulating layers laminated on the main surface of the semiconductor layer, the multilayer wiring structure including a connection circuit forming layer including a wiring layer selectively formed inside a plurality of the insulating layers such as to be routed from the device region to the outside region and electrically connected to the functional device, and a resistance circuit forming layer including a resistance layer made of a metal thin film and selectively formed inside a plurality of the wiring layers differing from the connection circuit forming layer in the outside region such as to be electrically connected to the functional device via the wiring layer of the connection circuit forming layer.

According to this electronic component, the resistance layer is made of a metal thin film. With a metal thin film, a planar area of the resistance layer can be reduced while decreasing a thickness of the resistance layer. The resistance layer can thereby be interposed appropriately inside the multilayer wiring structure while securing flatness. In particular, with this electronic component, the resistance layer is formed in the outside region. Thereby, an electrical influence that the resistance layer has on the device region can be suppressed and an electrical influence that the device region has on the resistance layer can be suppressed. The resistance layer can thus be incorporated appropriately in a multilayer wiring structure.

[Item 2] The electronic component according to Item 1, wherein the functional device includes at least one among a passive device, a semiconductor rectifying device, and a semiconductor switching device.

[Item 3] The electronic component according to Item 1, wherein the functional device includes a circuit network selectively combining any two or more devices among a passive device, a semiconductor rectifying device, and a semiconductor switching device.

[Item 4] The electronic component according to Item 2 or 3, wherein the passive device includes at least one among a resistor, a capacitor, and a coil.

[Item 5] The electronic component according to Item 2 or 3, wherein the semiconductor rectifying device includes at least one among a pn junction diode, a Zener diode, a Schottky barrier diode, and a fast recovery diode.

[Item 6] The electronic component according to Item 2 or 3, wherein the semiconductor switching device includes at least one among a BJT (bipolar junction transistor), a MISFET (metal insulator field effect transistor), an IGBT (insulated gate bipolar junction transistor), and a JFET (junction field effect transistor).

[Item 7] The electronic component according to Item 1, including an amplifier circuit formed by the functional device and the resistance layer.

[Item 8] The electronic component according to Item 1, including a differential operational amplifier circuit formed by the functional device and the resistance layer.

[Item 9] The electronic component according to Item 1, including a constant current regulator circuit formed by the functional device and the resistance layer.

[Item 10] The electronic component according to any one of Items 1 to 9, wherein the resistance layer is made of a metal thin film including at least one among CrSi, TaN, and TiN.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. Electronic component comprising:
   a lower insulating layer;
   an upper insulating layer formed on the lower insulating layer;
   a first via electrode embedded in the lower insulating layer;
   a second via electrode embedded in the lower insulating layer at an interval from the first via electrode;
   a resistance layer that is made of a metal thin film, is interposed in a region between the lower insulating layer and the upper insulating layer, and is electrically connected to the first via electrode and the second via electrode;
   a first lower wiring layer formed in a region at a lower insulating layer side with respect to the resistance layer and electrically connected to the first via electrode;
   a second lower wiring layer formed in the region at a lower insulating layer side with respect to the resistance layer and electrically connected to the second via electrode;
   a first upper wiring layer formed on the upper insulating layer and electrically connected to the first lower wiring layer;
   a second upper wiring layer formed on the upper insulating layer and electrically connected to the second lower wiring layer;
   a first long via electrode penetrating through and embedded in the lower insulating layer and the upper insulating layer and electrically connected to the first lower wiring layer and the first upper wiring layer; and
   a second long via electrode penetrating through and embedded in the lower insulating layer and the upper insulating layer and electrically connected to the second lower wiring layer and the second upper wiring layer.

2. The electronic component according to claim 1, wherein
   the first upper wiring layer is separated from the resistance layer in plan view, and
   the second upper wiring layer is separated from the resistance layer in plan view.

3. The electronic component according to claim 1, wherein
   the first upper wiring layer forms a top wiring layer, and
   the second upper wiring layer forms a top wiring layer.

4. The electronic component according to claim 1, wherein
   the first upper wiring layer has a thickness not less than a thickness of the first lower wiring layer, and
   the second upper wiring layer has a thickness not less than a thickness of the second lower wiring layer.

5. The electronic component according to claim 1, wherein the resistance layer is positioned on a straight line connecting the first long via electrode and the second long via electrode in plan view.

6. The electronic component according to claim 1, wherein
   the first long via electrode has a first lower portion positioned at a first lower wiring layer side with respect to the resistance layer and a first upper portion positioned at a first upper wiring layer side with respect to the resistance layer and having a length not less than a length of the first lower portion, and
   the second long via electrode has a second lower portion positioned at a second lower wiring layer side with respect to the resistance layer and a second upper portion positioned at a second upper wiring layer side with respect to the resistance layer and having a length not less than a length of the second lower portion.

7. The electronic component according to claim 1, further comprising:
   an insulating layer covering the first upper wiring layer and the second upper wiring layer and having a first pad opening that exposes the first upper wiring layer and a second pad opening that exposes the second upper wiring layer.

8. The electronic component according to claim 7, wherein the insulating layer covers a connection portion of the first upper wiring layer and the first long via electrode and a connection portion of the second upper wiring layer and the second long via electrode in plan view.

9. The electronic component according to claim 1, wherein
the first via electrode has a first projecting portion projecting toward the upper insulating layer with respect to a main surface of the lower insulating layer,
the second via electrode has a second projecting portion projecting toward the upper insulating layer with respect to the main surface of the lower insulating layer, and
the resistance layer covers the first projecting portion of the first via electrode and the second projecting portion of the second via electrode.

10. The electronic component according to claim 1, further comprising:
a semiconductor layer having a main surface; and
wherein the lower insulating layer is formed on the main surface of the semiconductor layer.

11. The electronic component according to claim 10, wherein
the semiconductor layer includes a device region in which a function device is formed and an outside region outside the device region, and
the resistance layer is formed in the outside region in plan view.

12. The electronic component according to claim 1, wherein the resistance layer is made of a metal thin film including at least one among CrSi, TaN, and TiN.

13. An electronic component comprising:
a lower insulating layer;
an upper insulating layer formed on the lower insulating layer;
a first via electrode embedded in the lower insulating layer;
a second via electrode embedded in the lower insulating layer at an interval from the first via electrode;
a first upper wiring layer formed on the upper insulating layer;
a second upper wiring layer formed on the upper insulating layer at an interval from the first upper wiring layer;
a resistance layer that is made of a metal thin film, is interposed in a region between the lower insulating layer and the upper insulating layer such as to be positioned in a region between the first upper wiring layer and the second upper wiring layer in plan view, and is electrically connected to the first via electrode and the second via electrode; and
a first long via electrode penetrating through and embedded in the lower insulating layer and the upper insulating layer such as to traverse a side of the resistance layer and electrically connected to the first upper wiring layer; and
a second long via electrode penetrating through and embedded in the lower insulating layer and the upper insulating layer such as to traverse a side of the resistance layer and electrically connected to the second upper wiring layer.

14. The electronic component according to claim 13, wherein the resistance layer is positioned on a straight line connecting the first long via electrode and the second long via electrode in plan view.

15. The electronic component according to claim 13, wherein the first long via electrode and the second long via electrode are positioned on a straight line connecting the first via electrode and the second via electrode in plan view.

16. The electronic component according to claim 13, wherein the resistance layer is electrically connected to the first upper wiring layer and the second upper wiring layer.

17. The electronic component according to claim 13, wherein the resistance layer is made of a metal thin film including at least one among CrSi, TaN, and TiN.

18. An electronic component comprising:
a semiconductor layer having a main surface;
a lower insulating layer formed on the main surface of the semiconductor layer;
an upper insulating layer formed on the lower insulating layer;
a first via electrode embedded in the lower insulating layer;
a second via electrode embedded in the lower insulating layer at an interval from the first via electrode; and
a resistance layer that is made of a metal thin film, is interposed in a region between the lower insulating layer and the upper insulating layer, and is electrically connected to the first via electrode and the second via electrode.

19. The electronic component according to claim 18, further comprising:
a first lower wiring layer formed in a region at a lower insulating layer side with respect to the resistance layer and electrically connected to the first via electrode; and
a second lower wiring layer formed in the region at a lower insulating layer side with respect to the resistance layer and electrically connected to the second via electrode.

20. The electronic component according to claim 19, further comprising:
a first upper wiring layer formed on the upper insulating layer and electrically connected to the first lower wiring layer; and
a second upper wiring layer formed on the upper insulating layer and electrically connected to the second lower wiring layer.

21. The electronic component according to claim 18, wherein
the semiconductor layer includes a device region in which a function device is formed and an outside region outside the device region, and
the resistance layer is formed in the outside region in plan view.

* * * * *